United States Patent
Bolan et al.

Patent Number: 5,189,598
Date of Patent: Feb. 23, 1993

[54] DUAL FUNCTION MICROBOARD WITH A ROW OF CONNECTORS ON TWO EDGES

[75] Inventors: Michael L. Bolan, Dallas; Wendell L. Little, Denton; Elaine Jansen, Flower Mound; Don Folkes, Coppell, all of Tex.

[73] Assignee: Dallas Semiconductor Corporation, Dallas, Tex.

[21] Appl. No.: 567,467

[22] Filed: Aug. 14, 1990

[51] Int. Cl.⁵ ................................................ H05K 1/00
[52] U.S. Cl. ................................... 361/397; 174/250; 361/413; 439/60
[58] Field of Search ............... 361/397, 409, 413; 439/43, 54, 55, 177, 189, 217, 59, 60, 62, 171-174, 218, 224; 174/250, 253; 307/150

[56] References Cited

U.S. PATENT DOCUMENTS

| | | | |
|---|---|---|---|
| 4,885,482 | 12/1989 | Sharp et al. | 361/413 |
| 5,010,446 | 4/1991 | Scannell | 361/413 |

FOREIGN PATENT DOCUMENTS

| | | | |
|---|---|---|---|
| 0356757 | 3/1990 | United Kingdom | 439/217 |

Primary Examiner—Leo P. Picard
Assistant Examiner—Donald A. Sparks
Attorney, Agent, or Firm—Worsham, Forsythe, Sampels & Wooldridge

[57] ABSTRACT

An innovative microboard package, which includes not only a row of edge connector contacts along one long edge thereof, but also includes another row of edge connector contacts along the other long edge. The contacts are connected so that the functionality of the board can be changed merely by choosing one of the two orientations for insertion. For example, one embodiment provides a microprocessor module if insertion is done in one direction, and a microcontroller module if insertion in the other direction. Optionally, the row of contacts which is not inserted into the mother board can be connected to a jumper cable, using a simple connector header.

1 Claim, 50 Drawing Sheets

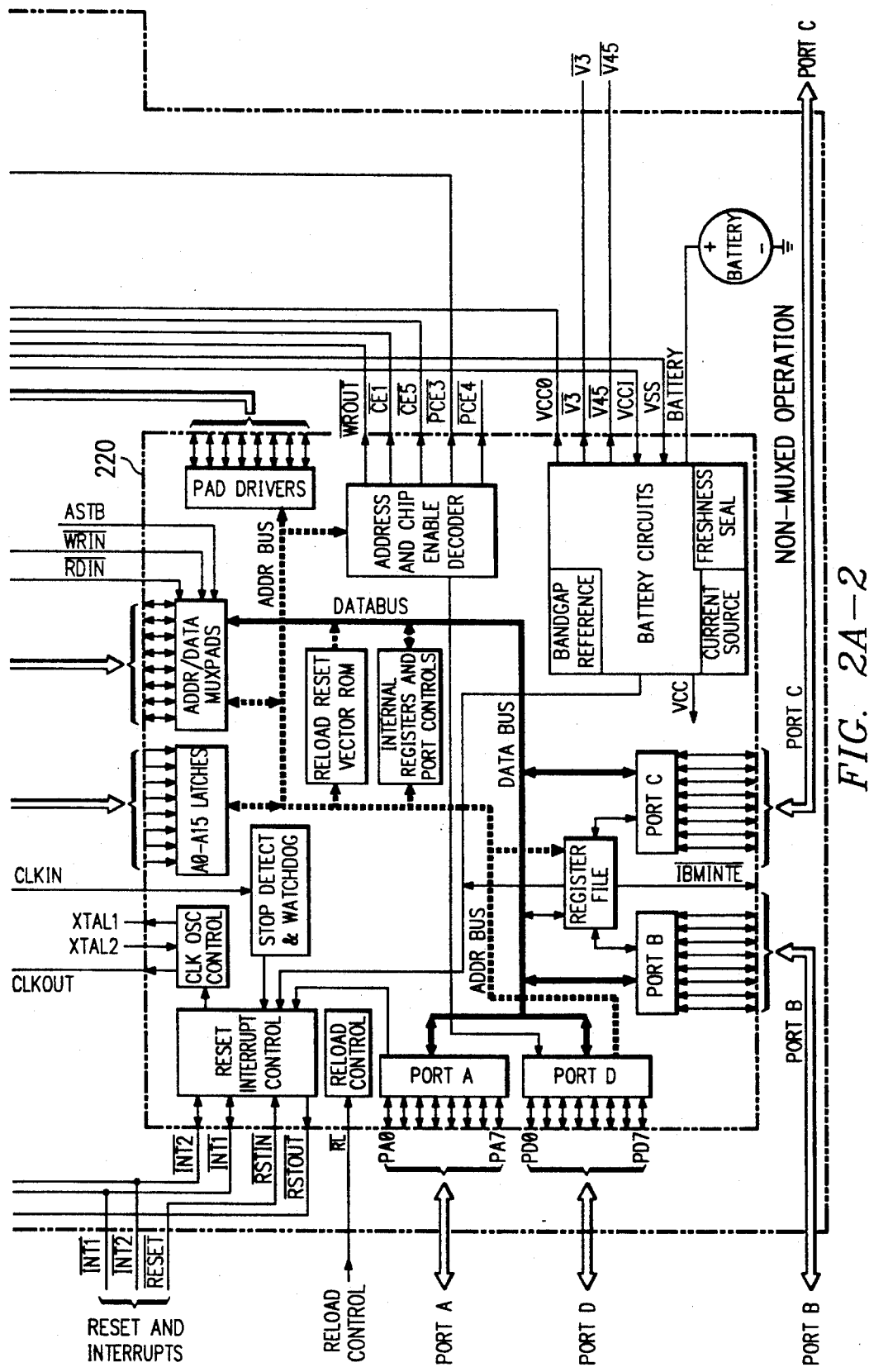

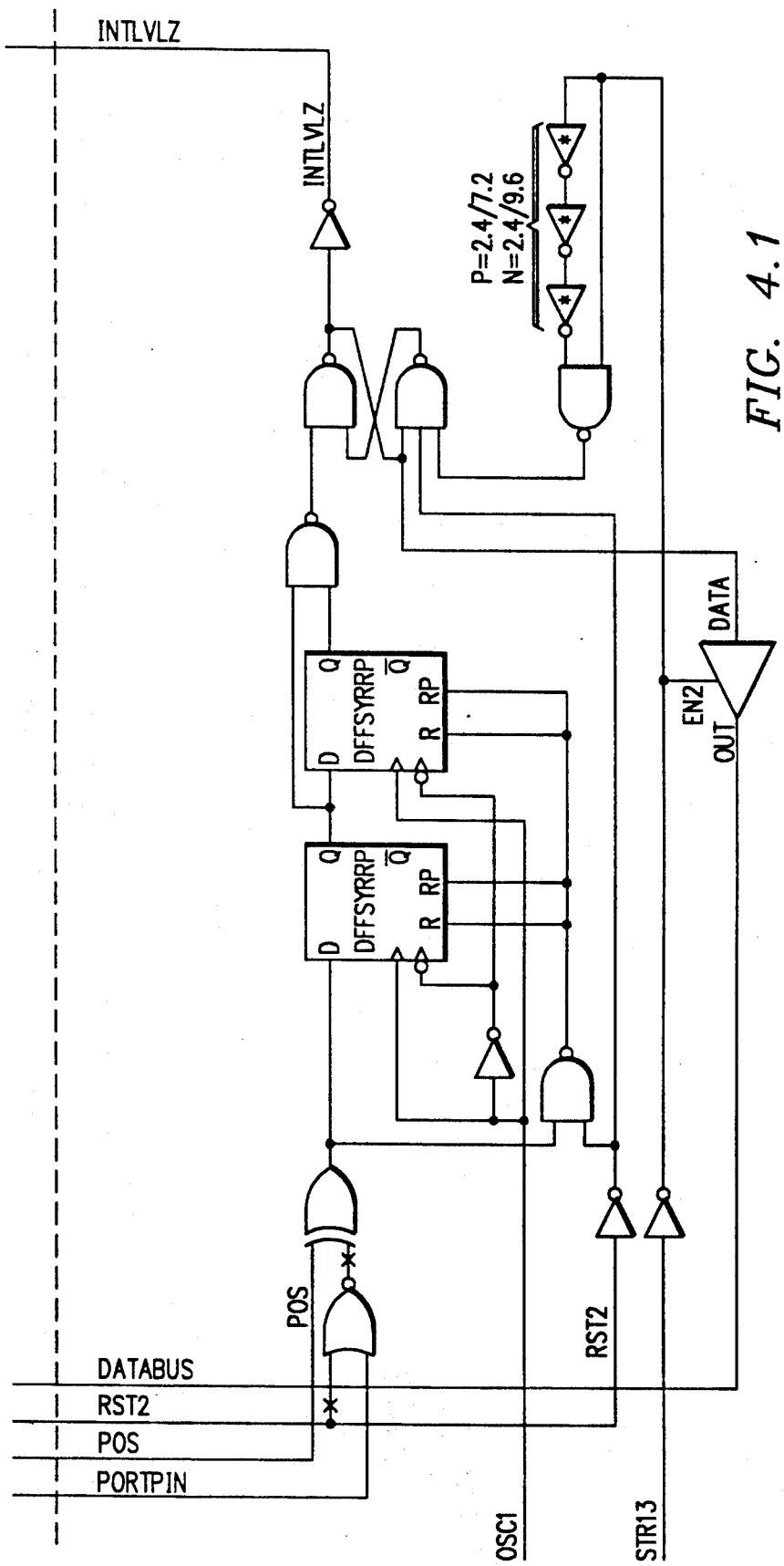
FIG. 4.1

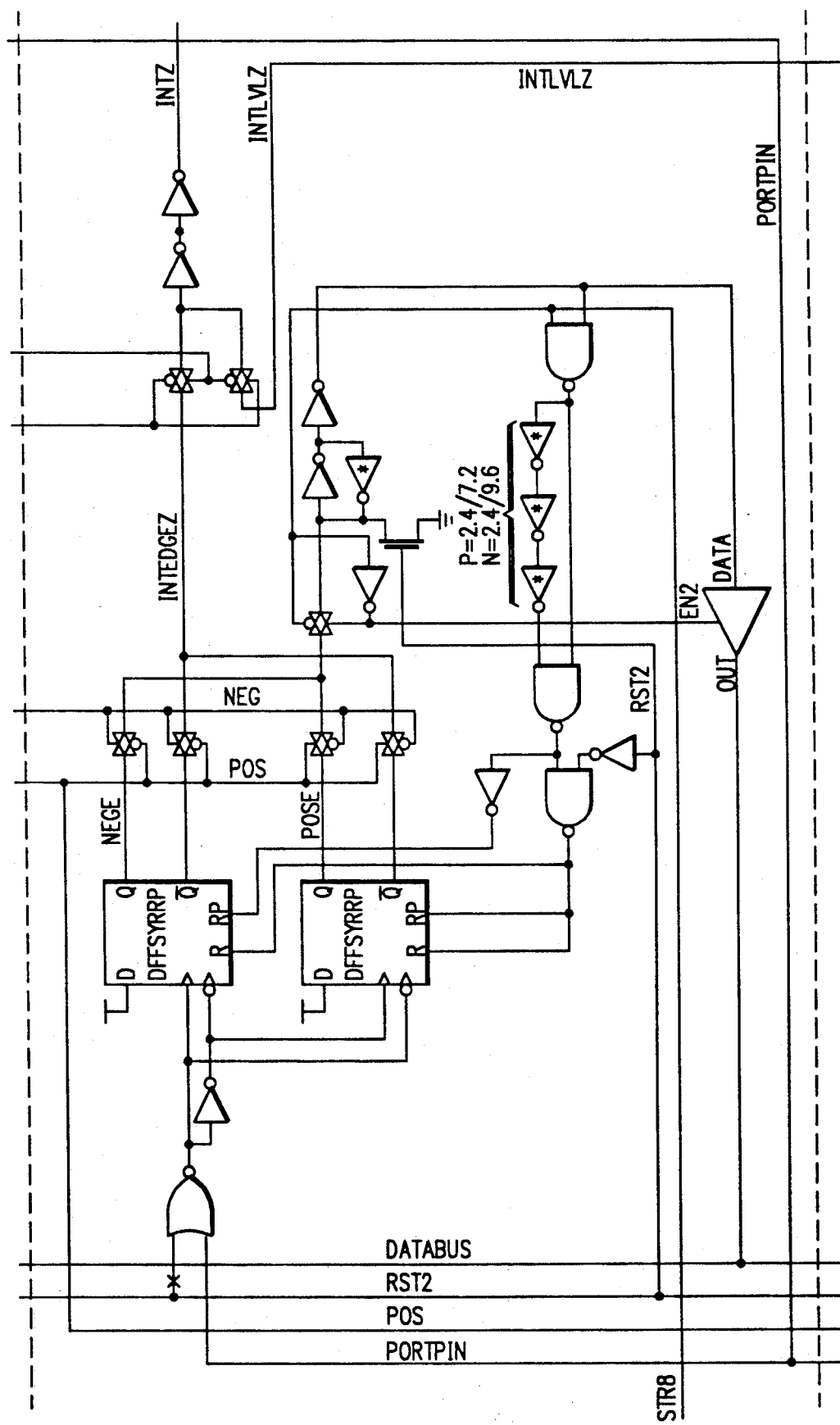
FIG. 4.2

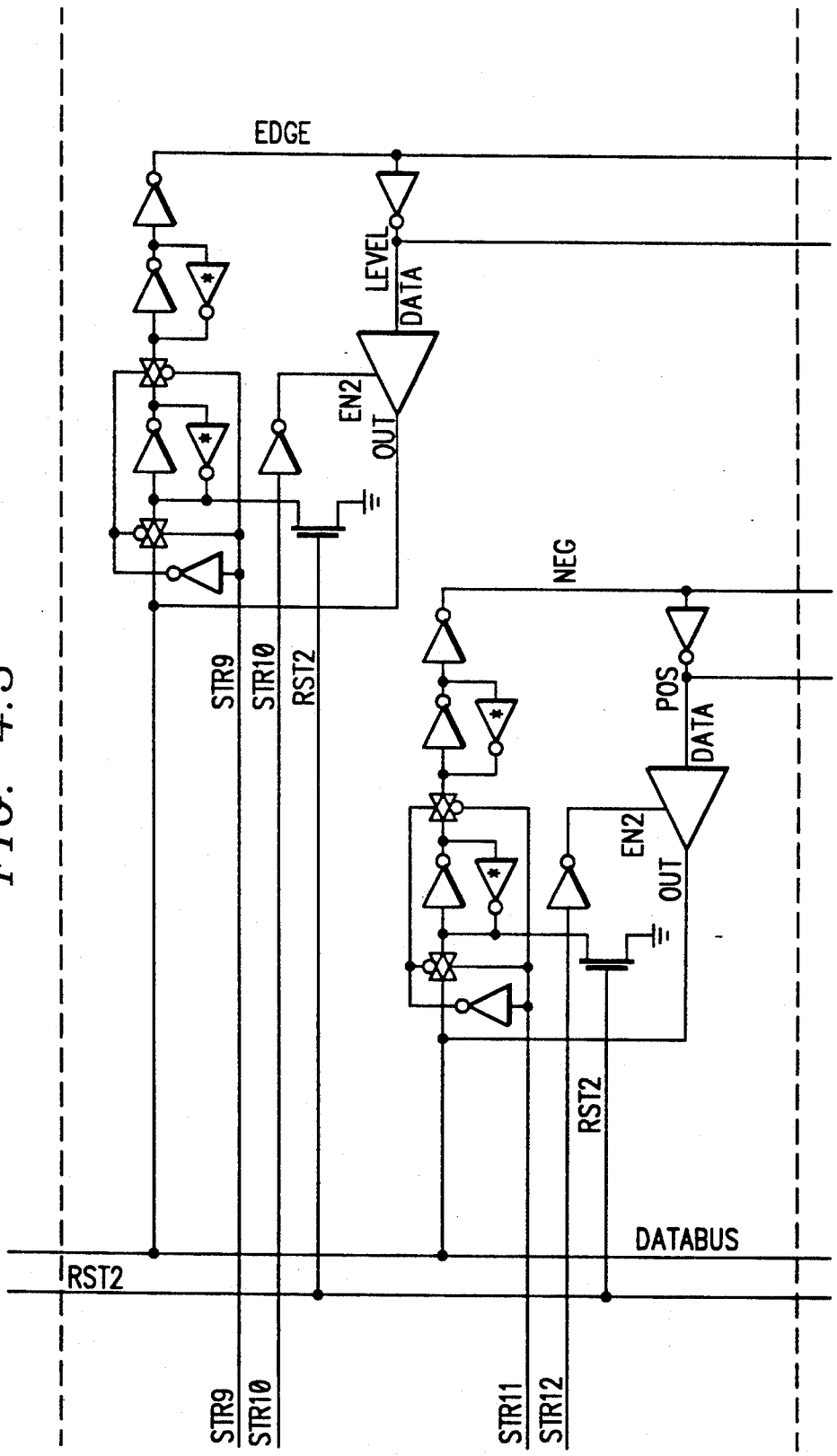
FIG. 4.3

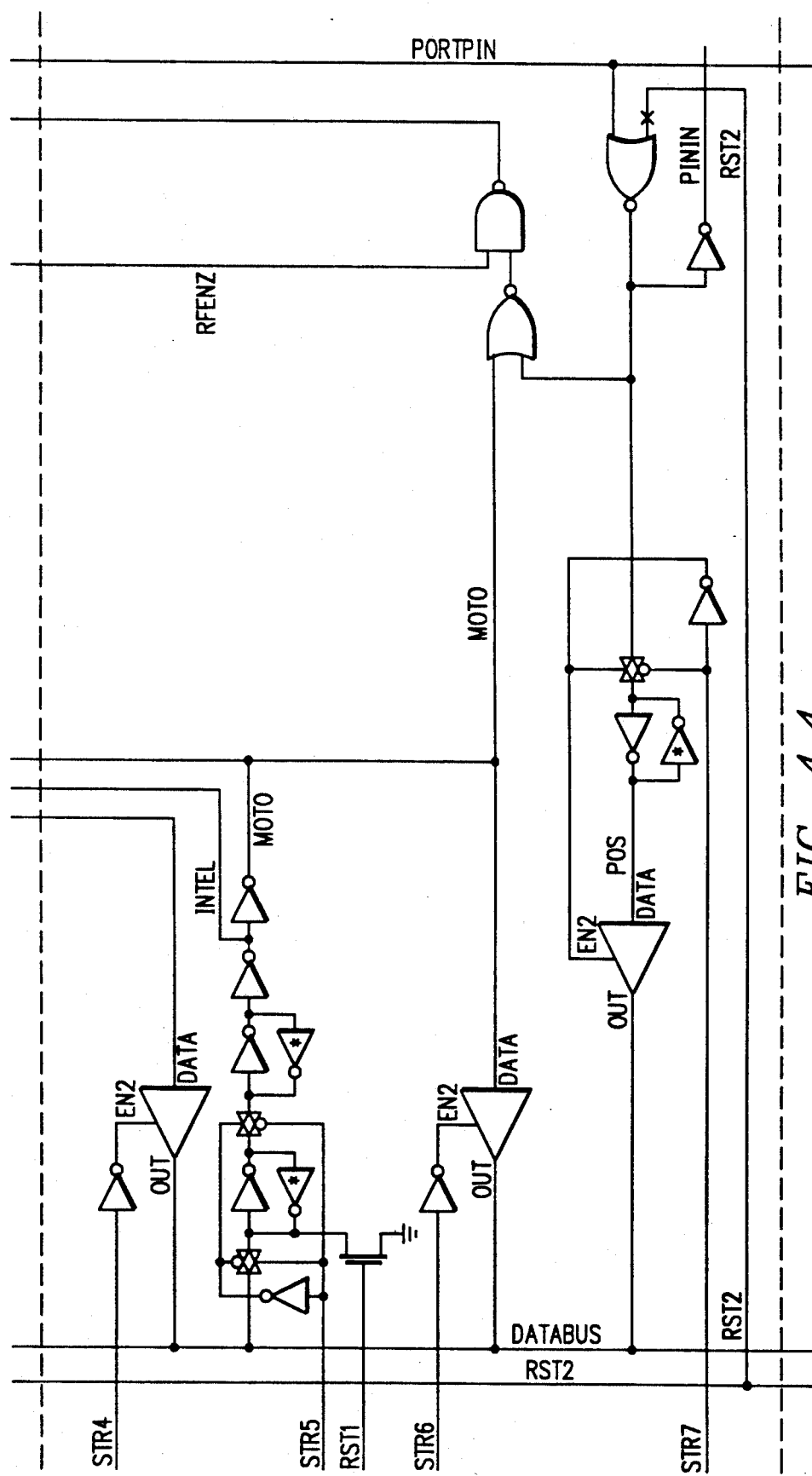
FIG. 4.4

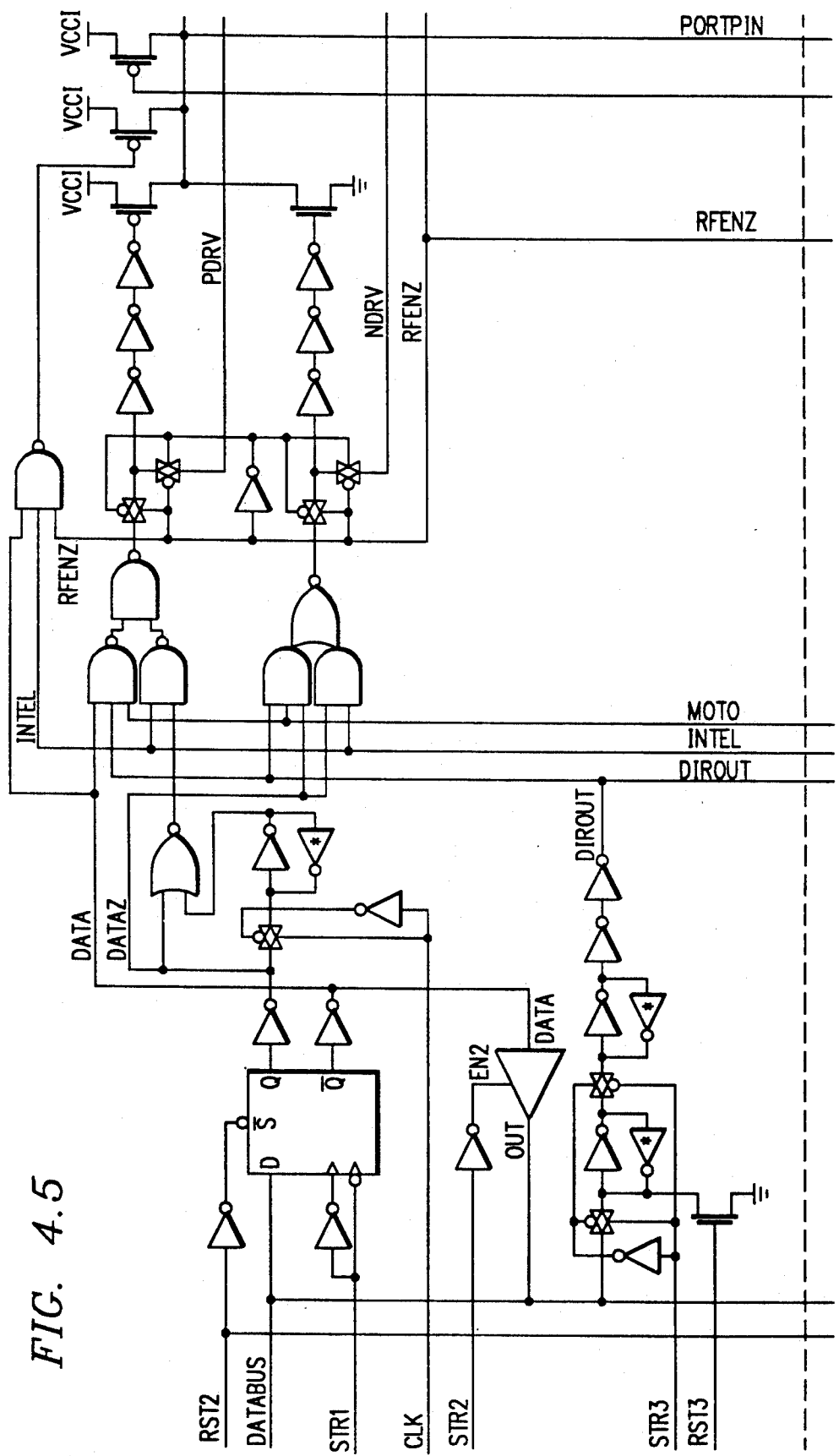
FIG. 4.5

FIG. 7

RELOAD

DUAL FUNCTION MICROBOARD WITH A ROW OF CONNECTORS ON TWO EDGES

CROSS-REFERENCE TO OTHER APPLICATIONS

The following applications of common assignee contain drawings in common with the present application:

Ser. No. 567,436, filed Aug. 13, 1990, entitled "Circuitry and Peripheral Chip for Flexible Electrical Interface";

Ser. No. 567,418, filed Aug. 13, 1990, entitled "Peripheral with Instruction Address Remapping and Shifting Overlay";

Ser. No. 567,395, filed Aug. 13, 1990, entitled "Peripheral with Instruction Address Remapping and Rigorously Separated Control Software Mode and User Software Mode";

Ser. No. 567,396, filed Aug. 13, 1990, entitled "Integrated Circuit With Parameter RAM Accessible Only During Execution of Safeguarded Control Software";

Ser. No. 567,466, filed Aug. 13, 1990, entitled "Peripheral Which Can Revector a Microprocessor's Instruction Sequencing into Secure Memory and which Contains Hardware for Running Checks on Program RAM";

Ser. No. 567,365, filed Aug. 13, 1990, entitled "Processor-Processor Interface: Interrupt Masking with Logical Sum and Product Options";

Ser. No. 567,394, filed Aug. 13, 1990, entitled "Peripheral Which Wraps a More Flexible Processor Interface Around an Existing Microprocessor";

Ser. No. 567,437, filed Aug. 13, 1990, entitled "Latched Multiplexer for Stabilizing the Switch from Crystal to Ring Oscillator at Power-Down";

Ser. No. 567,359, filed Aug. 13, 1990, entitled "Filtered Detection Plus Propagated Timing Window for Stabilizing the Switch From Crystal to Ring Oscillator at Power-Down";

Ser. No. 567,356, filed Aug. 13, 1990, entitled "Peripheral for Transparently Revectoring a Processor's Sequencing into Peripheral's On-chip ROM";

Ser. No. 567,357, filed Aug. 13, 1990, entitled "System With Microprocessor, Modem, and Monitor Chip Which Can Call for Help if Software Integrity is Lost";

Ser. No. 567,468, filed Aug. 13, 1990, entitled "Peripheral Monitor Chip Which Can Call for Help and/or Force Program Branching";

Ser. No. 567,360, filed Aug. 13, 1990, entitled "Peripheral With On-chip Flag Bit Which Enables Running Control Software From Secure Memory";

Ser. No. 567,435, filed Aug. 13, 1990, entitled "Integrated Circuit Which Turns Off Hysteresis in Sleep Mode"; and Ser. No. 567,397, filed Aug. 13, 1990, entitled "Frequency-Independent Monitor Circuit".

all of which are hereby incorporated by reference.

BACKGROUND AND SUMMARY OF THE INVENTION

The present invention relates to systems including programmable logic chips, and particularly to systems which include microprocessors or microcontrollers.[1]

[1] In the following text (including the claims), the term "microprocessors" will normally be used as a generic term, including microcontrollers.

Some Technological Context

The following text will first summarize some background art of broad interest, preparatory to an extremely brief (and non-definitive) description of the claimed invention. To further explain the significance and advantages of the claimed invention, the general features of the preferred system context, including the claimed innovation and other innovations, will then be described.

Nonvolatility in Programmable Logic

There has been a great deal of work over the last five years in adding nonvolatile features into semiconductor memories and memory modules.

However, there are also great potential advantages to providing nonvolatility in microcontrollers and microprocessors:

For example, such a microprocessor could be made immune to power outages.

Similarly, a system built around a microprocessor of this type could be given the ability to power down during periods of no input and power up when input resumed without the user becoming aware of these functions.

In many control applications, processor nonvolatility can provide a convenient basis for adaptive software: by updating algorithm parameters over the history of the system, the fit to the real-world problem can be progressively improved.

Microprocessors with On-Chip Device-Level Nonvolatility

Numerous attempts have been made to provide on-chip nonvolatile memory. This has often been attempted using device technologies which provide nonvolatility, such as FAMOS devices (EEPROM or EPROM cells). However, this adds considerable processing complexity.

Examples of such attempts includeL Goss et al., "μCs with on-chip EEPROM provide system adaptability," EDN, Feb. 28, 1986, pp. 189 ff, which is hereby incorporated by reference; Goss et al., "Single Chip Microcomputer with EEROM [sic] Creates Unique Product Opportunity," Midcon/85 Conference Record, paper 18/2, which is hereby incorporated by reference; Bursky, "On-chip EEPROM gives CMOS DSP IC flexibility," Electronic Design, May 14, 1987, pp. 55ff, which is hereby incorporated by reference.

Microprocessors with Battery-backed Nonvolatility

A pioneering nonvolatile microprocessor was the DS5000. (This integrated circuit, and its data sheet and User Handbook, are available from Dallas Semiconductor Corporation, 4401 South Beltwood Parkway, Dallas Tex. 75244, and are all hereby incorporated by reference.)

This chip has an architecture compatible with the Intel 8051, with various features added for nonvolatility. Thus, the DS5000 instruction set is a superset of the 8051 instruction set. The DS5000 can be directly inserted into any application which already uses the Intel 8051, and the additional features of the DS5000 can be exploited by the system designer and/or made use of by the application software.

However, many existing applications are designed around processors which do not use the 8051 architecture. It would, in principle, be possible to nonvolatize other microcontrollers and microprocessors using the principles incorporated in the DS5000; but that would be very expensive (due to the need for redesign of existing IC circuits and layouts).

Microcontroller System Architectures Generally

The market for 8-bit machines continues to grow, and may continue to remain significant at the low end of the market. However, an inconvenience, from the designer's point of view, is that 8-bit machines often have limited address space. For example, the use of 16-bit addresses means that only 64K words can be addressed, and many 8-bit machines are limited to an address space of 64K.

Some Complex Peripheral Chips Used in Microprocessor Systems

A variety of complex chips have been proposed for use as microprocessor peripherals. Such chips are used when a microprocessor system has to perform tasks 1) which can be accelerated by custom hardware, and/or 2) which can be separated out for processing in parallel. In either case, the interface with the microprocessor is typically designed very carefully, to provide the close data interface often required, while minimizing delays and minimizing burden on the microprocessor.

Various applications of this kind, with various interface requirements and solutions, have been considered. Two examples of interest are port expansion chips and memory management units (MMUs). Other examples, which are of less relevance but present some analogies, include Graphics chips and floating-point-accelerator units.

Nonvolatile Memory for Logic Initialization

See Danielson, "Initialize PIAs from NOVRAMs," *EDN*, Oct. 31, 1984, page 206; Rosini et al., "A 5V-only Single Chip Microcomputer with Nonvolatile SRAM," 1984 *ISSCC Conference Record* at 170ff; Millar et al., "Microcomputer Cuts Printer Controller Pin Count," *Computer Design*, March 1984, pp. 139ff; Berney, "Non-volatile RAM provides on-board storage for computer," *Electronics*, Sep. 22, 1982, pp. 168ff; all of which are hereby incorporated by reference.

Peripheral Chips Which Control Power Supply to a CPU

A commonly owned U.S. Patent application[2] shows a peripheral which can wake a microprocessor or (under the microprocessor's command) put the microprocessor to sleep.

[2] Serial No. 282,793, Filed Dec. 9, 1988, entitled "Sleep Command Conditioned By Timing Window Derived From Strobe Pin", which is hereby incorporated by reference.

Another commonly owned U.S. Patent application[3] shows a peripheral with even more power-management functions for low-power systems.

[3] Ser. No. 282,198, Filed Dec. 9, 1988, entitled "Microprocessor System with Zero-power Standby", which is hereby incorporated by reference.

Peripheral Chips Which Provide "Port Expansion"

Peripherals have been provided for port expansion. For example, the Motorola MC6821,[4] an 8-bit "PIA" (Peripheral Interface Adaptor), is one such. Another example is the Zilog "UPC" (Universal Peripheral Controller).[5]

[4] As stated in Motorola's data sheet for this part: "The MC6821 Peripheral Interface Adapter provides the universal means of interfacing peripheral equipment to the MC6800 family of microprocessors. This device is capable of interfacing the MPU to peripherals through two 8-bit unidirectional peripheral data buses and four control lines. No external logic is required for interfacing to most peripheral devices. "The functional configuration of the PIA is programmed by the MPU during system initialization. Each of the peripheral data lines can be programmed to act as an input or output, and each of the four control-/interrupt lines may be programmed for one of several control modes. This allows a high degree of flexibility in the overall operation of the interface."
This chip, and its data sheet, are both hereby incorporated by reference.
[5] See Walters, "The Zilog UPC, a high performance slave peripheral controller," *Electro/82 Conference Record* paper 14/2, which is hereby incorporated by reference.

Peripheral Chips Which Provide Memory Management

Some peripheral chips, such as MMUs (Memory Management Units), do perform address remapping, in connection with bank swapping. See generally Furht and Milutinovic, "A Survey of Microprocessor Architectures for Memory Management," *Computer* magazine, March 1987, pp. 48ff., which is hereby incorporated by reference. Similarly, address translation is a basic part of any virtual memory system. However, the present inventors know of no prior peripheral which revectors a microprocessor's instruction fetches into the peripheral's on-chip ROM.

Fault-Tolerance in Computer Architectures

Much effort has been devoted to the problems of providing fault-tolerance in computer architectures. See generally Siewiorek, "Architecture of Fault-Tolerant Computers," *Computer* magazine, August 1984, pp. 9ff., which is hereby incorporated by reference.

Interrupts in Inter-Processor Interfaces

A great deal of work has been published regarding interrupt masking in inter-processor interfaces. One example (among many) is Abraham et al., "Use of processor masking as a locking technique for multilevel multiprocessor," 26 *IBM Technical Disclosure Bulletin* 2822 (November 1983), which is hereby incorporated by reference.

Ser. No. 567,436: Circuitry and Peripheral Chip for Flexible Electrical Interface Among the innovations disclosed herein is an adjunct chip, usable as a peripheral to a microprocessor, which provides additional ports for the microprocessor's use, including at least one port which has tremendous flexibility of electrical configuration. The circuitry of this port is itself believed to be novel.

Ser. No. 567,418: Peripheral with Instruction Address Remapping and Shifting Overlay Among the innovations disclosed herein is an adjunct chip, usable as a peripheral to a microprocessor, which transparently overlays control software address space onto the microprocessor's limited address space, while providing full access to the control software and to the instructions (or data) which may already be stored at any address within the address space. This is accomplished by using a shifting overlay map, and substituting addresses transparently to the microprocessor.

This is particularly advantageous with machines, such as 8-bit microprocessors and microcontrollers, which have limited address space (often only 64K).

Ser. No. 567,395: Peripheral with Instruction Address Remapping and Rigorously Separated Control Software Mode and User Software Mode Among the innovations disclosed herein is an adjunct chip, usable as a peripheral to a microprocessor, which provides control software in secure memory, at an address range which is overlaid onto the addresses which otherwise would be accessed by the microprocessor to run programs from external memory. Execution of the control software is rigorously separated from execution of user (application) software: once the microprocessor is executing control software, the adjunct chip will issue a reset before allowing the microprocessor to return to execution of application software.

The control software is allowed to access several system configuration options which the user software is not allowed to access. For example, the memory space is preferably configurable in several different ways, but memory reconfiguration is not permitted from user software.

In alternative embodiments (but not in the presently preferred embodiment) the watchdog can be allowed to be reprogrammed (or turned off or turned on) only from control software, not from application software.

Ser. No. 567,396: Integrated Circuit with Parameter RAM accessible only during execution of Safeguarded Control Software Among the innovations disclosed herein is an adjunct chip, usable as a peripheral to a microprocessor, which can issue resets and/or interrupts to the microprocessor, and which can force the microprocessor to execute control software programs which are stored in secure memory. (The control software is preferably, but necessarily, addressed at an address range which is overlaid onto the addresses which otherwise would be accessed by the microprocessor to run programs from external memory.) Execution of the control software is rigorously separated from execution of user (application) software: once the microprocessor is executing control software, the adjunct chip will issue a reset before allowing the microprocessor to return to execution of application software.

The parameter RAM is preferably, but necessarily, located (as seen by the microprocessor) at an address range which is overlaid onto the addresses which otherwise would be accessed by the microprocessor for data operations from external memory.

It is also highly preferable, but not strictly necessary, that the parameter RAM be physically located on the adjunct chip.

Ser. No. 567,466: Peripheral which can Revector a Microprocessor's Instruction Sequencing into Secure Memory and which Contains Hardware for Running Checks on Program RAM Among the innovations disclosed herein is an adjunct chip, usable as a peripheral to a microprocessor, which provides greatly increased assurance of software integrity. The adjunct chip contains on-chip ROM memory, which holds secure control programs, and on-chip hardware for implementing CRC logic. The adjunct chip intercepts address lines from the microprocessor, and can selectably overlay its on-chip ROM onto the microprocessor's address space. The adjunct chip can issue resets, to force the microprocessor to come up running the secure control software.

The secure control software includes commands for running CRC checks on the microprocessor's program RAM. To accelerate the calculation of redundancy-check-values, and assure their sanity, the adjunct chip contains hardware for calculating the redundancy-check-values.

This is particularly useful in systems using battery-backed memory, since users may want the additional reassurance of software integrity checking. This is also expected to be useful in certain control applications where reliability is essential. This may also be useful in installations which are subject to high electrical noise, relatively high levels of ionizing radiation, and/or sporadic high temperatures. Examples include avionics, factory floor automation, and vehicular control.

Ser. No. 567,365: Processor-Processor: Interrupt Masking with Logical Sum and Product Options Among the innovations disclosed herein is a new circuit organization for interfacing asynchronous processors to each other.

A great deal of work has been devoted to the problem of how two processors can talk to each other. In conventional processor architectures, each individual processor can only attend to one task at any one moment. Thus, for processor A to respond to communications from processor B, processor A's own task may have to be interrupted.

Thus, a basic dilemma in processor-processor interfaces, in most architectures, is:
urgent messages have to get through;
but messages have to be screened, so that not all necessarily get through.

Many multiprocessor systems use an interrupt architecture which is predefined, at a high level, to provide (it is hoped) the desired degree of flexibility. For example, EPC patent 0,071,727, which is hereby incorporated by reference, shows a multiprocessor system in which every interrupt carries with it one of 256 priority levels.

However, the disclosed innovation provides a significant advance over this, in that hardware-programmable interrupt masking logic permits the receiving processor to select what interrupt condition, or combination of conditions, it will or will not respond to.

In particular, the disclosed innovation provides interrupt masking logic which the receiving processor can program to select not only which one or more interrupt conditions will be considered, but also what logic combination of these conditions will be responded to.

A further feature of this interface is that it is programmable from both sides of the interface.

Ser. No. 567,394: Peripheral which Wraps a More Flexible Processor Interface Around an Existing Microprocessor Among the innovations disclosed herein is an adjunct chip (usable as a peripheral to a microprocessor) including two-way interrupt-handling logic which provides more flexible interface between the microprocessor and a host processor or external processor or peripheral controller. The circuitry of this interrupt-handling logic is itself believed to be novel.

Ser. No. 567,437: Latched Multiplexer for Stabilizing the Switch from Crystal to Ring Oscillator at Power-Down Priority is hereby claimed from co-pending U.S. application Ser. No. 238,809, Filed Aug. 31, 1988, entitled "Nonvolatile Microprocessor with Predetermined State on Power-down."

Among the innovations disclosed herein is an adjunct chip, usable as a peripheral to a microprocessor, which detects power failure, and puts the microprocessor into a known state upon power down, and then resets the microprocessor.

In order to reliably and stably put the microprocessor into a known state, several clocks are generated before the reset signal. However, since the power supply is failing, it is possible that the crystal-controlled oscillator may already have become unreliable. Therefore, a simple logic circuit (a ring oscillator, in the presently preferred embodiment) is used to generate the needed additional clocks at power-down.[6]

[6] This was the teaching of commonly owned application Ser. No. 238,809, Filed Aug. 31, 1988 ("Nonvolatile microprocessor with predetermined state on power-down,"), which is hereby incorporated by reference. The preferred embodiment, in that application, was a nonvolatized microprocessor which included a ring oscillator on-chip to generate these additional clocks upon power-down reset.

However, the present application further teaches that the switch from crystal-controlled oscillator to ring oscillator needs to be stabilized. The ring oscillator consumes much less power than the crystal oscillator, and the microprocessor in sleep mode will consume still less. Thus, where the system power supply has a relatively high source impedance and a relatively light load, the power supply voltage may increase again after the power supply is unloaded by turning off the crystal oscillator. Under a worst-case scenario, the oscillator may be turned on and off several times. This is undesirable, because it may generate clock "slivers," i.e. short transients which may cause anomalous logic state propagation.

In the presently preferred embodiment, the switch from crystal-controlled oscillator to ring oscillator is stabilized by using a latched multiplexer to switch between the two oscillator inputs. The latch adds hysteresis to the switching characteristic, avoiding any problem of switching jitter.

Ser. No. 567,359: Filtered Detection plus Propagated Timing Window for Stabilizing the Switch from Crystal to Ring Oscillator at Power-Down Priority is hereby claimed from co-pending U.S. application Ser. No. 238,809, Filed Aug. 31, 1988, entitled "Nonvolatile Microprocessor with Predetermined State on Power-down."

Among the innovations disclosed herein is an adjunct chip, usable as a peripheral to a microprocessor, which detects power failure, and puts the microprocessor into a known state upon power down, and then resets the microprocessor.

In order to reliably and stably put the microprocessor into a known state, several clocks are generated before the reset signal. However, since the power supply is failing, it is possible that the crystal-controlled oscillator may already have become unreliable. Therefore, a simple logic circuit (a ring oscillator, in the presently preferred embodiment) is used to generate the needed additional clocks at power-down.[7]

[7]This was the teaching of commonly owned application Ser. No. 238,809, Filed Aug. 31, 1988 ("Nonvolatile microprocessor with predetermined state on power-down,"), which is hereby incorporated by reference. The preferred embodiment, in that application, was a nonvolatized microprocessor which included a ring oscillator on-chip to generate these additional clocks upon power-down reset.

However, the present application further teaches that the switch from crystal-controlled oscillator to ring oscillator needs to be stabilized. The ring oscillator consumes much less power than the crystal oscillator, and the microprocessor in sleep mode will consume still less. Thus, where the system power supply has a relatively high source impedance and a relatively light load, the power supply voltage may increase again after the power supply is unloaded by turning off the crystal oscillator. Under a worst-case scenario, the oscillator may be turned on and off several times. This is undesirable, because it may generate clock "slivers," i.e. short transients which may cause anomalous logic state propagation.

In the presently preferred embodiment, the switch from crystal-controlled oscillator to ring oscillator is stabilized by using a nonlinear filtered circuit (driven by both the ring oscillator and the crystal oscillator) to detect when the crystal oscillator actually begins to fail. A transmission gate is then disabled, and the state frozen for long enough to allow any changes to propagate through.

Ser. No. 567,356: Peripheral for Transparently Revectoring a Processor's Sequencing into Peripheral's On-chip ROM Among the innovations disclosed herein is an adjunct chip, usable as a peripheral to a microprocessor, which intercepts instruction fetches to RAM from the microprocessor, and can (selectably) substitute a block of instructions in the peripheral's on-chip ROM for the software stored in RAM. This can be used for verification or other control programs, to provide improved reliability.

Ser. No. 567,357: System with Microprocessor, Modem, and Monitor Chip which can Call for Help if Software Integrity is Lost Priority is hereby claimed from commonly owned co-pending U.S. application Ser. No. 282,702, Filed Dec. 9, 1988.

Among the innovations disclosed herein is a system which includes a microprocessor and a modem, and also includes an adjunct chip which can force the microprocessor through integrity checks and which can call for help if software integrity is lost.

Ser. No. 567,468: Peripheral Monitor Chip Which Can Call for Help and/or Force Program Branching Priority is hereby claimed from commonly owned co-pending U.S. application Ser. No. 282,702, Filed Dec. 9, 1988.

Among the innovations disclosed herein is an adjunct chip, usable as a peripheral to a microprocessor, which monitors the microprocessor's activity, and can force the microprocessor to reset, and can force the microprocessor to run a verification program (or other control program), and can call for help if software integrity is lost.

Ser. No. 567,360: Peripheral with On-chip Flag Bit which Enables Running Control Software from Secure Memory Among the innovations disclosed herein is an adjunct chip, usable as a peripheral to a microprocessor, which provides control software in secure memory, at an address range which is overlaid onto the addresses which otherwise would be accessed by the microprocessor to run programs from external memory. A flag bit, in the peripheral's on-chip memory, generally selects whether execution of the control software will occur on power-up or other reset. This permits easy entry into the control software, while still providing great protection for the integrity of the control software and its registers.

Ser. No. 567,435: Integrated Circuit Which Turns Off Hysteresis in Sleep Mode

Among the innovations disclosed herein is an integrated circuit which turns off a switchable timed hysteresis circuit upon entering sleep mode.

The presently preferred embodiment includes an adjunct integrated circuit, usable as a microprocessor peripheral, which contains circuitry to detect when the power supply goes out of tolerance, and which generates interrupt, reset, and clock[8] signals for the microprocessor.

[8]The clock signals are generated by a ring oscillator circuit if the crystal-controlled oscillator stops.

Timed hysteresis is used to implement the power-down reset and interrupt relationships. This is advantageous because it avoids a problem of repeatedly activating reset or interrupt signals on power-down or even on a slow power-up due to clock "slivers," i.e., noise seen inside the chip from clock transitions.

Other integrated circuits, such as the DS1236, have used timed hysteresis for stabilizing a transition.

However, the integrated circuit disclosed herein has the further capability of entering a sleep mode. This poses a difficulty in that, in sleep mode, there are no clocks available in the adjunct chip. Therefore, in sleep mode, the hysteresis circuit is simply bypassed. This provides the advantages of a stabilized transition, and also provides the advantages of sleep mode. Moreover, these advantages combine synergistically in the various system and subsystem embodiments described below.

Ser. No. 567,397: Frequency-Independent Monitor Circuit

Among the innovations disclosed herein is a clock monitor circuit which is frequency-independent. The clock terminals on a circuit being monitored for activity may be considered as an inverter combined with a phase delay. The innovative circuit has clock-output and clock-input terminals[9] which are connected to the clock terminals on the circuit being monitored. When a rising edge appears on the clock-output terminal, the clock-input line is sampled: if the circuit being monitored is properly active, the level on the clock-input line will be high. Similarly, when a falling edge appears on the clock-output terminal, the clock-input line is sampled: if the circuit being monitored is properly active, the level on the clock-input line will be low. Whenever a low level is detected on a rising edge, or a high level on a falling edge, a counter chain will start counting down. The counter chain will be reset only when a high level is detected on a rising edge AND a low level is detected on the next falling edge.

[9] The innovative circuit preferably also has two additional terminals which are connected to a crystal.

Thus, when the circuit being monitored becomes inactive, the counter chain will start to count down, and will eventually reach zero. In the presently preferred embodiment, this condition is used to detect that the microprocessor has gone to sleep, and accordingly the crystal oscillator can be stopped.

Ser. No. 567,467: Mirror-Image SipStik Subboard

Another innovative feature set forth herein is an innovative microboard package.

SipStik TM packages, having a similar form factor to a SIMM memory module, have been introduced by Dallas Semiconductor to package complex logic, analog, and/or telecommunications functions. In the presently preferred embodiment, a subsystem such as shown in FIGS. 1A-1, 1A-2, or 2A-1, 2A-2 is packaged in a new kind of SipStik.

SipStiks have a substantial advantage in their very low height and compact size, but sometimes it is difficult to find room for the desired pinout along one edge of such a small package.

In the presently preferred embodiment, a SipStik package is used which has SipStik connectors along both the upper and lower edges, as shown in FIG. 16. This innovative structure can be used in multiple ways.

In the presently preferred embodiment, an integrated subsystem as shown in FIGS. 1A-1, 1A-2, or 2A-1, 2A-2 can be used as a microprocessor or as a microcomputer. However, the pinouts desired for these two uses are not identical, and the total available pinout, with the preferred pin spacing and package dimensions, does not permit all of the signals desired for either use to be brought out. Therefore, the presently preferred embodiment provides a "mirror-image" SipStik, which can be inserted in one orientation to provide a microprocessor functionality, and can be inserted upside-down to provide microcomputer functionality.

Another way of using this mirror-image SipStik is to connect a jumper connector to the top connection row. Since the top connection has the same form factor as the main connection, an adaptation of the same connector can be used to connect the Stik's top connector to a flat ribbon cable.

A further variation of this is that the same connector header, which is normally mounted on a PC board to receive a SipStik module, is modified, with a small complementary header, to mate to the connector on the top edge of a SipStik board. This provides system designers with tremendous flexibility.

The SipStik modules normally have a battery mounted on-board, and are normally encapsulated by a conformal sealant to reduce exposure of the battery to environmental conditions. This environmental sealant, of course, does not extend over the connector areas. The mirror-image SipStik disclosed herein is therefore entirely compatible with this sealing process.

Of course, a wide variety of modifications of this idea can be used if desired.

Innovative System Architecture with Nonvolatizing Adjunct Chip

The present application describes a nonvolatizing adjunct chip (a "softener" chip) which can be used in combination with a variety of microprocessors or microcontrollers to add nonvolatile functions into these machines. Thus, existing logic chips can be made crash-proof. In addition, the adjunct chips provide a power monitoring function, which will generate interrupts and/or resets when the system power begins to fail, permitting orderly shutdown.

The adjunct chip is a complex logic chip, but it is not (in the presently preferred embodiments) a fully programmable processor. The associated processor provides programmable instruction execution; the adjunct chip merely provides an add-on component, which adds nonvolatility.

The adjunct chip of the presently preferred embodiment performs a number of valuable functions: it not only nonvolatizes the microprocessor, but also "wraps around" the microprocessor to provide additional ports (and expanded electrical interface options), and also additional options for a hardware/software interface to another system.

Thus, the adjunct chip of the presently preferred embodiment "wraps around" a microprocessor to provide
1) nonvolatility
2) and additional ports
3) and broader electrical port compatibility
4) and more versatile interrupt-handling,
5) without losing any of the microprocessor's capabilities;
6) and provides all of the foregoing advantages in a package which is readily adaptable to other microprocessors.

ROM-Based Control Software as a Touchstone for Verification

An important motivation for the use of ROM, in a nonvolatized system, is that ROM provides a firm foundation for verification of software integrity.

Innovative Adjunct Chip Architecture

Some of the noteworthy novel features of the adjunct chip's architecture (in the presently preferred embodiment), which lead to substantial system-level advantages, will now be described.

Control Software versus User Software

The adjunct chip provides a program memory revectoring capability, so that the code executed by the microprocessor can be sequenced from the adjunct chip's ROM or from external RAM. Operation of the microprocessor from these sources of code is handled very differently. This novel architecture includes several features of interest.

First, execution of ROM software provides a highly secure basis for program verification. To facilitate this, the ROM software, and its on-chip RAM data, are heavily protected against incursions by user software. Reliable routes for entering and leaving ROM software are provided, which retain security without greatly impeding operation.

Second, it should be noted that, when the microprocessor is operating from the adjunct chip's ROM software, the adjunct chip is not actually sequencing code to the target microprocessor. (This would present some architectural incompatibility.) Instead, the adjunct chip provides overlaid interception capabilities which provide essentially the same functionality. Thus, while the function of the adjunct chip is probably more analogous to a sequencer than to a full coprocessor, it is in fact neither a sequencer nor a coprocessor.

Third, some significant tricks are used in handling the address map, as will be discussed in detail below. The control-software code is overlaid onto the RAM address space, and several features are used to facilitate this overlay.

Operating from RAM or External ROM

A bank of external memory is used, conventionally, to store programming and data for the target microprocessor. During normal operation of the microprocessor (with system power on), the adjunct chip permits sequencing of code from the external program RAM, so that the adjunct chip is transparent to the microprocessor.

However, to assist in the adjunct chip's nonvolatizing functions (at startup), and to assist in assuring code integrity, the adjunct chip also includes a block of program ROM. This is used to perform control functions as described below.

Some innovative ideas are also used for transition between sequencing code from ROM and sequencing code from program RAM, as described below.

Functions Governed by Control Software

When the microprocessor is operating in control mode, the softener redirects addresses as follows: when the microprocessor tries to access an initial address in program RAM, the adjunct chip revectors this access so that the microprocessor is reading out (and executing) the start-up code which is stored in the adjunct chip's ROM.

In the presently preferred embodiment, the code contained in ROM is used for two major functions:
Reloading the target microprocessor's program memory;
Performing CRC check operations on the target microprocessor's program memory.

The adjunct chip also includes 16 bytes of internal RAM which are only accessible by the control software, not by the user software. In the presently preferred embodiment, this RAM is further protected by timed-access relationships. These bytes are used to store the high and low boundaries for CRC operation.

Entering Control-Software Execution

The adjunct chip provides both software and hardware avenues to enter execution of the control software. This unusual degree of flexibility has been achieved without compromosing the security and stability of the system.

The control software can be exited by clearing the "ROM" bit in the adjunct chip's RAM. This automatically causes a reset to be issued, following which the microprocessor will be allowed to run in application mode.

As background, it should be noted that the DS5000 nonvolatile microcontroller performs an automatic reset on exiting ROM code. See commonly owned U.S. patent application Ser. No. 164,097, Filed Mar. 4, 1988, and entitled "Partitionable embedded program and data memory for a central processing unit," which is hereby incorporated by reference.

Control-Software Routines: CRC

At every entry into the control software, a branch to control or reloading routines is made.

In the presently preferred embodiment, the ROM memory in the adjunct chip can be accessed when the microprocessor powers up, and a CRC check then run on the user program, in external RAM.

In the presently preferred embodiment, the adjunct chip itself contains hardware for generating the Cyclic Redundancy Check (CRC) check value. The microprocessor merely has to read out the data values in the range to be checked, and push them successively into a register address. The softener hardware captures writes to this address, and loads the stream of values into its CRC hardware. The microprocessor can fetch the computed CRC value by simply reading another "register," at a register address which is remapped into the softener. Thus, the microprocessor never has to do the many shift and XOR operations for CRC computation: it simply performs a series of 8-bit register writes, a 16-bit register read, and a compare operation. This speeds up CRC generation, and allows system software designers to use CRC checking more readily.

The arguments for CRC check operations, including high- and low-address boundaries and the expected check value, are kept in the adjunct chip's on-chip RAM. (This RAM is only accessible when the microprocessor is executing code from ROM.) Thus, when a CRC operation is initiated, the designated block of memory will be processed to generate a CRC redundancy check value.

Control-Software Routines: Reloading

An important control operation, performed under the control of adjunct chip ROM code, is reloading the RAM code which will be executed by the target microprocessor. This prevents any possibility of the target microprocessor reaching a "stuck" condition due to corruption of the RAM code.

One of the ways to initiate such a program reload is by means of the RL* input signal. (There are other ways, as described below.) The RL* input, which is used to control reloads, is not purely a logic level. The following table gives a concise summary of some of the key relationships:

DS5340 ROM LOADER and CRC CHECK DETERMINATION

```
CRC => CRC = 1 = RUN CRC CHECK
       CRC = 0 = DO NOT RUN CRC CHECK
```

```
IRL =>  IRL = 1 = RELOAD PIN ACTIVE
        IRL = 0 = RELOAD PIN INACTIVE

ROM =>  ROM = 1 = SET IF ROM ENTERED BY USER SOFTWARE
        ROM = 0 = CLEARED IF ROM ENTERED BY DOG OR RL PIN

WDS =>  WDS = 1 = WATCHDOG HIT
        WDS = 0 = NO WATCHDOG HIT

PUP =>  PUP = 1 = SET BY USER TO INDICATE NOT POWER-UP
        PUP = 0 = CLEARED BY POWER-UP
```

Method of Entering ROM.

```
1.
      CRC = 1                  Watchdog time-out
If    or        when           or              then enter ROM mode.
      IRL = 1                  power on reset
2.
RL receives a negative edge.
3.
Software sets ROM bit high.
```

Method of Leaving ROM.

```
1.
Take RL pin high. Positive edge will clear ROM bit.

2.
Clear ROM bit.
```

Reason for CRC check:
```
      1.  Power-up system check.
      2.  Hardware hit by watchdog
      3.  Software check as required by user software.
```

A reload command causes a reset, which then branches into the adjunct chip's ROM address space. When execution of the control software is completed, the adjunct chip will again reset the target microprocessor, and execution can then begin in the user's program memory.

Exiting Control Software Execution

At the end of a control-software program, the microprocessor is commanded to clear the ROM-software-enable bit. This automatically causes the microprocessor to be reset; when the microprocessor comes back up after the reset, it is allowed to execute code from RAM. Execution of application software can then proceed normally.

Flexible Port Architecture

One of the architectural points to be considered in the adjunct chip architecture is the use of ports.

Note that the adjunct chip of the presently preferred embodiment consumes at least one port of the microprocessor, and ports are a valuable resource in microprocessor system configurations. Therefore, the adjunct chip of the presently preferred embodiment provides additional port capacity, which can be used to provide close-in port multiplexing of the microprocessor, or simply to avoid any net loss of port capacity.

Moreover, the adjunct chip of the presently preferred embodiment also includes considerable additional port-interfacing logic, to increase the designer's options for interfacing the microprocessor to another system.

Option for Address/Data Multiplexing

Some microprocessors multiplex address and data onto the same set of pins, using a control signal such as ALE or AS. To accommodate this, the adjunct chip provides a process mask option so that multiplexing can be selected or deselected.

Super-Adaptable Port ("Cadillac" Port)

One of the features of the preferred adjunct chip architecture is that one of the ports is made extremely versatile and programmable. To ensure that port versatility is not lost, the preferred embodiment of the adjunct chip contains one port (Port A) which has extraordinarily high versatility. This port is programmable bit-by-bit to emulate a very wide variety of port characteristics.

This port can implement either full Motorola or full Intel[10] port relationships. In addition, this port has the capability to read either the pad or the data register, independently of the data direction. Thus, the innovative port provides the capability for full Motorola emulation, and also provides additional flexibility.[10]

[10] The Motorola and Intel electrical definitions are significantly different, as described below.

This port also has the ability to sense an edge transition, of either sign, or to sense a level of either sign (as long as it remains for more than one bus cycle) and to generate interrupts therefrom, in accordance with mask bits.

The ability to sense edges is particularly useful, since one problem with microprocessor ports in general is that some input signals may generate an edge at the microprocessor port which does not correspond to a long-term level shift. The sampling time of the microprocessor may be long enough that such a pulse could be missed.

System Interface and Register File Structure

The presently preferred embodiment includes a highly flexible register file structure, which contains several innovative features to faciliate control interactions between the adjunct chip and the target microprocessor. (Some of these innovations are also applicable to handshaking, semaphoring, and other control interactions across any asynchronous processor-processor boundary.)

Background: the Intel 8042 Interface

The 8042 (which was a remake of the 8048) converted two ports of the architecture to provide a register which was directly interfaced to the PC bus. This presented some difficulty at the time, since the PC bus was faster than the typically slow microcontroller. The 8042 therefore used a two-port asynchronous latch. The 8042 is still very commonly used to provide the keyboard interface in IBM PC/AT-compatible architectures.

The asynchronous latch of the 8042 provided one 8-bit input register and one 8-bit output register. A status register, with an appropriate flag bit, is used to differentiate between command and data loads.

Overall Architecture of the Innovative Interface

The register file structure adds capability to a microprocessor. In effect, this structure also expands the capabilities of the microprocessor, by adding more flexible interrupt handling, and thus better communications with other, asynchronous, processors.

Status Registers

The status registers are double buffered. The adjunct chip includes eight input registers, eight output registers, and eight registers for command, control, and status information. These 24 registers actually only have 16 register addresses. (The implementation of this will be described below.)

The status registers also include four flags which can be used to set interrupt dependencies. The status registers also include mask bits which can be used to mask the interrupts generated from the opposite status register. Thus, the internal side of this interface can set a bit to mask interrupts which would otherwise be generated by status information input from the external side of the status register.

Input and Output Registers

The eight input buffer registers (labeled "IB") are writable externally and readable internally. The eight output buffer registers (labeled "OB") are readable externally and writable internally.

While the average speeds on the two sides of the interface are typically comparable, they are necessarily asynchronous. Thus, the described architecture provides particular advantages in this asynchronous interface. The innovative ideas used in this interface architecture can also be used in other asynchronous interfaces, particularly where control information must be passed across an asynchronous boundary.

The IBF and OBF registers provide write/read flags for the corresponding registers. Thus, these flags will indicate to the reading side whether new information has been written in from the other side, and will indicate to the writing side whether the reading side has yet read out the previously written information. (The IBF and OBF registers are operated as slaves.)

The mask registers (internal IBM, internal OBM, external IBM, external OBM) indicate which of the input and output registers can generate an interrupt. The bits in the status registers can also indicate an "and" relationship or an "or" relationship. Note that the internal IBM and OBM registers are controlled from the internal side, and the external IBM and OBM registers are controlled from the external side. Thus, there is full programmability in controlling the automatic generation of interrupt signals based on the status of buffer registers. This is believed to be a new and generally applicable way to control status information.

Special Hardware for CRC Generation

The adjunct chip also includes hardware cyclic redundancy check circuits. In the presently preferred embodiment, these follow the US CRC-16 standard, but the European standard is available as a mask option.

Freshness Seal Circuitry

The adjunct chip, in the presently preferred embodiment, also includes a freshness seal circuit, so that absolutely no battery drain will occur before the chip is placed in service.

Accommodation of Processor's "Sleep" Mode

Some processors have a "stop" mode (also known as a sleep mode). In general, this capability is used to provide a low-power idle state for the microprocessor.

The adjunct chip also has a low-power sleep mode, which it can enter when the target microprocessor is asleep. It would be wasteful for the adjunct chip to remain in an active high-power mode if the microprocessor has gone into a low-power sleep mode. Thus, the following discussion relates not only to issues of shutting down and waking up the microprocessor, but also to issues of shutting down and waking up the adjunct chip.

When the adjunct chip enters sleep mode, it will typically interrupt the oscillator clock to the microprocessor; interrupt reset signals to the microprocessor; and turn off its watchdog circuit. Also, on entering sleep mode, the op amp's current source is turned down. This causes the op amp to react more slowly.

In an optional alternative (not included in the presently preferred embodiment), the adjunct chip can see a "stop" instruction come through in the microprocessor's code being executed from RAM, and can thereby anticipate a "sleep" command from the microprocessor.

For a further example, the adjunct chip can monitor electrical activity on the microprocessor's output lines. If a certain number of clocks pass with no activity whatsoever on the microprocessor's clock-output line, the adjunct chip can assume that the microprocessor has gone to sleep.

In the system architecture, the microprocessor is not directly connected to a crystal. Instead, the adjunct chip is interposed between the microprocessor and its crystal. Similarly, the adjunct chip is interposed between the microprocessor's reset input and the external reset connection.

Thus, when the adjunct chip determines that the microprocessor is in sleep mode, the adjunct chip can turn off clock pulses to the microprocessor. Similarly, when the microprocessor is to wake up again, the adjunct chip can restart the oscillator, and wait for the oscillator to stabilize, before allowing the microprocessor to be clocked by the oscillator. (In the presently preferred embodiment, the microprocessor is held in reset while the oscillator stabilizes.) The oscillator will normally have a significant current burn, and it is desirable to avoid this when the system is in a minimum-power mode.

Some microprocessor architectures require that the microprocessor be awakened from sleep mode if an interrupt is received. Accordingly, the adjunct chip also has a mask option whereby the microprocessor will be awakened if an interrupt is received.

Other conditions wherein the target microprocessor will be reawakened include detection of a power-down condition (as described below) or a reload operation.

Generation of Reset or Interrupt Signals on Power-Down

When the adjunct chip detects that power supply voltage is below limits, it will send the microprocessor an interrupt, and then (after some intervening clock cycles) a reset, and then will send more clock pulses before going into a "stop" mode. (The adjunct chip's stop mode, like the microprocessor's sleep mode, provides reduced power consumption during long periods of inactivity.)

In the presently preferred embodiment, timed hysteresis is used to implement the power-down reset and interrupt relationships. This is advantageous because it avoids a problem of repeatedly activating reset or interrupt signals on power-down or even on a slow power-up due to clock "slivers," i.e., noise seen inside the chip from clock transitions.

However, a difficulty is that, in sleep mode, there are no clocks available in the adjunct chip. Therefore, in sleep mode, this hysteresis circuit is simply bypassed.

Other integrated circuits, such as the DS1236, have used timed hysteresis for stabilizing a transition. However, an integrated circuit which turns off a switchable timed hysteresis circuit upon entering sleep mode is advantageous, and is believed to be novel.

Awakening

Some microprocessors are designed to wake on an interrupt. The adjunct chip family has a mask option so that the target microprocessor can be waked when the appropriate interrupt is received.

Different versions of the adjunct chip will also wake the microprocessor upon a power-down or from a program reload.

Reference Voltage Generation

The adjunct chip also includes a band-gap voltage reference. This function is somewhat power hungry. Therefore, in sleep mode, the band-gap voltage reference is switched off. Instead, in sleep mode, the battery input is used as the reference input to comparators. When the chip returns to the active mode, the band-gap voltage reference is reactivated, and this output is used for a reference input.

Watchdog Function

The adjunct chip also contains a watchdog function. This function, too, is made programmable. Thus, the user can determine what period of inactivity the watchdog function should wait for before activating a reset or interrupt. Moreover, the watchdog can optionally be turned off. (The watchdog function is also turned off when the adjunct chip enters its stop mode.)

The watchdog function is always active when the microprocessor is being operated from adjunct chip ROM.

Protection of Programmable Options

As noted, the softener chip also includes a small amount of parameter RAM, which is used to preserve the status of various programmable options. In the presently preferred embodiment, this RAM includes only 16 bytes, which are organized in two blocks: Each holds a start address, an end address, and a CRC value.

The watchdog parameters, like other programmable options, need to be insulated against accidental corruption by application software. Several techniques are used to provide such protection:

(1) Some programmable bits are writable only while the microprocessor is executing code from the adjunct chip ROM.
(2) Some programmable bits are protected by timed-access relations, so that the bit can be accessed only within a certain time window defined with respect to a particular sequence of writes to a register. (See U.S. patent application Ser. No. 163,980, Filed Mar. 4, 1988, which is hereby incorporated by reference.)
(3) Some bits are protected both by limitation to control software and by timed-access relationships.

Different Versions for Different Processor Families

In the presently preferred embodiment, the adjunct chip can exist in several different versions, which each have slightly different features (implemented by a simple mask option, as described below), depending on which target microprocessor is to be used. In the present class of embodiments, five different versions of the adjunct chip are contemplated, aimed at five different families of target microprocessor. Of course, further versions of the adjunct chip can also be added, with other target microprocessors.

A further advantage of the adjunct chip is that it can provide great versatility in the device-level architecture of the target microprocessor. Thus, the CMOS adjunct chip can be combined with an NMOS, or even bipolar, target microprocessor to provide a low-power and crash-proof system.

Nonvolatizing Associated Memory

Another general feature which is provided by the adjunct chip is a nonvolatizing interface for control of SRAMs. The ability to preserve data in a bank of memory provides a tremendous increase in system versatility.

Memory-Map with Sliding Overlay

The softener ROM and the softener RAM are both overlaid onto program memory. Moreover, this is a sliding overlay, so that none of the underlying memory space is lost.

Address Inversion for Program Loading

Program reloading, while the microprocessor is executing a different program from memory which is overlaid onto the program memory's space, presents a potential address conflict. In the presently preferred embodiment, an address inversion scheme avoids any such conflict.

Due to address overlap between the ROM-code space and the application program address space, an address remapping trick is used for initial loading of program memory. One or more high-order address bits are inverted to permit writing into the address space under the ROM-code addresses, without redirecting the sequence of ROM-code execution. A special chip-enable decoder is used to correct the inverted address bits.

Sliding Window of Memory Protection

A variety of problems arise in attempting to accommodate the wide variety of architectures, port interfaces, and other requirements of various microprocessors.

For example, the 8051 architecture carries data and program memory in two separate memory maps. In this architecture, it is impossible for the application program to write in program memory—there is simply no instruction to do this. However, Motorola architecture (e.g., in the 6800 and related chips) has a common memory architecture, where data and program memory share the same address space. This can be a danger in RAM-based systems, since it is conceivable that the user memory may overwrite some of the program and thus cause unpredictable results.

The adjunct chip, in the presently preferred embodiment, includes a sliding window of memory protection to prevent the user program from overwriting the operating program inadvertently. The adjunct chip intercepts the write-enable signals to the memory, and controls generation of the chip-enable signals, to implement this protection. This solves an important problem with nonvolatizing Motorola architectures.

Multiple Chip-Enable Outputs for Other Attached Chips

A further feature of the adjunct chip is to provide multiple chip-enable outputs for other peripheral chips. Preferably one output is provided for battery-backed chips, and one for chips which are not battery-backed (e.g., for a non-battery-backed clock, such as DS1283, or a UART). The chip-enable lines to battery-backed chips are preferably held high (inactive) while power is down, to keep those chips from being turned on by random floating-node voltages.

Getting the Processor into a Known State upon Reset

The DS5000 microcontroller switches from a crystal-controlled oscillator to a ring oscillator on power-down, since the crystal oscillator will cease to operate, at some point, as the voltage drops.[11]

[11]In the DS5000, the ring-oscillator clocking is used to ensure generation of sufficient clock cycles, after the power-down reset, to end up in a known state. See commonly owned application Ser. No. 238,809, Filed Aug. 31, 1988 ("Nonvolatile microprocessor with predetermined state on power-down,"), which is hereby incorporated by reference.

The adjunct chip, in the presently preferred embodiment, also includes a ring oscillator which is used for reliable clock generation when the power supply goes below the acceptable threshold.

However, a potential problem exists in such use of a ring oscillator: An active microprocessor will burn a fairly large current, e.g. 25 milliamps. When the microprocessor stops (in a lightly loaded system), the power supply voltage $V_{DD}$ may bounce.[12] This voltage bounce may cause the microprocessor to resume operation: In a worst-case scenario, this may happen repeatedly.

[12]The amount of voltage increase, or bounce, will depend on the power supply's source impedance. Source impedance is typically lower for higher-capacity power supplies. Source impedance also may be current-dependent.

This problem has been solved in two innovative ways:

First Solution: Use a MUX to select between the crystal oscillator and the on-chip ring oscillator, and include a latch in the MUX. This latch imposes hysteresis, which avoids the bouncing.

Second Solution: Use a counter (connected with the ring oscillator at the clock input and the crystal oscillator at the reset input) to filter the crystal oscillator's signal to provide a reliable indication of crystal oscillator failure; and: Use a timing window guardband, and a transmission gate plus latch to freeze the input, where the timing window guardband is a long enough delay to allow the frozen input condition (whatever it is) to propagate through the system.

Innovative Microboard Structure

Another innovative feature set forth herein is an innovative microboard package.

SipStik TM packages, having a similar form factor to a SIMM memory module, have been introduced by Dallas Semiconductor to package complex logic, analog, and/or telecommunications functions. In the presently preferred embodiment, a subsystem such as shown in FIGS. 1A-1, 1A-2, or 2A-1, 2A-2 is packaged in a new kind of SipStik.

SipStiks have a substantial advantage in their very low height and compact size, but sometimes it is difficult to find room for the desired pinout along one edge of such a small package.

In the presently preferred embodiment, a SipStik package is used which has SipStik connectors along both the upper and lower edges, as shown in FIG. 16. This innovative structure can be used in many ways.

In the presently preferred embodiment, an integrated subsystem as shown in FIGS. 1A-1, 1A-2, or 2A-1, 2A-2 can be used as a microprocessor or as a microcomputer. However, the pinouts desired for these two uses are not identical, and the total available pinout, with the preferred pin spacing and package dimensions, does not permit all of the signals desired for either use to be brought out. Therefore, the presently preferred embodiment provides a "mirror-image" SipStik, which can be inserted in one orientation to provide a microprocessor functionality, and can be inserted upside-down to provide microcomputer functionality.

Nonvolatized Microprocessor Module in Combination with Other Modules

A particularly advantageous system embodiment is a combination of a nonvolatized microprocessor module (such as the DS2340 described below) in combination with other modules which permit dial-up telephone access. For example, this is permitted by a DS2245 Modem Stik in combination with a DS2249 DAA Stik.)

In the presently preferred embodiment, the 16 bytes of RAM on the adjunct chip are used not only to store CRC parameters, but also are used to store a modem-present flag and a "help-me" flag. The modem-present flag is programmed at the time of system configuration to indicate to the adjunct chip's control software that, when an error condition occurs, the dial-up capability can be used as part of the error handling routine.

When the CRC logic detects an error, as shown in the flow chart of FIG. 15, it can seek help from a remote host system. The remote host can then program in successively narrower CRC boundary values, to zero in on a bad block of code. When a sufficiently small bad block of code has been identified, this code can be reloaded over the modem link without consuming a large amount of modem time. Moreover, all of this can be performed automatically, without requiring human assistance.

Power-Fail Output Signals

In the presently preferred embodiment, the softener chip now has two power-fail output signals, called V3 and V45. These signals can be propagated around a system to avoid skew in the power-down transitions on different chips.

This is useful even if other chips also have a bandgap reference on-chip: In a complex system, you do not want to have more than one bandgap operating independently: The softener would probably be the master power-fail detector and let the other nonvolatized subsystems use a power-fail input.

BRIEF DESCRIPTION OF THE DRAWING

The present invention will be described with reference to the accompanying drawings, which show important sample embodiments of the invention and which are incorporated in the specification hereof by reference, wherein:

FIGS. 2A-1 and 2A-2 show a subsystem including a microprocessor (which does not use data/address multiplexing), an adjunct chip, a battery, memory, and a timekeeper chip.

FIG. 3A-1 shows the memory map normally used in a V40 microprocessor. FIGS. 3A-2, 3A-3, 3A-4, 3A-5, and 3A-6 show how the memory map of FIG. 3A-1 is preferably modified, in control mode and in user mode, for each of five different memory allocations.

FIGS. 3B-1 through 3B-3 show memory maps and remapping for a 6303X microprocessor.

FIGS. 3C-1, 3C-2, and 3C-3 show memory maps and remapping for an Intel 80C196 microprocessor.

FIGS. 3D-1, 3D-2, and 3D-3 show memory maps and remapping for a Motorola 68HC11 microprocessor.

FIGS. 3E-1 and 3E-2 show memory maps and remapping for a Hitachi 6305X2 microprocessor.

FIGS. 4.1, 4.2, 4.3, 4.4, and 4.5 are parts of a single circuit diagram, showing the interface to one pin in the highly flexible port which is used as port A in the adjunct chip embodiments of FIGS. 1B and 2B.

FIG. 5 shows the architecture used for ports B, C, and D, in the adjunct chip embodiments of FIGS. 1B and 2B.

Figure 7:
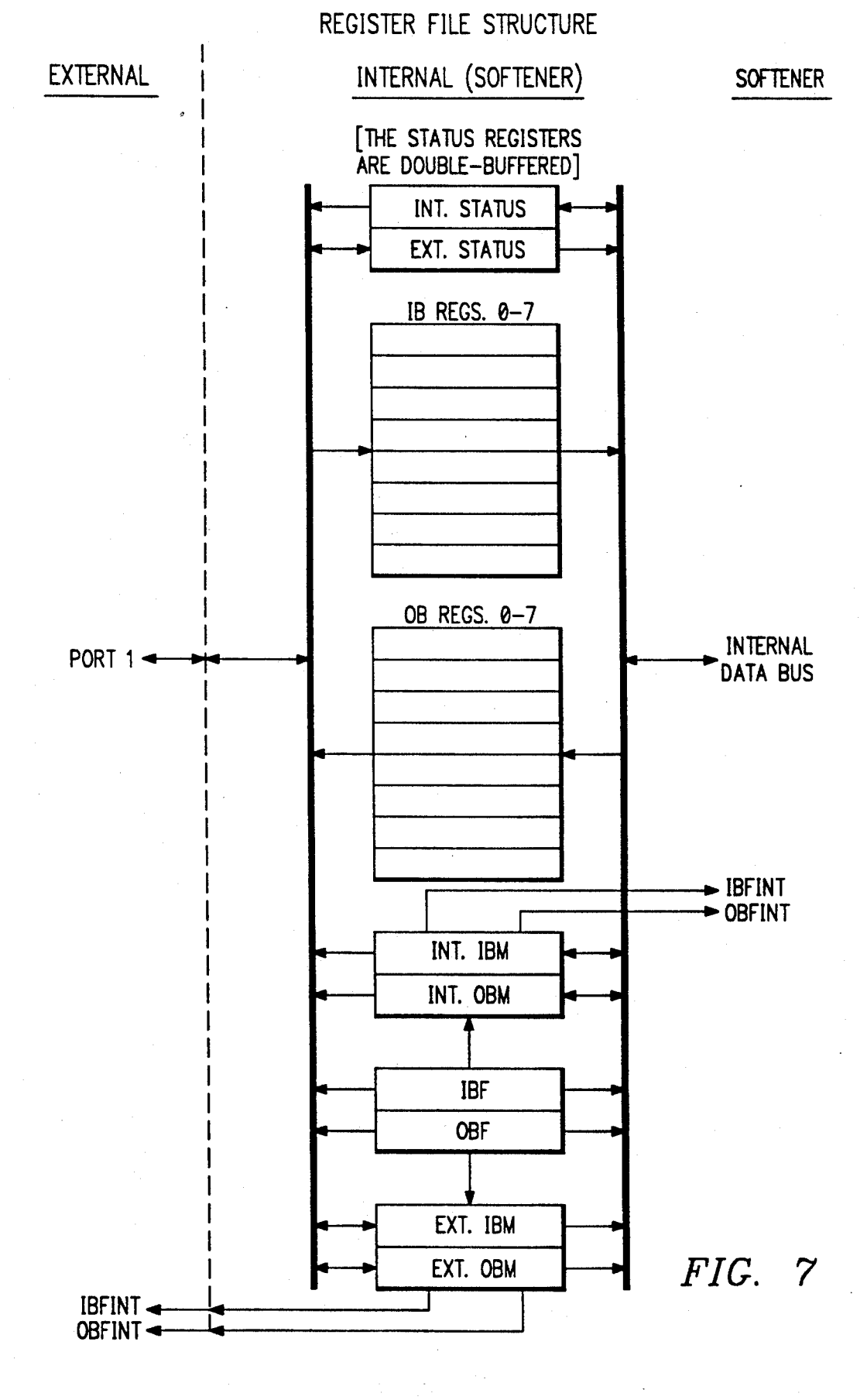

FIG. 7 shows the architecture of the Register File Structure, which provides a very flexible interface to another computer system.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

System with Microprocessor and Adjunct Chip on Micro-Board

Figures 1, 1A:
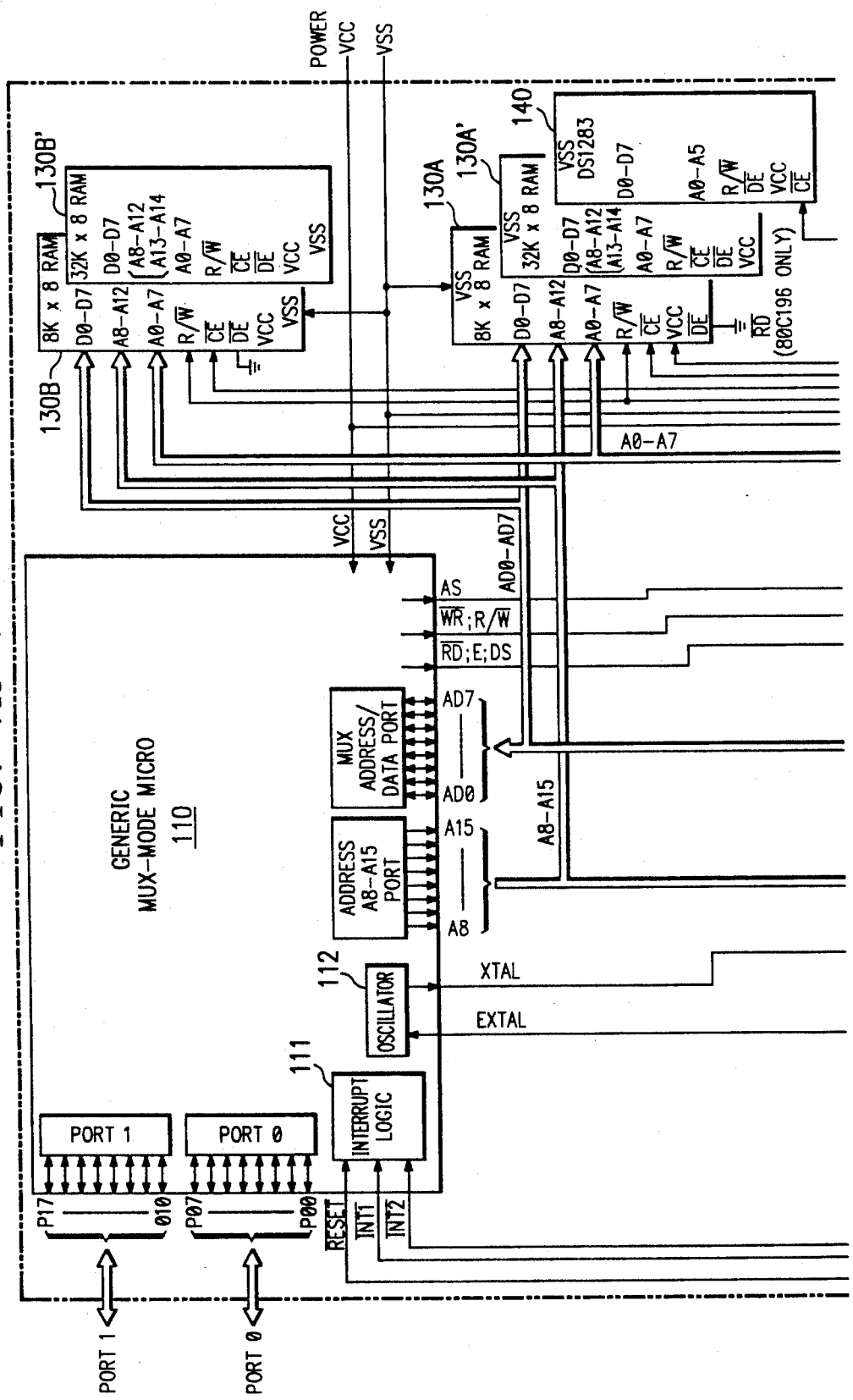
FIGS. 1A-1 and 1A-2 show a subsystem including a microprocessor (which uses data/address multiplexing), an adjunct chip, a battery, memory, and a timekeeper chip.
Figures 1, 1A, 2:
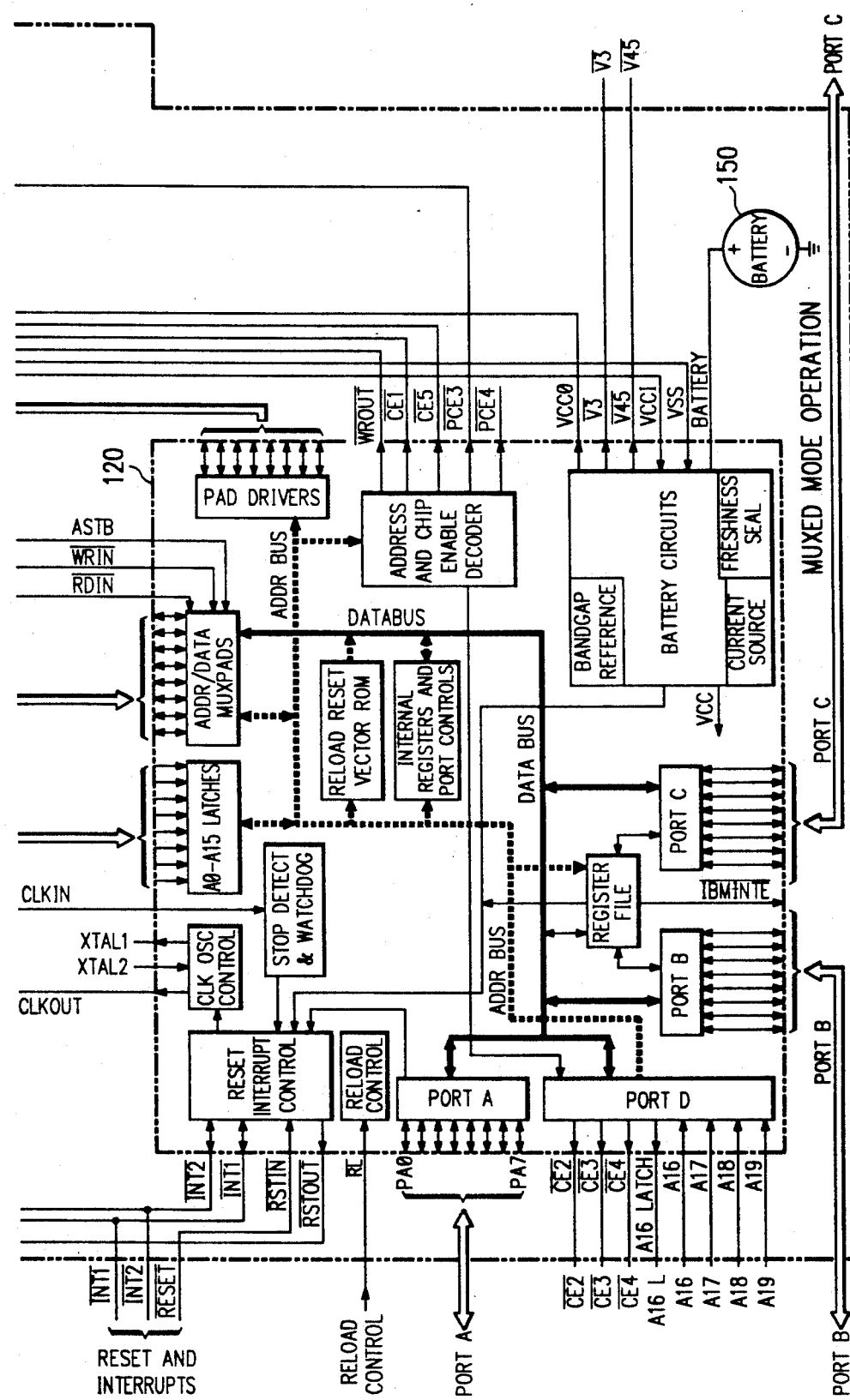

FIGS. 1A-1 and 1A-2 are an overview of a first sample system embodiment employing the disclosed innovations.

Preferably a subsystem as shown (optionally combined with additional integrated circuits, as discussed below) is integrated on a single sub-board with a single in-line mounting, as discussed in detail below.

The system shown in FIGS. 1A-1 and 1A-2 includes a microprocessor 110, SRAMs 130, an adjunct chip 120, and a battery 150 which provides a constant DC power supply to the adjunct chip 120 (which can thereby power other chips when appropriate). The system shown also includes a watchdog chip 140. In the presently preferred embodiment, this is a DS1283 clock/calendar chip, but of course other such chips could be used instead.[1]

[1] The DS1283 watchdog chip, and its data sheet, are both available from Dallas Semiconductor Corporation, and are both hereby incorporated by reference.

External Connections of the Micro-Board

The external connections of this board include, in the presently preferred embodiment:[2]

[2] In the following text, external conections of the micro-board system will generally be shown with a double underline. Off-chip connections which do not go off-board will generally be shown with a single underline. Names of register bits will generally be shown in italics. These conventions, although not rigorously followed, are intended to help avoid confusion between similarly-named signals.

An incoming RST* line;
First and second incoming interrupt lines INT1* and INT2*;
An incoming reload control signal RL*;
Power and ground inputs VCCI and V_SS; and
Power-fail-detect signals V30* and V45*, which indicate that the adjunct chip 120 has detected that the power supply is below corresponding threshold voltages;
Port 0, an 8-bit bidirectional port;
Port 1, an 8-bit bidirectional port;
Port A, an 8-pin bidirectional port;
Port B, an 8-pin bidirectional port;
Port C, an 8-pin bidirectional port;
and eight additional pins, which could be used for a Port D, but which in the presently preferred embodiment are used for
three additional chip-enable output pins CE2*, CE3*, and CE4*,
Incoming high-order bits A16 through A19, and
A status pin A16L, which is a latched version of address bit 16. (High-order address bits A16–A19 are multiplexed, and the same pins will carry status signals during the second half of each cycle. The latched A16L pin allows 128K memories to receive a full address without tracking the multiplex half-cycle timing.

On-Board Wiring

The microprocessor 110 (in this example, an NEC V40 microprocessor) has ports 1 and 0 which are connected to provide data routing as desired. This microprocessor also has a multiplexed address and data port, including lines AD0 through AD7, and eight additional address lines A8 through A15. All of these 16 lines are connected to the adjunct chip 120, which is shown in greater detail in FIG. 1B. The presently preferred embodiment of the chip 120 corresponds to the forthcoming integrated circuit assigned to Dallas Semiconductor part number DS5340, but of course chips under this part number may subsequently be modified so that they depart from the description herein. However, the description herein provides the preferred embodiment of making and using the invention as of the time of filing this application. Of course, the innovative concepts shown in the examples herein can readily be adapted to a wide variety of other embodiments.

Note that the 16 lines AD0 through AD7 and A8 through A15 are also connected to random access memories 130A and 130B. Note that two alternative versions are shown: instead of the 8K×8 SRAMs 130A and 130B, 32K×8 SRAMs 130A' and 130B' may be used instead. Note that the low-order address bits A0 through A7 are provided to the memories 130 from the adjunct chip 120.

Other connections to the microprocessor 110 include the following:

The interrupt logic 111 is connected to receive both of the interrupts INT1* and INT2*. In addition, the interrupt logic 111 is connected to receive a reset signal. However, note that this reset signal is not the same as the reset signal RST* which is externally received: The externally received reset signal is connected to the adjunct chip 120, and the adjunct chip 120 provides an RSTOUT* signal which is connected to the reset input of the microprocessor.

In addition, the microprocessor also includes an oscillator 112. The XTAL and EXTAL connections of this oscillator, which would normally simply be connected to a discrete crystal, are instead connected to clock terminals CLKIN and CLKOUT of the chip 120. The adjunct chip 120 includes two crystal connections XTAL1 and XTAL2, which are preferably connected to a crystal, not shown.

The microprocessor 110 also includes a line RD* (which, depending on the microprocessor manufacturer, may also be referred to as a signal E or a signal DS) which is connected to an input RDIN* of the adjunct chip 120.

The microprocessor 110 also includes a WR* signal, which is connected to a WRIN* input of the adjunct chip 120. The microprocessor also may include an address strobe output AS, which is connected to input AST* of the adjunct chip 120.

In addition to the signals already noted, the adjunct chip 120 provides a write-enable output signal WROUT*, which is connected to the write-enable inputs of memory chips 130. In this embodiment, the adjunct chip 120 also contains two more chip-enable outputs CE1* and CE5*, which are respectively connected to the memory chips 130A and 130B (or 130A' and 130B'). Two additonal peripheral chip-enable outputs PCE3* and PCE4* are also provided. Note that, in the configuration shown, signal PCE3* is connected to the chip-enable input of the watchdog 140. These PCE outputs can be used to selectively activate other peripheral chips, such as an RF interface, or can optionally be led to an external connection for control of other portions of the system.

The adjunct chip 120 also provides address line outputs A0 through A7, and receives a battery input voltage VBAT. Ports B and C are led directly off-chip. In addition, an IBMINTE* output is also provided, as will be described below.

Option for Address/Data Multiplexing

Figures 1, 2A:
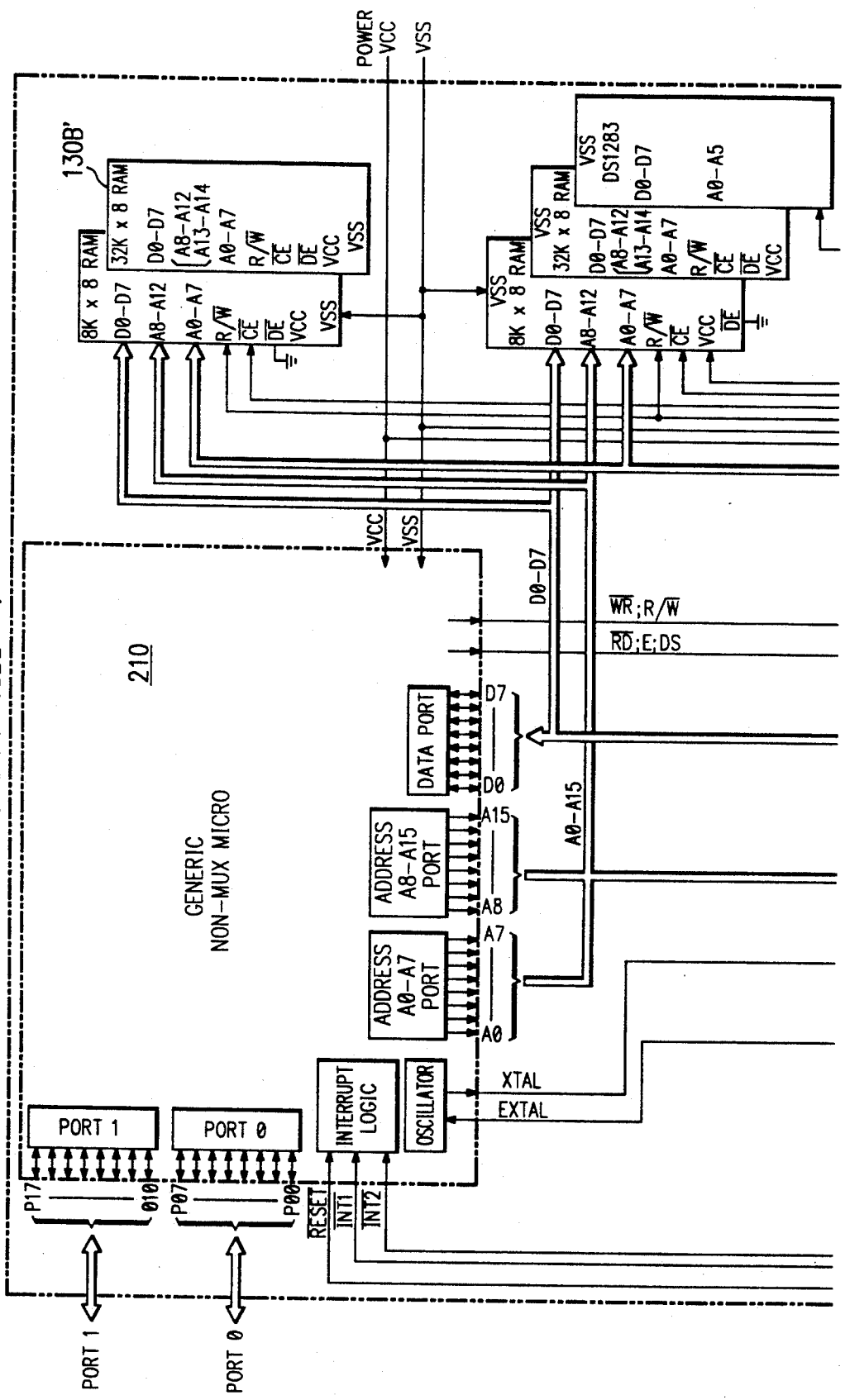

FIG. 2A shows another sample system configuration, using a microprocessor 210 which does not multiplex data with addresses. The overall configuration of this system is generally similar to that of FIG. 1A, but there are some differences which should be noted. The adjunct chip 220 preferably used in such a system is slightly different from the adjunct chip 120, as shown in detail in FIG. 2B.

Figure 1B:
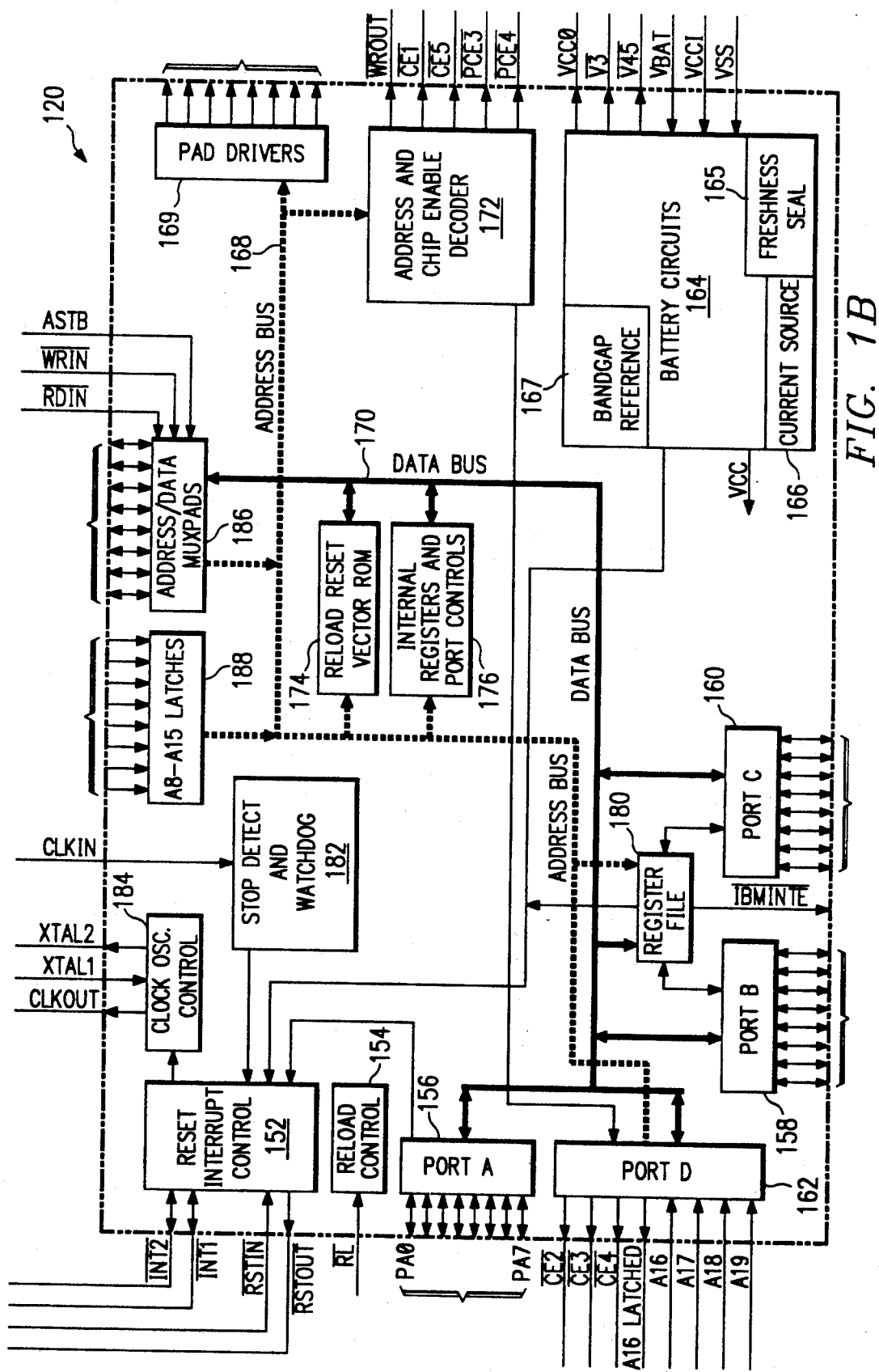
FIG. 1B shows an adjunct chip suitable for use with a microprocessor which uses data/address multiplexing.
Figure 2B:
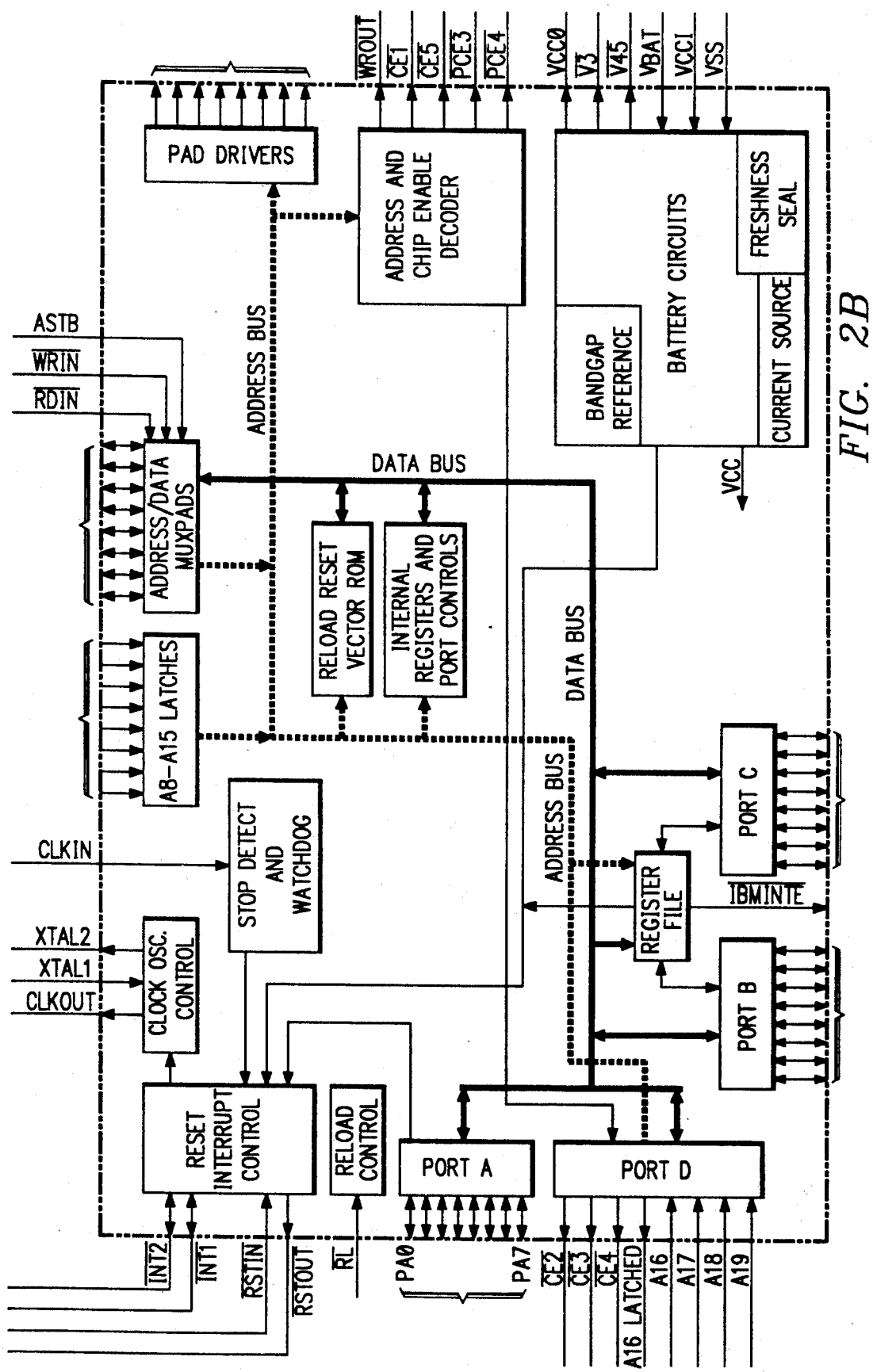
FIG. 2B shows an adjunct chip suitable for use with a microprocessor which does not use data/address multiplexing.

FIG. 2B may be seen to generally be similar to FIG. 1B. In general, corresponding elements have been given the same number. However, note that buffer 269 is an 8-bit-wide address input register, whereas buffer 169 is an 8-bit-wide address output register. Also note that the Port D interface 262 is now used for a full 8-bit bidirectional port, whereas in the example of FIG. 1B this port was used for additional data and control lines. Of course, the data lines at this port can stil be used, if desired, to carry comparable control and status information.

In the example shown, the adjunct chip 220 is the integrated circuit which is commercially available under part number DS5303 from Dallas Semiconductor Corporation. However, of course, the commercially available integrated circuit may be changed over time, and the description set forth herein defines the presently preferred embodiment as of the time of filing the present application.

Microprocessor Program Execution: User Mode

The normal mode of program execution is essentially the same as would be used in a system without an adjunct chip. (Accordingly, application programs do not have to be modified.)

Microprocessor Operation: Sleep Mode

Many CMOS microprocessors have a sleep mode, where the processor will consume minimum standby power when no computation is needed. The disclosed adjunct chip architecture permits this sleep mode to be exploited as well as if the microprocessor were in a standalone configuration.

Microprocessor Program Execution: Control Mode

When the microprocessor is operating in control mode, the softener redirects addresses as follows: when the microprocessor tries to access an initial address in program RAM, the adjunct chip revectors this access so that the microprocessor is reading out (and executing) the start-up code which is stored in the adjunct chip's ROM.

In the presently preferred embodiment, the code contained in ROM is used for two major functions:

Reloading the target microprocessor's program memory;

Performing CRC check operations on the target microprocessor's program memory.

The adjunct chip also includes 16 bytes of internal RAM which are only accessible by the control software, not by the user software. In the presently preferred embodiment, this RAM is further protected by timed-access relationships. These bytes are used to store the high and low boundaries for Entering Control-Software Execution The adjunct chip provides both software and hardware avenues to enter execution of the control software. In the presently preferred embodiment, execution of control software can be started in the following ways:

If a watchdog interrupt occurs while bit CRC is high;
If a watchdog interrupt occurs while bit IRL is active (i.e. pin RL* is low);
If a power-on reset occurs while bit IRL is active;
If a negative edge occurs on the RL* pin;
If the ROM bit is set (by software).

At every entry into the control software, a branch to control or reloading routines is made. Bit CRC indicates whether the CRC routines are to be executed.

Figure 15:
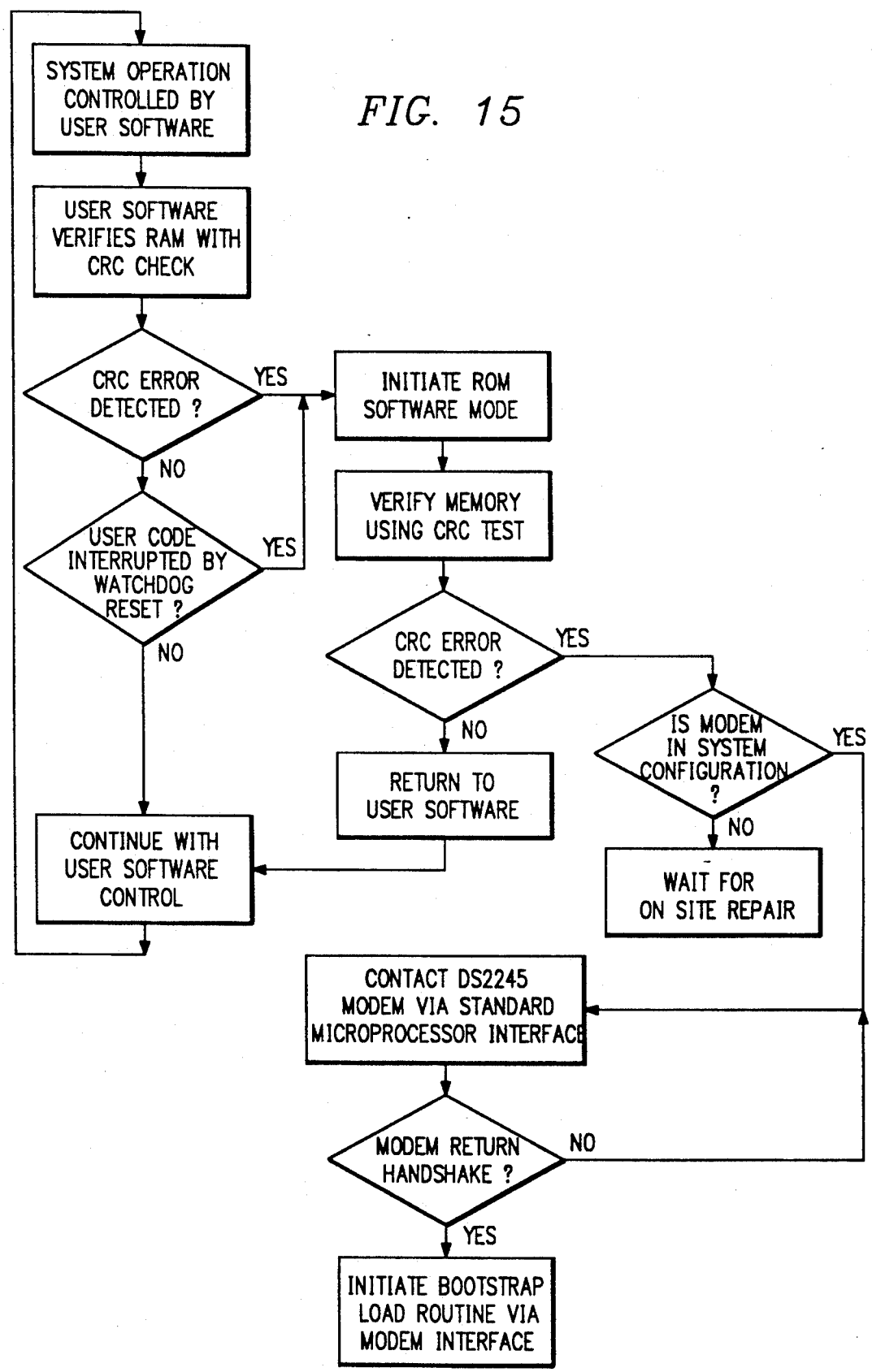
FIG. 15 schematically shows the branches used, within the control software, to run control or reloading routines. The particular example shown is adapted for use with a subsystem like that shown in FIG. 16, wherein a microprocessor and an adjunct peripheral chip are combined with a modem and a DAA subsystem.

FIG. 15 is a schematic flow chart which shows generally the program flow in the control-software routines.

Control-Software Routines: CRC

In the presently preferred embodiment, the ROM memory in the adjunct chip can be accessed when the microprocessor powers up, and a CRC check then run on the user program, in external RAM.

In the presently preferred embodiment, the adjunct chip itself contains hardware for generating the Cyclic Redundancy Check (CRC) check value. The microprocessor merely has to read out the data values in the range to be checked, and push them successively into a register address. The softener hardware captures writes to this address, and loads the stream of values into its CRC hardware. The microprocessor can fetch the computed CRC value by simply reading another "register," at a register address which is remapped into the softener. Thus, the microprocessor never has to do the multiplies necessary for CRC computation: it simply performs a series of register writes, a 16-bit register read, and a compare operation. This speeds up CRC generation, and allows system software designers to use CRC checking more readily.

The arguments for CRC check operations include high- and low-address boundaries, which are kept in the adjunct chip's on-chip RAM. (This RAM is only accessible when the microprocessor is executing code from ROM.) Thus, when a CRC operation is initiated, the designated block of memory will be processed to generate a CRC redundancy check value.

Control-Software Routines: Reloading

An important control operation, performed under the control of adjunct chip ROM code, is reloading the RAM code which will be executed by the target microprocessor. This prevents any possibility of the target microprocessor reaching a "stuck" condition due to corruption of the RAM code.

One of the ways to initiate such a program reload is by means of the RL* input signal. The RL* input, which is used to control reloads, is not purely a logic level.

A reload command causes a reset, which then branches into the adjunct chip's ROM address space. When execution of the control software is completed, the adjunct chip will again reset the target microprocessor, and execution can then begin in the user's program memory.

Source Code

The following source code is provide to better illustrate the actual assembly-language source code used, in the preferred embodiment as presently practiced. Of course, it must be understood that a great variety of modifications and variations are possible. It should also be understood that the code given below is not necessarily unchangeable, but is likely to be varied as problems or possible improvements are noted.

chip's ROM address space. When execution of the control software is completed, the adjunct chip will again reset the target microprocessor, and execution can then begin in the user's program memory.

Source Code

The following source code is provided to better illustrate the actual assembly-language source code used, in the preferred embodiment as presently practiced. Of course, it must be understood that a great variety of modifications and variations are possible. It should also be understood that the code given below is not necessarily unchangeable, but is likely to be varied as problems or possible improvements are noted.

```
;----------------------------------------------------------------
;       DS5340 Serial Loader.
;       January 1990
;       Dallas Semiconductor
;----------------------------------------------------------------
        .186

;DOS      =     1                  ; Assembles DOS equivalents(?)
;PROTO    =     1                  ; Assembles prototype diagnostics
;COUNT    =     1                  ; Count loop in CRC calcs
;EXIT_ROM=      1                  ; Print out message when a 1
REFRESH   =     1                  ; Enable V40 Refesh UARTBASE       equ    02f8h        ; DS2245, IRQ3, DSR=0->DataOK, CTS
;UARTBASE      equ    01e0h        ; Prototype DS2245
;UARTBASE      equ    020h         ; Prototype 8250, igonre DSR, CTS Swch
;USE_IRQ4      =      1            ; Use 8250 at irq4, for uart base 20h ;----------------------------------------------------------------
;       constants
;----------------------------------------------------------------
CTRLC   equ    03h                 ; control C. reset
CR      equ    0dh                 ; carriage return
LF      equ    0ah                 ; line feed
BS      equ    08h                 ; back space
DEL     equ    07fh                ; delete char
SPA     equ    020h                ; space character
TAB     equ    09h                 ; tab
XON     equ    011h                ; DC1, ^Q, continue transmission...
XOFF    equ    013h                ; DC3, ^S, stop transmission...

OPCN    equ    0fffeh              ; on chip peripheral connection reg
OPSEL   equ    0fffdh              ; on chip peripheral selection
OPHA    equ    0fffch              ; high address selection
DULA    equ    0fffbh              ; DMA lc.. address
IULA    equ    0fffah              ; Interrupt Control low address
TULA    equ    0fff9h              ; Timer Control low address
SULA    equ    0fff8h              ; Serial Control low address
WCY2    equ    0fff6h              ; Wait Cycle 2 Register
WCY1    equ    0fff5h              ; Wait Cycle 1 Register
```

```
WMB         equ     0fff4h              ; Wait State Memory Boundary Register
RFC         equ     0fff2h              ; Refresh Control Register
TCKS        equ     0fff0h              ; Timer Clock Selection HIBASE      equ     0                   ; high byte of all base addresses
SCUBASE     equ     0                   ; base of serial control unit
SBUF        equ     SCUBASE+0           ; read/write buffer
SST         equ     SCUBASE+1           ; serial status register
SCM         equ     SCUBASE+1           ; serial command register
SMD         equ     SCUBASE+2           ; serial mode register
SIMK        equ     SCUBASE+3           ; serial interrupt mask register TCUBASE     equ     4                   ; base of timer control unit
TCT0        equ     TCUBASE+0           ; timer/counter 0
TCT1        equ     TCUBASE+1           ; timer/counter 1 (For Baud Rate)
TCT2        equ     TCUBASE+2           ; timer/counter 2
TMD         equ     TCUBASE+3           ; timer mode register ICUBASE     equ     8                   ; base of interrupt control unit
IRR         equ     ICUBASE+0           ; interrupt request register
ISR         equ     ICUBASE+0           ; interrupt service register
IMR         equ     ICUBASE+1           ; interrupt mask register DMABASE     equ     010h                ; base of DMA control unit
DICM        equ     DMABASE+0           ; initialize command register
DDC         equ     DMABASE+8           ; device control registers
DST         equ     DMABASE+0bh         ; status register
DMK         equ     DMABASE+0fh         ; mask register BUFSIZ      equ     20h                 ; serial input buffer, must be 2^N
BUFMSK      equ     BUFSIZ-1            ; 0..(2^N)-1
CMDSIZ      equ     25                  ; size of cmdlin buffer ;------------------------------------------------------------------
;       Modem registers names with UARTBASE
;------------------------------------------------------------------
RBR             equ     UARTBASE+0
IER             equ     UARTBASE+1
IIR             equ     UARTBASE+2
LCR             equ     UARTBASE+3
MCR             equ     UARTBASE+4
LSR             equ     UARTBASE+5
MSR             equ     UARTBASE+6

;------------------------------------------------------------------
;       data structures in ram
;------------------------------------------------------------------
ram     segment para public 'DATA'

FIRST_WORD      equ     040h            ; First word of user supplied ram
LAST_WORD       equ     0EEh            ; Last word of user supplied ram Softener:
```

```
softreg   db    010h dup ('R')      ; filler from front tareg     db    0                   ; timed access register
ptreg     db    0                   ; port interrupt mask register
mcreg     db    0                   ; memory control register
wdreg     db    7                   ; watch dog register
moreg     db    0ffh                ; modes register
poreg     db    0                   ; power register
rireg     db    0ffh                ; reset and interrupt register pa_regs   db    8 dup ('A')         ; port 0 registers
pb_regs   db    5 dup ('B')         ; port 1 registers
pc_regs   db    5 dup ('C')         ; port 2 registers
pd_regs   db    5 dup ('D')         ; port 3 registers crc_reg:
crc_lo    db    0,0                 ; Hardware CRC registers ;
; Internal Softner Ram begins here. (Absolute address FFF30)
;
begin_adr_1   dw    ?               ; crc beginning address offset
end_adr_1     dw    ?               ; crc ending address offset
crc_1         dw    ?               ; crc value for this range
segments_1    db    ?               ; high nibble is ending section begin_adr_2   dw    ?               ; crc beginning address offset
end_adr_2     dw    ?               ; crc ending address offset
crc_2         dw    ?               ; crc value for this range
segments_2    db    ?               ; low nibble is beginning section flags         dw    ?               ; static flags register
CRC1BIT       equ   1               ; Valid range 1 exists
CRC2BIT       equ   2               ; Valid range 2 exists
MODEMBIT      equ   4               ; Modem is available at 2f8, irq3
BADCRCBIT     equ   8               ; Bad CRC detected on load
USE_MODEM     equ   10h             ; When set, i/o is to modem
FLAG_BIT_6    equ   20h             ; Unused flag bits
FLAG_BIT_7    equ   40h             ;
FLAG_BIT_8    equ   80h             ;
FLAG_BIT_9    equ   100h            ;
FLAG_BIT_10   equ   200h            ;
FLAG_BIT_11   equ   400h            ;
FLAG_BIT_12   equ   800h            ;
FLAG_BIT_13   equ   1000h           ;
FLAG_BIT_14   equ   2000h           ;
FLAG_BIT_15   equ   4000h           ;
FLAG_BIT_16   equ   8000h           ;
;
; User Supplied Ram begins here. (Absolute address FFF40)
;
clr_ram:                            ; address to start clearing from
```

```
bseg     dw    0                          ; beginning segment - optional
boff     dw    0                          ; beginning offset  - optional
eseg     dw    0                          ; ending segment    - optional
eoff     dw    0                          ; ending offset     - optional
tmp      dw    0                          ;

xmoff    db    0                          ; 1 when XON is set 0 when XOFF
togflg   db    0                          ; word indicating trace mode
fbyte    db    0                          ; byte to be used when filling
nextch   db    0                          ; next char in input buffer goes here
nchs     db    0                          ; number of bytes in input buffer buffer   db    BUFSIZ dup ('B')           ; serial input buffer
cmdln    db    CMDSIZ dup ('C')           ; the command line buffer stk_end  db    240 - ($ - Softener) dup ('S')  ;
stk_beg:

reset:   jmp   far ptr main               ; reset code ram      ends rom      segment 'CODE'
         assume ds:rom, cs:rom, es:NOTHING, ss:ram ;----------------------------------------------------------------------
;        Interrupt Vectors
;----------------------------------------------------------------------
vector_0:                                 ; divide by 0 error
         dd    far ptr do_nothing_service
vector_1:                                 ; BRK, single step flag
         dd    far ptr do_nothing_service
vector_2:                                 ; NMI, Non Maskable Interrupt
         dd    far ptr NMI_service
vector_3:                                 ; Breakpoint
         dd    far ptr do_nothing_service
vector_4:                                 ; INTO: interrupt on overflow
         dd    far ptr do_nothing_service
vector_5:                                 ; Array Bounds Exception
         dd    far ptr do_nothing_service
vector_6:                                 ; Undefined Opcodes Exception
         dd    far ptr do_nothing_service
vector_7:                                 ; ESC Opcodes
         dd    far ptr do_nothing_service
interrupt_0:                              ; Timer Control Unit Interrupt
         dd    far ptr watch_dog_service
interrupt_1:                              ; Serial Control Unit Interrupt
         dd    far ptr SCU_service
interrupt_2:                              ;
         dd    0
interrupt_3:                              ; 8250 interrupt? IRQ3
         dd    far ptr ACE_8250_service
interrupt_4:                              ;
```

```
IFDEF   USE_IRQ4                        ; only if not using DS2245 on proto
        dd      far ptr ACE_8250_service
ELSE
        dd      0
ENDIF
interrupt_5:                            ;
        dd      0
interrupt_6:                            ;
        dd      0
interrupt_7:                            ;
        dd      0

;------------------------------------------------------------------------
        proc    main near
;       - init the stack and bp registers,
;       - open DS2219 DRAM controller
;       - init the V40 registers
;       - check for ram available in stack
;       - do the power up tests
;           do the CRC test if necessary
;       - do autobaud detect or establish modem control
;       - process input commands forever
;
;       subroutines: rom_exit, puts, get_cmdln, get_cmdln_pch, startup_crc
;                   and a generic call [bx] using cmd_table.
;------------------------------------------------------------------------
        cli                             ; disable interrupts mov     ax,seg ram              ; ss starts with ram seg
        mov     ss,ax
        mov     sp,offset reset         ; pushes always increment first
        xor     bp,bp                   ; ram base mov     [bp+tareg],0aah         ; begin timed access, ints disabled
        mov     [bp+tareg],055h         ; end timed access
        or      [bp+rireg],80h          ; reset watch dog mul     bl                      ; waste time before next TA
        and     [bp+poreg],7fh          ; make sure CESL is clear mov     [bp+tareg],0aah         ; begin timed access, ints disabled
        mov     [bp+tareg],055h         ; end timed access
                                        ; clear badcrcbit and use_modem bits
        and     [bp+flags],not (BADCRCBIT or USE_MODEM)

IFDEF   PROTO
        mov     dx,0160h                ; reset the watchdog timer
        mov     al,0ffh                 ;
        out     dx,al                   ;
ENDIF IFNDEF  DOS
;------------------------------------------------------------------------
```

;       V40 Initialization
;       - put SCU at 0, TCU at 4, ICU at 8, DMA at 10h.
;       - Set memory to use no wait states.
;       - Enable Refresh control to MAX.
;       - Set the internal clock to use a prescale of 2.
;       - Init the ICU to be edge triggered, single mode starting at base 8.
;       - Enable interrupts on IRQ0 (timer 0)
;       - Set timer 0 to mode 0, binary and to down from ff00.
;----------------------------------------------------------------

```
        mov     dx,OPCN         ; Pin Function Selection
        mov     al,0            ; intp1, inptp2, dmarq3, dmaak3, intak
        out     dx,al           ;

mov     dx,OPSEL        ; Peripheral Select Register
        mov     al,07h          ; enable TCU, ICU, DMAU not SCU
        out     dx,al           ;

mov     dx,OPHA         ; Control Units High Byte Address
        mov     al,HIBASE       ;
        out     dx,al           ;

mov     dx,DULA         ; DMA Unit Lower Byte
        mov     al,DMABASE      ;
        out     dx,al           ;

mov     dx,IULA         ; Interrupt Unit Lower Byte
        mov     al,ICUBASE      ;
        out     dx,al           ;

mov     dx,TULA         ; Timer Unit Lower Byte
        mov     al,TCUBASE      ;
        out     dx,al           ;

mov     dx,SULA         ; Serial Unit Lower Byte
        mov     al,SCUBASE      ;
        out     dx,al           ;

mov     dx,WCY2         ; Refresh and DMA wait states to
        mov     al,0            ; NO=0
        out     dx,al           ;

mov     dx,WCY1         ; Lower, Middle, Upper and IO to
        mov     al,0            ; NO=0 wait states
        out     dx,al           ;

mov     dx,WMB          ; Wait State Memory Boundaries
        mov     al,0            ; all memory
        out     dx,al           ;
        mov     dx,RFC          ; Refresh Control Register
IFDEF   REFRESH
        mov     al,0ffh         ; enable to max
ELSE
        mov     al,0
```

ENDIF
```
        out     dx,al                   ;

mov     dx,TCKS                 ; Set all clocks to use internal clock
        mov     al,0                    ; and use a prescale of 2
        out     dx,al                   ;

;
; init the ICU for vector 8, timer only
;
        mov     al,12h                  ; edge triggered, single mode
        out     IRR,al                  ;

mov     al,8                    ; start at base 8
        out     IMR,al                  ;

mov     al,0feh                 ; timer0 (WD) only now
        out     IMR,al                  ;

;
; set up timer 0 as the interrupt driven watchdog timer
;
        mov     al,020h                 ; Set timer 0 to
        out     TMD,al                  ; mode 0, binary mov     al,0ffh                 ; ff00 counts
        out     TCT0,al                 ;
ENDIF
```

;----------------------------------------------------------------------
;       DS2219 DRAM SipStick Initialization
;       - All we do is read from the appropriate addresses.  It
;         is believed at this time that the following addresses are
;         available (RAS: a0-a7 a8 a18), (CAS: a9-a16 a17 a19)
;         The 2219 is looking at pins p5 p6 p7 during CAS, so this code
;         sends out the 'open' with the segment carring the data and the
;         offset set to zero.
;----------------------------------------------------------------------
```
        mov     bx,offset DS2219_init   ; open the DS2219 DRAM Sipstick
        mov     cx,24                   ; 24 address to init (open)
        xor     ax,ax                   ; clear lower segment - al must stay 0
dram_init:
        mov     ah,cs:[bx]              ; get upper part of segment
        mov     ds,ax                   ; save off as a segment
        mov     dh,ds:[bp]              ; 'phantom' read - bp must equal 0
        inc     bx                      ; ... to next init byte
        loop    dram_init               ; for each one mov     ax,cs                   ; restore data segment
        mov     ds,ax                   ;
```

;----------------------------------------------------------------------
;       Ram Check

```
;       - write words out to each end of 'stack' ram, read them back
;         and see if they are the same.  If not, run in a tight loop
;         forever, hitting the watch dog.
;-------------------------------------------------------------------
        mov     [bp+FIRST_WORD],012abh  ; make sure user supplied ram is
        mov     [bp+LAST_WORD],0CD34h   ; there by writing values out and
        mov     ax,[bp+FIRST_WORD]      ; then reading them back.
        cmp     ax,012abh               ; if equal then thats great.
        jne     no_memory               ; otherwise, death!
        mov     ax,[bp+LAST_WORD]       ; is the second word okay?
        cmp     ax,0CD34h               ;
        je      power_up_test           ; jump if it is
no_memory:
        mov     [bp+tareg],0aah         ; begin timed access
        mov     [bp+tareg],055h         ; end timed access
        or      [bp+rireg],80h          ; reset watch dog
        mul     bl                      ; waste time before next TA
        jmp     short no_memory         ; do it forever ;-------------------------------------------------------------------
;       Power up tests - Check the following in order.
;        - CRC IRL ROM WDS PUP
;       1: 1   0   0   0   1  Return to User Code.
;       2: 0   0   0   X   X  Return to User Code.
;       3: 0   X   X   X   X  Run Loader.
;       4: 1   1   X   X   X  Run Loader.
;       5: 1   0   X   X   X  Execute CRC check.
;-------------------------------------------------------------------
power_up_test:
        mov     al,[bp+rireg]           ;       get WDS    and PUP    bits
        and     al,50h                  ; save only RIST.6 and RIST.4
        mov     ah,[bp+moreg]           ;       get IRL    and ROM    bit
        and     ah,3                    ; save only MODE.1 and MODE.0
        or      al,ah                   ; combine these four bits
        mov     ah,[bp+wdreg]           ; get the CRC bit, WDOG.0
        ror     ah,1                    ; now it is in bit 7
        and     ah,80h                  ; save only it
        or      al,ah                   ; CRC.7,WDOG.6,5,PUP.4,3,2,IRL.1,ROM.0 cmp     al,90h                  ;
        je      ret_to_user             ; shouldn't be here, get out of ROM test    al,83h                  ; looking only at CRC,IRL and ROM
        jz      ret_to_user             ; get out of ROM test    al,80h                  ; is crc clear?
        jz      init_modem              ;  yep, get into load mode and     al,82h                  ; look at CRC and IRL
        cmp     al,82h                  ; are they both set?
        je      init_modem              ;  yep, get into load mode
```

```
        cmp     al,80h                  ; is CRC set and IRL clr?
        jne     init_modem              ; no, go on to loader ;----------------------------------------------------------------
;       Do the power on CRC tests
;       - Check the crc flags and to see if any ranges are specified.
;       - Notice that the last thing startup_crc does is a compare of
;         the old and the new value; the test is done here.
;       - It is ASSUMED that the specified ranges are good!
;       - Changing from mode 0 to another mode, or another mode to
;         mode 0 may screw up crc values.  N_ precautions are taken.
;----------------------------------------------------------------
        test    [bp+flags],CRC1BIT      ; are we suppose to check crc1?
        jz      ret_to_user             ; nope.
        mov     si,offset begin_adr_1   ; go do the first crc
        call    startup_crc             ;
        jne     set_badcrc              ; didn't compare!

test    [bp+flags],CRC2BIT      ; are we suppose to check crc2?
        jz      ret_to_user             ; nope.
        mov     ,offset begin_adr_2     ; go do the second crc
        call    startup_crc             ;
        jne     set_badcrc              ; didn't compare!
                                        ; did compare, fall through.
;----------------------------------------------------------------
;       Return to User Code - Power up tests say we shouldn't be here.
;----------------------------------------------------------------
ret_to_user:
        call    rom_exit                ; good bye
        jmp     init_modem              ; just in case rom_exit fails ;----------------------------------------------------------------
;       CRC failed, set the bit so we can inform the user and call
;       for help.  In any case, stay in rom.
;----------------------------------------------------------------
set_badcrc:
        mov     [bp+tareg],0aah         ; begin timed access, ints disabled
        mov     [bp+tareg],055h         ; end timed access
        or      [bp+flags],BADCRCBIT    ; bad crc detected, for banner and help ;----------------------------------------------------------------
;       If we got a modem, init it.  If we need to call for help do it.
;----------------------------------------------------------------
init_modem:
        test    [bp+flags],MODEMBIT     ; we got a modem connected?
        jz      auto_baud               ; nope, just do autobaud mov     dx,LCR                  ; LCR
        mov     al,083h                 ; set DLAB bit
        out     dx,al                   ;

mov     dx,RBR                  ; LSB when DLAB=1
        mov     al,0ch                  ; reload for 9600 baud with 1.8432MHz
```

```
        out     dx,al                   ;
        inc     dx                      ; MSB when DLAB=1
        xor     ax,ax                   ; zero the high part of divisor
        out     dx,al                   ;

mov     dx,LCR                  ; LCR
        mov     al,3                    ; DLAB=0,BrkOff,NoParity,1 Stop,8 Data
        out     dx,al                   ;

mov     dx,IER                  ; IER
        mov     al,1                    ; interrupt on data available
        out     dx,al                   ;

test    [bp+flags],BADCRCBIT    ; did we get a bad crc?
        jz      init_modem_0            ; nope ;-----------------------------------------------------------------
;       Call for HELP:  Put DS2245 in Loader (set out1),
;                       Clear Softner pa_regs.0
;                       Run DS2245 (clear out1)
;-----------------------------------------------------------------
        mov     dx,LSR                  ; LSR
init_till_empty:
        in      al,dx                   ; wait till the xmit shift register
        and     al,60h                  ; and the xmit holding register are
        cmp     al,60h                  ; empty.
        jne     init_till_empty         ;   not empty yet!

mov     dx,MCR                  ; MCR
        mov     al,0fh                  ; out2=1, out1=1, RTS, DTR
        out     dx,al                   ; calling for help
        mov     [bp+pa_regs],0feh       ; clear bit 0 (Hey modem, we are in ROM)

init_modem_0:
        mov     dx,MCR                  ; MCR
        mov     al,0bh                  ; out2=1, out1=0, RTS, DTR
        out     dx,al
        mov     [bp+pa_regs],0feh       ; clear bit 0 (Hey modem, we are in ROM)

mov     dx,RBR                  ; Recieve Buffer
        in      al,dx                   ; clear possible int on 8250

IFDEF   USE_IRQ4
        mov     al,0eeh                 ; timer0 and 8250 (irq0, irq4)
ELSE
        mov     al,0f6h                 ; timer0 and 8250 (irq0, irq3)
ENDIF
        out     IMR,al                  ;
;-----------------------------------------------------------------
;       Do Autobaud detect
;        - Simply look for a start bit, then see if the remaining
;          bits would match an incoming carriage return.  If they
;          do, then we probably have found the correct baud rate.
```

```
;       - Notice that interrupts are enabled in order to let the
;         watch dog timer to run.  In practice, the watchdog doesn't
;         messup this routine very often.
;------------------------------------------------------------------
auto_baud:
        sti                             ; enable timer interrupt
IFNDEF  DOS
        mov     bx,offset ab_table      ;
        xor     cx,cx                   ;
        mov     dx,DST                  ; RX pin
        mov     ah,80h                  ; pin mask
wait_till_idle:                         ; wait till RS232 goes high
        in      al,dx                   ; get pin status
        and     al,ah                   ; mask pin
        jz      wait_till_idle          ; jmp if still low (as in BREAK)
idle:                                   ; RS232 is in a high state
        in      al,dx                   ; get pin status
        and     al,ah                   ; mask pin
        jnz     idle                    ; jmp if still high
measure_start_bit:
        in      al,dx                   ; get pin status
        and     al,ah                   ; mask pin
        loopz   measure_start_bit       ; loop while low
bit_lookup:
        mov     ax,[bx]                 ; get table entry
        cmp     cx,ax                   ; is it greater?
        jae     bit_init                ;   yep
        add     bx,8                    ; point to next entry
        jmp     bit_lookup              ;
bit_init:
        mov     di,[bx+2]               ; reload value to timer
        mov     si,[bx+4]               ; bit delay time
        mov     cx,[bx+6]               ; bit 0 delay time
        mov     bx,8                    ; sample 8
bit_0:
        in      al,dx                   ; get bit
        loop    bit_0                   ; sample bit 0
        jmp     bit_record              ; record sampled value
bit_sample:
        mov     cx,si                   ; get delay value
bit_wait:
        in      al,dx                   ; get bit
        loop    bit_wait                ; while we still have to sample
bit_record:
        rcl     al,1                    ; put it into carry
        rcr     ah,1                    ; and save it into ah
        dec     bx                      ; sample next bit
        jnz     bit_sample              ; if not zero, do next bit cmp     ah,086h                 ; did we get the expected value?
        jne     auto_baud               ;   nope
ENDIF
```

```
;----------------------------------------------------------------------
;       Redefine the V40 now that autobaud is done
;       - disable the DMA unit
;       - convert the rx,tx pins back to there normal functinons
;       - set timer 1 to the appropriate reload value
;       - initialize the serial control unit
;----------------------------------------------------------------------
        cli                             ; disable interrupts for a moment
IFNDEF  DOS
        mov     dx,OPCN                 ; Pin Function Selection
        mov     al,7                    ; scu intp2, rx, tx, srdy
        out     dx,al                   ;

mov     dx,OPSEL                ; Peripheral Select Register
        mov     al,0eh                  ; enable SCU, TCU, ICU, not DMAU
        out     dx,al                   ;
        ;
        ; set up timer 1 as a reload 1 timer
        ;
        mov     al,076h                 ; Set timer 1 to
        out     TMD,al                  ; SQ WAVE, Lo followed by Hi mov     ax,di                   ; get timer value
        out     TCT1,al                 ; Low byte mov     al,ah                   ;
        out     TCT1,al                 ; High byte
        ;
        ; set up the serial control unit
        ;
        in      al,IMR                  ; get current mask
        and     al,0fdh                 ; turn on SCU (irq1)
        out     IMR,al                  ; enable scu with timer0 and maybe 8250 mov     al,04eh                 ; 1 stop, No parity, 8 bit, /16
        out     SMD,al                  ; to Mode Register mov     al,035h                 ; Enable Recieve/Xmit, Clear Errors
        out     SCM,al                  ; and allow Normal Output mov     al,2                    ; interrupt on RECEIVE only
        out     SIMK,al                 ;
ENDIF ;----------------------------------------------------------------------
;       Place to restart at when we get a control C
;       Clear all of our ram before using it
;----------------------------------------------------------------------
restart:
        cli                             ; no interrupts now
        and     [bp+poreg],7fh          ; make sure CESL is clear
        mov     si,offset clr_ram       ; start clearing from here
```

```
clear:
        mov     word ptr [bp+si],0      ; clear ram
        add     si,2                    ; go to next word
        cmp     si,0f0h                 ; at end of ram yet?
        jb      clear                   ; jump if not ;----------------------------------------------------------------
;       Reset the stack, clear input pointers, put out the banner
;----------------------------------------------------------------
        mov     sp,offset reset         ; reset the stack
        xor     di,di                   ; clear buffer offset also sti                             ; now, allow interrupts mov     bx,offset banner        ; show the banner
        call    puts                    ; put it out test    [bp+flags],BADCRCBIT    ; are we here due to bad crc?
        jz      cmd_loop                ;   nope
        mov     bx,offset badcrc        ;
        call    puts                    ; let the user know why we are here ;----------------------------------------------------------------
;       Process input commands one at a time
;----------------------------------------------------------------
cmd_loop:
        mov     bx,seg rom              ; reset data segment
        mov     ds,bx                   ;
        and     [bp+poreg],7fh          ; make sure CESL is clear
        mov     bx,offset prompt        ; show the prompt
        call    puts call    get_cmdln               ; get a command line
        call    get_cmdln_pch           ; get the command character in al cmp     al,LF                   ; this just a blank line?
        je      cmd_loop                ;   yep, just get another command line
        mov     bx,offset cmd_table     ; jump offset table
        cmp     al,'A'                  ;
        jge     cmd_cont                ; valid ('A-Z') command?
        mov     al,'A'                  ; a 'BAD' command
cmd_cont:
        sub     al,'A'                  ; get an offset between 0 and 25
        xor     ah,ah                   ; clear ah so we can add it to bx
        shl     al,1                    ; multiply by 2
        add     bx,ax                   ;
        call    [bx]                    ; call indirect to command
        jmp     short cmd_loop          ; continue forever endp    main ;----------------------------------------------------------------
        proc    verify near
```

```
;        - verify extended intel hex against memory.
;        - set the verify bit in dl, then jump to the load routine.
;
;        subroutines: chk_eol
;------------------------------------------------------------------------
        call    chk_eol                 ; make sure we are at eol
        mov     dl,2                    ; verify uses bit 1
        jmp     short load_a            ;

endp    verify

;------------------------------------------------------------------------
        proc    load near
;        - load/verify extended intel hex into/against memory.
;        - there are two load routines in this proc, one for mode
;          zero, and one for other modes.
;        - ES=Original segment
;          DS=Normalized segment
;          SI=Segment for comparison
;          BX=Normalized offset
;          CX=Length
;          DH=chksum
;          DL=flags:      bit 0:trace/notrace
;                         bit 1:verify/load
;                         bit 2:mode0/other
;
;        subroutines: getch, putch, chk_eol, puts, getbyt
;------------------------------------------------------------------------
        call    chk_eol                 ; make sure we are at eol
        xor     dl,dl                   ; clear flags register (Load Mode)
load_a:
        xor     cx,cx                   ; start with segment at 0
        mov     es,cx                   ; es has our original segment
        or      dl,[bp+togflg]          ; get and set toggle flag in si
        test    [bp+moreg],1ch          ; Mode 0?
        jnz     load_b                  ;   nope
        or      dl,4                    ; set mode 0 flag
load_b:
        call    getch                   ; start looking for a colon
        test    dl,1                    ; trace bit set?
        jz      load_c                  ;   nope
        call    putch                   ; echo the char
load_c:
        cmp     al,':'                  ; this a colon yet?
        jne     load_b                  ; wait till we get one xor     cx,cx                   ; clear length
        xor     dh,dh                   ; clear chksum call    getbyt                  ; this should be the length
        mov     CL,al                   ; save length in CL call    getbyt                  ; high byte of 16 bit address
```

```
        mov     BH,al                   ; save it to BH
        call    getbyt                  ; low byte of 16 bit address
        mov     BL,al                   ; save it to BL test    dl,4                    ; are we in mode 0?
        jz      load_d                  ;   nope
                                        ; MODE 0 code
        mov     ax,es                   ; get original segment
        shl     ax,4                    ; get rid of high nibble
        add     bx,ax                   ; now we have a sixteen bit address
        xor     ax,ax                   ; clr ax
        mov     ds,ax                   ; so we can do everything in seg 0
        jmp     short load_e            ;
load_d:                                 ; MODES 1-5 code
        mov     si,es                   ; es has original segment
        shr     bx,4                    ; begin normalizing it
        add     bx,si                   ; now we have a normalized segment
        mov     si,bx                   ; stick it in si so we can compare it
        mov     bx,ax                   ; lower nibble of address is our offset
        and     bx,0fh                  ; normalized address ds:bx
load_e:
        call    getbyt                  ; rectype
        cmp     al,0                    ;
        je      load_rec_0              ; data record
        cmp     al,1                    ;
        je      load_rec_1              ; EOF record
        cmp     al,2                    ;
        je      load_rec_2              ; Segment record
        cmp     al,3                    ;
        je      load_b                  ; Start record - go get another one mov     bx,offset em_badrec     ; bad record
        jmp     load_prterr             ;

load_chksum:                            ; test check sum
        mov     bh,dh                   ; get current checksum
        neg     bh                      ; 2's complement
        call    getbyt                  ; get the check sum cmp     bh,al                   ; are calculated and given equal?
        je      load_b                  ; yep, go do it again
        mov     bx,offset em_badcks     ; Checksums didn't agree
        jmp     load_prterr             ;

load_rec_1:                             ; EOF record :00000001FF
        call    getbyt                  ; load chksum (Don't really care if bad)
        ret                             ;

load_rec_2:                             ; Segment record :02XXXX02SegmCs
        cmp     CL,2                    ; record type 2s have length 2
        je      load_rec_2_a            ;   at least length is correct
        mov     bx,offset em_badlen     ; record 2 isn't length 2
        jmp     load_prterr             ;
```

```
load_rec_2_a:
        call    getbyt              ; high part of segment
        mov     BH,al               ; save it to BH
        call    getbyt              ; low part of segment
        mov     BL,al               ; save it to BL
        mov     ES,BX               ; save as original segment
        jmp     load_chksum         ; check the checksum!

load_rec_0:
        call    getbyt              ; data byte
        test    dl,4
        jnz     mode0_code          ; mode 0 uses other code push    si                  ; save it, it is going to change
        cmp     si,0100h
        jb      load_rom            ; ROM area 0000.0-00FF.F
        cmp     si,0fff0h
        jb      load_data           ; General area 0100.0-FFEF.F
        cmp     si,0ffffh
        jb      load_next           ; Softner Registers FFF0.0-FFFE.F load_reset:
        mov     si,0dfffh           ; RESET area FFFF.0-FFFF.F
        jmp     short load_cesl
load_rom:                           ; ROM area 0000.0-00FF.F
        or      si,0a000h
load_cesl:
        or      [bp+poreg],80h      ; set CESL
load_data:
        mov     ds,si test    dl,2                ; this a Verify?
        jnz     load_verify         ;   yep
        mov     [bx],al             ; LOAD
        and     [bp+poreg],7fh      ; clear CESL
        jmp     load_next           ;
load_verify:
        mov     ah,[bx]             ; VERIFY
        and     [bp+poreg],7fh      ; clear CESL
        cmp     al,ah               ;
        jne     load_vererr         ; didn't verify! (MAKE SURE WE POP SI)
load_next:
        pop     si                  ; restore si
        inc     bx                  ; point to next one
        cmp     bl,010h             ; have we exceeded normalized?
        jne     load_continue       ;
load_normalize:                     ;
        xor     bx,bx               ; we are now on a paragraph
        inc     si                  ; increment segment
load_continue:
        loop    load_rec_0          ; do the next byte
        jmp     load_chksum         ; finish up record
```

```
mode0_code:                             ; entire address is in bx
        push    bx                      ; save it, we are going to modify it
        cmp     bx,01000h
        jb      load_rom_0              ; ROM area 0000-0FFF
        cmp     bx,0ff00h
        jb      load_data_0             ; General area 1000-FEFF
        cmp     bx,0fff0h
        jb      load_next_0             ; Softner Registers FF00-FFEF
load_reset_0:
        mov     bh,07fh                 ; RESET area FFF0-FFFF to 7FFF-7FFF
        jmp     short load_cesl_0
load_rom_0:                             ; ROM area 0000-0FFF
        or      bh,080h                 ;     to 8000-8FFF
load_cesl_0:
        or      [bp+poreg],80h          ; set CESL
load_data_0:
        test    dl,2                    ; this a Verify?
        jnz     load_verify_0           ;   yep
        mov     [bx],al                 ; LOAD
        and     [bp+poreg],7fh          ; clear CESL
        jmp     load_next_0             ;
load_verify_0:
        mov     ah,[bx]                 ; VERIFY
        and     [bp+poreg],7fh          ; clear CESL
        cmp     al,ah                   ;
        jne     load_vererr             ; didn't verify! (MAKE SURE WE POP SI)
load_next_0:
        pop     bx                      ; get address back
        inc     bx                      ; point to next one
        loop    load_loop_jmp           ; do the next byte
        jmp     load_chksum             ; finish up record
load_loop_jmp:
        jmp     load_rec_0              ;

load_vererr:
        pop     ax                      ; restore si/bx push
        mov     bx,offset em_memver     ; Verify error
load_prterr:
        call    puts                    ; print out error message
        jmp     load_b                  ; go get another record endp    load ;-----------------------------------------------------------------
        proc    getbyt near
;       - get two hex chars from the input string, convert them
;         to binary, and add them to DH (check sum).
;       - dl hold the load/verfiy flags.
;       - al has the converted byte.
;
;       subroutines: getch, putch, ishexch, puts
;-----------------------------------------------------------------
        call    getch                   ; get next byte
```

```
        test    dl,1                ; echo it?
        jz      getbyt_a            ; nope
        call    putch               ; yep
getbyt_a:
        call    ishexch             ; convert to binary
        jc      getbyt_error        ;

shl     al,4                ; this is a high nibble
        mov     CH,al               ; save in unused register call    getch               ; get next byte
        test    dl,1                ; echo it?
        jz      getbyt_b            ; nope
        call    putch               ; yep
getbyt_b:
        call    ishexch             ; convert to binary
        jc      getbyt_error        ;

or      al,CH               ; get together with high byte
        xor     CH,CH               ; restore ch to original state, 0
        add     DH,al               ; add to check sum
        ret                         ; all done.
getbyt_error:
        pop     ax                  ; get rid of return addess
        mov     bx,offset em_nothex ; error message
        call    puts                ; print it out
        jmp     load_a              ; and we are done.

endp    getbyt

;---------------------------------------------------------------------
        proc    toggle near
;       - toggle the togflg byte for echoing intel hex data
;           during load/verify.
;
;       subroutines: chk_eol, puts
;---------------------------------------------------------------------
        call    chk_eol             ; make sure we are at eol test    [bp+togflg],1       ; is toggle byte off?
        jz      toggle_on           ;   yep, so turn it on.

mov     [bp+togflg],0       ; now it is off
        mov     bx,offset offmsg    ;
        jmp     short toggle_exit   ;
toggle_on:
        mov     [bp+togflg],1       ; now it is on
        mov     bx,offset onmsg     ;
toggle_exit:
        call    puts
        ret
```

```
        endp    toggle

;----------------------------------------------------------------------
        proc    modem_avail near
;       - toggle the flags bit for modem availability.
;
;       subroutines: chk_eol, puts
;----------------------------------------------------------------------
        call    chk_eol                 ; make sure we are at eol test    [bp+flags],MODEMBIT     ; is modem available?
        jz      modem_yes               ;    it will be.

cli                             ; disable interrupts
        mov     [bp+tareg],0aah         ; it is a timed access operation
        mov     [bp+tareg],055h         ;
        and     [bp+flags],not MODEMBIT ; now it is unavailable (clr bit)
        sti
        mov     bx,offset un_avail_msg  ;
        jmp     short modem_exit        ;
modem_yes:
        cli                             ; disable interrupts
        mov     [bp+tareg],0aah         ; it is a timed access operation
        mov     [bp+tareg],055h         ;
        or      [bp+flags],MODEMBIT     ; now it is available (set bit)
        sti
        mov     bx,offset avail_msg     ;
modem_exit:
        call    puts
        ret endp    modem_avail ;----------------------------------------------------------------------
        proc    freshness near
;       - Ask the user confirm this operation, setting the freshness
;         bit, and then go into a tight loop waiting for power down.
;
;       subroutines: chk_eol, puts, getch, putch
;----------------------------------------------------------------------
        call    chk_eol                 ; make sure we are at eol
        test    [bp+moreg],2            ; is IRL pin high?
        jz      fresh_rl                ; no it isn't mov     bx,offset confirm       ; ask for confirmation.
        call    puts                    ; print it out.
        mov     bx,offset fresh         ; get fresh string
fresh_a:
        call    getch                   ; get a confirmation character
        call    putch                   ; echo it
        cmp     al,byte ptr [bx]        ; are they equal?
        jne     fresh_x                 ;    nope, go away
```

```
        inc     bx                      ; point to next char
        cmp     al,LF                   ; this the end of string?
        jne     fresh_a                 ; keep doing it mov     bx,offset fresh_msg     ; let them know the requirements
        call    puts                    ; show it cli                             ; disable interrupts
        mov     [bp+tareg],0aah         ; it is a timed access operation
        mov     [bp+tareg],055h         ;
        mov     al,[bp+ptreg]           ; set freshness bit
fresh_b:
        mul     bl                      ; waste time
        mov     [bp+tareg],0aah         ; now just keep hitting the
        mov     [bp+tareg],055h         ; watch dog until something
        or      [bp+rireg],80h          ; reset watch dog
        jmp     short fresh_b           ; happens
fresh_rl:
        mov     bx,offset fresh_err     ;
        call    puts                    ;
        ret                             ;
fresh_x:
        call    getch                   ; get and echo till
        call    putch                   ; we see an
        cmp     al,LF                   ; end of line char
        jne     fresh_x                 ;
        mov     bx,offset nofresh_msg   ;
        call    puts                    ;

ret endp    freshness

;----------------------------------------------------------------
        proc    read near
;       - read and print the softner registers
;       - display availability of the modem
;       - display specified crc ranges
;
;       subroutines: chk_eol, puts, putbyt, put_crc_range
;----------------------------------------------------------------
        call    chk_eol                 ; make sure we are at eol mov     bx,offset mcreg_str     ;
        call    puts                    ; print msg
        mov     al,[bp+mcreg]           ; memory control register
        call    putbyt                  ; and print it out mov     bx,offset wdreg_str     ;
        call    puts                    ; print msg
        mov     al,[bp+wdreg]           ; watch dog register
        call    putbyt                  ; and print it out
```

```
        mov     bx,offset moreg_str     ;
        call    puts                    ; print msg
        mov     al,[bp+moreg]           ; modes register
        call    putbyt                  ; and print it out mov     bx,offset poreg_str     ;
        call    puts                    ; print msg
        mov     al,[bp+poreg]           ; power register
        call    putbyt                  ; and print it out test    [bp+flags],MODEMBIT     ; modem available?
        jz      read_crcs               ;   nope
        mov     bx,offset mod_avail_msg ;
        call    puts                    ; print msg
read_crcs:
        test    [bp+flags],CRC1BIT      ; crc1 valid?
        jz      read_exit               ;   nope, if no 1, then no 2
        mov     si,offset begin_adr_1   ; offset to crc values
        mov     bx,offset crc1_msg      ;
        call    put_crc_range           ; print crcmsg test    [bp+flags],CRC2BIT      ; crc2 valid?
        jz      read_exit               ;   nope
        mov     si,offset begin_adr_2   ; offset to crc values
        mov     bx,offset crc2_msg      ;
        call    put_crc_range           ; print crcmsg
read_exit:
        ret endp    read ;------------------------------------------------------------------
        proc    put_crc_range near
;       - output the crc range offset from si.
;
;       subroutines: puts, putbyt, putch
;------------------------------------------------------------------
        call    puts                    ; put the message
        mov     bx,[bp+si]              ; begin offset
        mov     cx,[bp+si+2]            ; end offset
        mov     dx,[bp+si+4]            ; crc mov     ah,[bp+si+6]            ; segments
        shl     ah,4                    ; page number
        mov     al,ah                   ;
        call    putbyt                  ; segment of begin address
        xor     al,al                   ;
        call    putbyt                  ; reset of begin segment mov     al,':'                  ; segment separater
        call    putch                   ;
```

```
        mov     al,bh                   ; begin offset hi
        call    putbyt                  ;
        mov     al,bl                   ; begin offset lo
        call    putbyt                  ;

mov     al,'-'                  ; range char
        call    putch                   ;

mov     ah,[bp+si+6]            ; segments
        and     ah,0f0h                 ; page number
        mov     al,ah                   ;
        call    putbyt                  ; segment .. begin address
        xor     al,al                   ;
        call    putbyt                  ; reset of begin segment mov     al,':'                  ; segment separater
        call    putch                   ;

mov     al,ch                   ; end offset hi
        call    putbyt                  ;
        mov     al,cl                   ; end offset lo
        call    putbyt                  ;

mov     al,'='                  ;
        call    putch                   ;

mov     al,dh                   ; high part of crc
        call    putbyt                  ;
        mov     al,dl                   ; low part of crc
        call    putbyt                  ;

ret endp    put_crc_range

;------------------------------------------------------------------
        proc    write near
;       - w register byte
;       - change the specified softner register with byte
;
;       subroutines: get_cmdln_pch, get_cmdln_word, puts, chk_eol
;------------------------------------------------------------------
        call    get_cmdln_pch           ; get the next cmdline char
        mov     dh,al                   ; save the high part
        call    get_cmdln_pch           ; get the next cmdline char
        mov     dl,al                   ; register name in dx call    get_cmdln_word          ; get a word from the command line
        jnc     write_a                 ;   jmp if we got something good.
        jmp     argument_required       ; got crap write_a:
        call    chk_eol                 ; at eol? better be.
```

```
        cmp     dx,'MC'                 ; MCON register
        jne     write_b                 ;
        mov     si,0                    ;
        jmp     write_f
write_b:
        cmp     dx,'WD'                 ; WDOG register
        jne     write_c                 ;
        mov     si,1                    ;
        jmp     write_f
write_c:
        cmp     dx,'MO'                 ; MODES register
        jne     write_d                 ;
        mov     si,2                    ;
        or      bl,1                    ; Set ROM bit
        jmp     write_f
write_d:
        cmp     dx,'PO'                 ; POWER register
        jne     write_e                 ;
        mov     si,3                    ;
        and     bl,7fh                  ; Don't touch CESL bit
        jmp     write_f
write_e:
        mov     bx,offset am_badreg     ; didn't find it
        call    puts
        ret
write_f:
        cli                             ; don't interrupt during timed access
        mov     [bp+tareg],0aah         ; begin timed access
        mov     [bp+tareg],055h         ;   end timed access
        mov     [bp+si+mcreg],bl        ; save into register
        sti                             ;

ret endp    write

;----------------------------------------------------------------
        proc    exit near
;       - exit the rom.
;
;       subroutines: chk_eol, puts
;----------------------------------------------------------------
        call    chk_eol                 ; make sure command line is clear
rom_exit:
        cli                             ;
        mov     [bp+tareg],0aah         ;
        mov     [bp+tareg],055h         ;
        and     [bp+moreg],0feh         ; clear rom bit and exit rom
        sti                             ;
IFDEF EXIT_ROM
        mov     bx,offset exit_rom_msg  ;
        call    puts                    ;
```

ENDIF
```
        ret endp    exit

;------------------------------------------------------------------------
        proc    fill near
;       - f byte [start-address [end-address]]
;       -         modes 1-4                  mode 0
;           BX=normalized offset (0-F)       BX=address
;           SI=normalized segment            CX=ending address
;           CX=normalized ending offset      DS=0
;           DX=normalized ending segment
;       - Ending values are one greater so they may be compared
;       - There are two programs here, one for mode 0 and the other
;           for other modes.
;
;       subroutines: get_cmdln_word, argument_required
;                    optional, normalize
;------------------------------------------------------------------------
        call    get_cmdln_word          ; fill value
        jnc     fill_a                  ; argument found
        jmp     argument_required       ; didn't get a fill value
fill_a:
        mov     [bp+fbyte],bl           ; save it
        call    optional                ; get optional arguments
        call    normalize               ; normalize the optional arguments
        mov     al,[bp+fbyte]           ; restore the fill byte test    [bp+moreg],1ch          ; is this mode 0?
        jz      fill_mode_0             ;   yep
fill_again:
        cmp     si,0100h
        jb      fill_rom                ; ROM area 0000.0-00FF.F
        cmp     si,0fff0h
        jb      fill_data               ; General area 0100.0-FFEF.F
        cmp     si,0ffffh
        jb      fill_next               ; Softner Registers FFF0.0-FFFE.F
fill_reset:
        push    si                      ; save it, it is going to change
        mov     si,0dfffh               ; RESET area FFFF.0-FFFF.F
        jmp     short fill_cesl
fill_rom:                               ; ROM area 0000.0-00FF.F
        push    si                      ; save it, it is going to change
        or      si,0a000h
fill_cesl:
        mov     ds,si
        or      [bp+poreg],80h          ; set CESL
        mov     [bx],al                 ; fill
        and     [bp+poreg],7fh          ; clear CESL
        pop     si                      ; restore
        jmp     short fill_next         ;
```

```
fill_data:
        mov     ds,si                   ; get current segment
        mov     [bx],al                 ; fill
fill_next:
        inc     bx                      ; point to next one
        cmp     bl,010h                 ; have we exceeded normalized?
        jne     fill_continue           ;
        xor     bx,bx                   ; we are now on a paragraph
        inc     si                      ; increment segment
fill_continue:
        cmp     si,dx                   ;
        jne     fill_again              ;
        cmp     bx,cx                   ;
        jne     fill_again              ;

ret fill_mode_0:                            ; entire address is in bx
        xor     si,si                   ;
        mov     ds,si                   ;
fill_again_0:
        cmp     bx,01000h
        jb      fill_rom_0              ; ROM area 0000-0FFF
        cmp     bx,0ff00h
        jb      fill_data_0             ; General area 1000-FEFF
        cmp     bx,0fff0h
        jb      fill_next_0             ; Softner Registers FF00-FFEF
fill_reset_0:
        push    bx                      ; save it, we are going to modify it
        mov     bh,07fh                 ; RESET area FFF0-FFFF to 7FFF-7FFF
        jmp     short fill_cesl_0
fill_rom_0:                             ; ROM area 0000-0FFF
        push    bx                      ; save it, we are going to modify it
        or      bh,080h                 ;     to 8000-8FFF
fill_cesl_0:
        or      [bp+poreg],80h          ; set CESL
        mov     [bx],al                 ; fill
        and     [bp+poreg],7fh          ; clear CESL
        pop     bx                      ; get address back
        jmp     short fill_next_0       ;
fill_data_0:
        mov     [bx],al                 ; fill
fill_next_0:
        inc     bx                      ; point to next one
        cmp     bx,cx                   ; are we done?
        jne     fill_again_0            ;

ret endp    fill

;----------------------------------------------------------------------
        proc    dump near
```

```
;        - d [start-address [end-address]]
;        - dump data in extended intel hex.
;        - two programs exist here, one for mode 0, and one for other
;          modes.
;
;       subroutines: optional, out_segment, putbyt, putch, puts
;----------------------------------------------------------------
        call    optional                ; get optional arguments
        mov     [bp+tmp],si             ;
dump_a:
        call    out_segment             ;

mov     si,0ffffh               ; get number of bytes in segment
        cmp     dh,0                    ;   to dump
        jne     dump_b                  ;
        mov     si,[bp+tmp]             ;
dump_b:
        mov     cx,si                   ; cx = number of bytes in this
        sub     cx,bx                   ;   record, up to 20H
        cmp     cx,1fh                  ;
        jbe     dump_c                  ;
        mov     cx,1fh                  ;
dump_c:
        inc     cx                      ;
        call    out_header              ; also init checksum
dump_d:
        push    bx                      ; save this offset
        shr     bx,4                    ; segment part of offset
        mov     ax,ds                   ; get current segment
        add     ax,bx                   ; now we have an official paragraph
        pop     bx                      ; recover original offset test    [bp+moreg],01ch         ; are we in mode 0?
        jz      dump_mode_0             ;   yep cmp     ax,00100h               ; are we in rom area?
        jb      dump_rom                ;   yep
        cmp     ax,0ffffh               ; are we in reset area?
        jae     dump_reset              ;   yep
        mov     al,[bx]                 ; get val.  Softner and my Ram also
        jmp     short dump_continue     ;
dump_rom:
        push    ds                      ; save old segment
        push    bx                      ; and the old offset
        mov     ah,0a0h                 ; rom maps to a0xx.x
        jmp     short dump_mode_ces1    ; continue with common code
dump_reset:
        push    ds                      ; save old segment
        push    bx                      ; and the old offset
        mov     ah,0dfh                 ; reset maps to dfff.x
        jmp     short dump_mode_ces1    ; continue with common code
```

```
dump_mode_0:
        cmp     ax,00100h               ; are we in rom area?
        jb      dump_rom_0              ;   yep
        cmp     ax,00fffh               ; are we in reset area?
        jae     dump_reset_0            ;   yep
        mov     al,[bx]                 ; get val.  Softner and my Ram also
        jmp     short dump_continue     ;
dump_rom_0:
        push    ds                      ; save old segment
        push    bx                      ; and the old offset
        mov     ah,08h                  ; rom maps to 08xx.x
        jmp     short dump_mode_ces1    ; continue with common code
dump_reset_0:
        push    ds                      ; save old segment
        push    bx                      ; and the old offset
        mov     ah,07h                  ; reset maps to 07ff.x
dump_mode_ces1:
        mov     ds,ax                   ; new segment
        and     bx,0fh                  ; new offset (normalized)
        or      [bp+poreg],80h          ; set ces1
        mov     al,[bx]                 ; get the value
        and     [bp+poreg],7fh          ; clear ces1
        pop     bx                      ; restore old offset
        pop     ds                      ; restore of segment
dump_continue:
        add     dl,al                   ; add to check sum
        call    putbyt                  ; now display byte
        inc     bx                      ; point to next memory location
        loop    dump_d                  ; while we still have data mov     al,dl                   ; get running checksum
        neg     al                      ; negate it
        call    putbyt                  ; and print it out
        mov     al,CR                   ; as well as a CR/LF
        call    putch                   ;

cmp     bx,0                    ; are we done with this segment?
        je      dump_e                  ;
        cmp     bx,si                   ;
        ja      dump_e                  ;
        jmp     dump_b                  ;
dump_e:
        mov     cx,ds                   ; add 1000h hex to segment.
        add     cx,1000h                ;
        mov     ds,cx                   ;
        dec     dh                      ; reduce segments by 1
        cmp     dh,0fh                  ; are we done?
        jae     dump_f                  ; Nope
        jmp     dump_a                  ;
dump_f:
        mov     bx,offset ih_endrec     ; Yep
        call    puts                    ;
        ret
```

```
        endp    dump

;----------------------------------------------------------------- proc    out_segment near
;       - output and intel hex segment record.
;
;       subroutines: puts, putbyt, putch
;----------------------------------------------------------------- push    bx                      ; save bx, we are going to destroy it mov     bx,offset ih_segrec     ; output Intel Hex
        call    puts                    ; Segment Record mov     bx,ds                   ; output the segment value
        mov     al,bh                   ; high byte
        call    putbyt                  ;
        mov     al,bl                   ; low byte
        call    putbyt                  ;

add     bh,bl                   ; get the check sum going
        add     bh,4                    ; two for length, and two for rec type
        neg     bh                      ; complement it
        mov     al,bh                   ; now output the checksum value
        call    putbyt                  ;

mov     al,CR                   ; terminate line
        call    putch                   ;

pop     bx                      ; restore the value we trashed
        ret endp    out_segment ;-----------------------------------------------------------------
        proc    out_header near
;       - out the frount part of an intel hex record, the sync char,
;           length byte and address word.
;
;       subroutines: putch, putbyt
;----------------------------------------------------------------- mov     al,':'                  ; start with the sync char
        call    putch                   ;
        mov     ax,cx                   ; length of record
        mov     dl,cl                   ; init check sum
        call    putbyt                  ;

mov     al,bh                   ; high byte of address
        call    putbyt                  ;
        mov     al,bl                   ; low byte of address
        call    putbyt                  ;
        add     dl,bh                   ; add high address to checksum
        add     dl,bl                   ; add low address to checksum
```

```
        xor     ax,ax                   ; clear al
        call    putbyt                  ;
        ret endp    out_header ;----------------------------------------------------------------------
        proc    klear_crcs near
;       - clear crc range flags
;
;       subroutines: chk_eol
;----------------------------------------------------------------------
        call    chk_eol                 ; make sure we are at eol
        cli                             ; disable interrupts
        mov     [bp+tareg],0aah         ; it is a timed access operation
        mov     [bp+tareg],055h         ;
        and     [bp+flags],not (CRC1BIT or CRC2BIT); clear valid crc range bits
        sti
        ret                             ;

endp    klear_crcs

;----------------------------------------------------------------------
        proc    crc near
;       - c [start-address [end-address]]
;       - push the existing crc down down to crc 2.
;       - install the requested crc range as crc 1.
;       - calculate a crc and save it as part of crc 1.
;       - push the valid flags.
;       - CAUTION: this command may be interrupted and leave faulty
;         data in the crc save are.
;
;       subroutines: optional, do_crc
;----------------------------------------------------------------------
        call    optional                ; get optional arguments mov     si,offset begin_adr_1   ; this codes pushes crcs
        mov     cx,7                    ; push 7 bytes
crc_push:
        mov     al,byte ptr [bp+si]     ; get byte to push cli                             ; disable interrupts
        mov     [bp+tareg],0aah         ; it is a timed access operation
        mov     [bp+tareg],055h         ;
        mov     byte ptr [bp+si+7],al   ; push byte in crc space
        sti                             ;

inc     si                      ; point to next byte
        loop    crc_push                ; for 7 bytes mov     bx,[bp+bseg]            ; normalize beginning address
        mov     ch,bh                   ; save page (high nibble)
        shr     ch,4                    ; get nibble to left
```

```
shl     bx,4                    ; offset portion of segment
add     bx,[bp+boff]            ; bx is bottom 16 bits of 20 bit adr
adc     ch,0                    ; add carry to page cli                             ; disable interrupts
mov     [bp+tareg],0aah         ; it is a timed access operation
mov     [bp+tareg],055h         ;
mov     [bp+begin_adr_1],bx     ; save addess
sti mov     bx,[bp+eseg]            ; normalize ending addres
mov     cl,bh                   ; save page (high nibble)
shr     cl,4                    ; get nibble to left
shl     bx,4                    ; offset portion of segment
add     bx,[bp+eoff]            ; bx is bottom 16 bits of 20 bit adr
adc     cl,0                    ; add carry to page
cli                             ; disable interrupts
mov     [bp+tareg],0aah         ; it is a timed access operation
mov     [bp+tareg],055h         ;
mov     [bp+end_adr_1],bx       ; save addess
sti shl     cl,4                    ; put ending page number in high nibble
add     cl,ch                   ; combine with the begining page number cli                             ; disable interrupts
mov     [bp+tareg],0aah         ; it is a timed access operation
mov     [bp+tareg],055h         ;
mov     [bp+segments_1],cl      ; save of the segments
sti
                                ; Push valid crc range bits
mov     ax,[bp+flags]           ; get the flag bits
stc                             ; set crc range bit 1
rcl     ax,1                    ; shift in carry
and     ax,3                    ; clear every thing else cli                             ; disable interrupts
mov     [bp+tareg],0aah         ; it is a timed access operation
mov     [bp+tareg],055h         ;
or      [bp+flags],ax           ; now we have shifted valid crc ranges
sti                             ;

call    do_crc                  ; do the computations mov     bx,offset crcmsg        ; print out message
call    puts                    ;
mov     cx,word ptr [bp+crc_reg]; and the
cli
mov     [bp+tareg],0aah         ; it is a timed access operation
mov     [bp+tareg],055h         ;
mov     [bp+crc_1],cx           ; save the value of computed CRC
sti
mov     al,ch                   ; value of
```

```
        call    putbyt                  ; the
        mov     al,cl                   ; calculated crc.
        call    putbyt                  ;
        ret endp    crc ;------------------------------------------------------------------
        proc    startup_crc near
;       - move crc begin and end addresses into the begin and end
;         pointers, call do_crc and then compare the calculated value
;         against the saved value.
;       - No checking of pointer validity is done.
;
;       subroutines: do_crc
;------------------------------------------------------------------
        mov     cx,[bp+si+0]            ; beginning offset
        mov     [bp+boff],cx            ; save it off
        mov     dx,[bp+si+2]            ; ending offset
        mov     [bp+eoff],dx            ; save it off
        mov     bh,[bp+si+6]            ; segments
        xor     ax,ax                   ; clear all of ax
        mov     ah,bh                   ; get both segment pages
        and     ah,0f0h                 ; create the ending segment
        mov     [bp+eseg],ax            ; save as ending segment
        mov     ah,bh                   ; get both segment pages again
        shl     ah,4                    ; and make it a segment also
        mov     [bp+bseg],ax            ; save as starting segment cmp     ax,[bp+eseg]            ; Eseg - Bseg
        jb      startup_cont            ;   jump if bseg is below.
        ja      startup_bad_range       ;   bad range if bseg is above eseg cmp     cx,dx                   ; Eoff - Boff
        jbe     startup_cont            ;   badr is <= to eadr
startup_bad_range:
        ret                             ; last compare wasn't equal startup_cont:
        call    do_crc                  ;

mov     ax,word ptr [bp+crc_reg]; get the crc
        cmp     ax,[bp+si+4]            ; compare against original crc
        ret endp    startup_crc ;------------------------------------------------------------------
        proc    do_crc near
;       - It is assumed that boff, bseg, eoff and eseg have valid
;         values for this mode.
;       - Normalize is called
;       - the CRC registers are cleared by feeding the current value
```

```
;               back into it,
;               - and then the crc is computed for the requested range.
;                          modes 1-4              mode 0
;                    BX=normalized offset (0-F)   BX=address
;                    SI=normalized segment        CX=ending address
;                    CX=normalized ending offset  DS=0
;                    DX=normalized ending segment
;                    Ending values are one greater so they may be compared
;
;       subroutines: normalize
;------------------------------------------------------------------
        mov     cx,word ptr [bp+crc_reg]; clear the crc register
        mov     [bp+crc_lo],cl          ; LOW byte then high byte (7 clocks)
        mul     bl                      ; destory ax, WASTE 33-39 clocks+)
        mov     [bp+crc_lo],ch          ; finish the clear of crc register
IFDEF   COUNT
        mov     word ptr [bp+crc_reg],0 ; clear crc register
ENDIF
        call    normalize               ; normalize optional arguments test    [bp+moreg],1ch          ; this mode 0?
        jz      crc_mode_0              ;   yep
crc_again:
        cmp     si,0100h
        jb      crc_rom                 ; ROM area 0000.0-00FF.F
        cmp     si,0fff0h
        jb      crc_data                ; General area 0100.0-FFEF.F
        cmp     si,0ffffh
        jb      crc_next                ; Softner Registers FFF0.0-FFFE.F
crc_reset:
        push    si                      ; save it, it is going to change
        mov     si,0dfffh               ; RESET area FFFF.0-FFFF.F
        jmp     short crc_cesl
crc_rom:                                ; ROM area 0000.0-00FF.F
        push    si                      ; save it, it is going to change
        or      si,0a000h
crc_cesl:
        mov     ds,si
        or      [bp+poreg],80h          ; set CESL
        mov     al,[bx]                 ; get byte
IFDEF   COUNT
        inc     word ptr [bp+crc_reg]
ELSE
        mov     [bp+crc_lo],al          ; now crc it
ENDIF
        and     [bp+poreg],7fh          ; clear CESL
        pop     si                      ; restore
        jmp     short crc_next          ;
crc_data:
        mov     ds,si                   ; get current segment
        mov     al,[bx]                 ; get byte
IFDEF   COUNT
        inc     word ptr [bp+crc_reg]
```

```
        ELSE
                mov     [bp+crc_lo],al          ; now crc it
        ENDIF
crc_next:
                inc     bx                      ; point to next one
                cmp     bl,010h                 ; have we exceeded normalized?
                jne     crc_continue            ;
                xor     bx,bx                   ; we are now on a paragraph
                inc     si                      ; increment segment
crc_continue:
                cmp     si,dx                   ;
                jne     crc_again               ;
                cmp     bx,cx                   ;
                jne     crc_again               ;

ret
crc_mode_0:                                     ; entire address is in bx
                xor     si,si                   ;
                mov     ds,si                   ;
crc_again_0:
                cmp     bx,01000h
                jb      crc_rom_0               ; ROM area 0000-0FFF
                cmp     bx,0ff00h
                jb      crc_data_0              ; General area 1000-FEFF
                cmp     bx,0fff0h
                jb      crc_next_0              ; Softner Registers FF00-FFEF
crc_reset_0:
                push    bx                      ; save it, we are going to modify it
                mov     bh,07fh                 ; RESET area FFF0-FFFF to 7FFF-7FFF
                jmp     short crc_cesl_0
crc_rom_0:                                      ; ROM area 0000-0FFF
                push    bx                      ; save it, we are going to modify it
                or      bh,080h                 ;     to 8000-8FFF
crc_cesl_0:
                or      [bp+poreg],80h          ; set CESL
                mov     al,[bx]                 ; get byte
        IFDEF   COUNT
                inc     word ptr [bp+crc_reg]
        ELSE
                mov     [bp+crc_lo],al          ; now crc it
        ENDIF
                and     [bp+poreg],7fh          ; clear CESL
                pop     bx                      ; get address back
                jmp     short crc_next_0        ;
crc_data_0:
                mov     al,[bx]                 ; get byte
        IFDEF   COUNT
                inc     word ptr [bp+crc_reg]
        ELSE
                mov     [bp+crc_lo],al          ; now crc it
        ENDIF
crc_next_0:
                inc     bx                      ; point to next one
```

```
        cmp     bx,cx                   ; are we done?
        jne     crc_again_0             ;
        ret endp    do_crc ;----------------------------------------------------------------------
        proc    bad_cmd near
;       - print the error string for illegal command entered.
;
;       subroutines: puts
;----------------------------------------------------------------------
        mov     bx,offset em_badcmd     ; let them know about the bad command
        call    puts
        ret endp    bad_cmd ;----------------------------------------------------------------------
        proc    argument_required near
;       - print out the bad argument message
;
;       subroutines: puts
;----------------------------------------------------------------------
        mov     bx,offset em_argreq
        call    puts
        ret endp    argument_required ;----------------------------------------------------------------------
        proc    optional near
;       - parse [[bseg:]boff [[eseg:]eoff]]
;         Look for the following errors:
;           - values to exceed 1MB in modes 1-5
;           - values to exceed 64K in mode 0
;           - beginning is less than or equal to ending
;         - DS=bseg, BX=boff, SI=End_off=enorm - bseg*16, DH=nseg
;         - bseg, boff, eseg and eoff are also saved.
;
;       subroutines: skip_space, get_cmdln_word, chk_eol, puts
;----------------------------------------------------------------------
        mov     [bp+boff],0             ; default
        mov     [bp+bseg],0             ;   option
        mov     [bp+eoff],0ffffh        ;     values
        mov     [bp+eseg],0f000h        ;
        test    [bp+moreg],1ch          ; this mode 0?
        jnz     opt_a                   ;   nope.
        mov     [bp+eseg],0             ; zero the ending segment
opt_a:
                                        ; looking for beginning offset
        call    skip_space              ;   and segment
        je      opt_d                   ; at eol, use defaults
```

```
        call    get_cmdln_word          ; bx has value
        jc      opt_illopt              ; error in conversion mov     [bp+boff],bx            ; use this offset call    skip_space              ; anything left on line?
        je      opt_d                   ;   jump if so cmp     al,':'                  ;
        jne     opt_b                   ;

mov     [bp+bseg],bx            ; this is a beginning segment
        inc     si                      ; mov past colon call    get_cmdln_word          ;
        jc      opt_illopt              ;
        mov     [bp+boff],bx            ; and this beginning offset opt_b:                                  ; looking for ending segment
        call    skip_space              ;   and offset.
        je      opt_d                   ; at eol.

call    get_cmdln_word          ;
        jc      opt_illopt              ;

call    skip_space              ;
        jne     opt_c                   ;
        mov     [bp+eoff],bx            ;
        mov     bx,[bp+bseg]            ;
        mov     [bp+eseg],bx            ;
        jmp     short opt_d             ;

opt_c:
        cmp     al,':'                  ;
        jne     opt_illopt              ; not a LF or COLON mov     [bp+eseg],bx            ;
        inc     si                      ; get past colon
        call    get_cmdln_word          ;
        jc      opt_illopt              ;
        mov     [bp+eoff],bx call    skip_space              ;
        je      opt_d                   ; clear
        pop     ax                      ; remove callers address
        call    chk_eol                 ; call with know error
opt_illopt:
        mov     bx,offset am_illopt     ; badly formed address
        jmp     opt_doerr               ;
opt_badadr:
        mov     bx,offset em_badadr     ; bad address, > 1 MB?
        jmp     opt_doerr               ;
```

```
opt_badadr0:
        mov     bx,offset em_badadr0    ; bad address in mode 0
opt_doerr:
        call    puts                    ; close the the branches to it.
        pop     ax                      ; clear callers, caller
        ret
opt_d:
        mov     cx,[bp+eseg]            ; make sure bseg:boff <= eseg:eoff
        mov     dl,ch                   ;
        shr     dl,4                    ; segment part to dl
        shl     cx,4                    ; offset part of segment
        add     cx,[bp+eoff]            ; entire segment
        adc     dl,0                    ; dl:cx = enorm = eseg*16+eoff
        cmp     dl,0fh                  ; did we exceed 1MB
        ja      opt_badadr              ;   yep mov     bx,[bp+bseg]            ;
        mov     al,bh                   ;
        shr     al,4                    ;
        shl     bx,4                    ; al:bx = bseg*16 mov     dh,dl                   ;
        push    cx                      ;
        sub     cx,bx                   ;
        sbb     dl,al                   ;
        mov     si,cx                   ; si = offset(enorm - bseg*16)
        xchg    dl,dh                   ; dh = nseg
        pop     cx                      ;

add     bx,[bp+boff]            ;
        adc     al,0                    ; al:bx = bnorm = bseg*16 + boff
        cmp     al,0fh                  ; did we exceed 1MB
        ja      opt_badadr              ;   yep sub     cx,bx                   ; enorm - bnorm
        sbb     dl,al                   ;
        jc      opt_illopt              ; if bnorm > enorm then error test    [bp+moreg],1ch          ; this mode 0?
        jnz     opt_e                   ;   nope.
                                        ; If end < 64K then so is begin.
        mov     ax,[bp+eseg]            ; get ending segment
        test    ah,0f0h                 ; is it already a bad value?
        jnz     opt_badadr0             ;   yep
        shl     ax,4                    ; zero relative offset
        add     ax,[bp+eoff]            ; now add the offset
        jc      opt_badadr0             ;   excedded 16 bits
opt_e:
        mov     bx,[bp+bseg]            ; set returning
        mov     ds,bx                   ;   parameter
        mov     bx,[bp+boff]            ;    values
        ret
        endp    optional
```

```
;------------------------------------------------------------------
        proc    normalize near
;       - Optional is called before Normalize, so we know
;         that pointers are good.  NO range checking is done!
;         -       modes 1-4                mode 0
;           BX=normalized offset (0-F)  BX=address
;           SI=normalized segment        CX=ending address
;           CX=normalized ending offset  DS=0
;           DX=normalized ending segment
;       - Ending address are increment by one inorder to
;         make comparison easier.
;
;       subroutines:
;------------------------------------------------------------------
        test    [bp+moreg],1ch     ; are we in mode 0?
        jz      norm_mode0         ;   yep.
norm_modes:
        mov     bx,[bp+boff]       ; get starting offset
        mov     ax,bx              ;
        and     bx,0fh             ; normalized offset
        shr     ax,4               ; segment part of offset
        add     ax,[bp+bseg]       ; add in starting segment
        mov     si,ax              ; store starting segment mov     cx,[bp+eoff]       ; get ending segment
        mov     ax,cx              ;
        and     cx,0fh             ; normalized offset
        shr     ax,4               ; segment part of offset
        add     ax,[bp+eseg]       ; add in ending segment
        mov     dx,ax              ; store ending segment
        inc     cx                 ; add 1 to ending address
        cmp     cl,010h            ;    are unnormalized?
        jne     norm_modes_a       ;    nope.
        xor     cx,cx              ; now zero offset
        inc     dx                 ; and segment is one greater
norm_modes_a:
        ret                        ;
norm_mode0:
        mov     ax,[bp+bseg]       ; get starting segment
        shl     ax,4               ; zero relative offset
        add     ax,[bp+boff]       ; now add the offset
        mov     bx,ax              ; store starting address mov     ax,[bp+eseg]       ; get ending segment
        shl     ax,4               ; zero relative offset
        add     ax,[bp+eoff]       ; now add the offset
        mov     cx,ax              ; store ending address
        inc     cx                 ; add 1 to ending address xor     ax,ax              ; need to clear ds
        mov     ds,ax              ; everything goes to segment 0
        ret                        ;
```

```
        endp    normalize

;--------------------------------------------------------------- proc    getch near
;       - return a char in al
;---------------------------------------------------------------
IFDEF   DOS
        call    SCU_service             ;
ENDIF
        cmp     [bp+nchs],0             ; while no chars
        je      getch                   ;   wait push    si
        mov     si,word ptr [bp+nextch] ;
        and     si,0ffh                 ; nextch is only a byte
        mov     al,[bp+si+buffer]       ;
        pop     si inc     [bp+nextch]             ;
        and     [bp+nextch],BUFMSK      ;
        dec     [bp+nchs]               ;

ret endp    getch
;---------------------------------------------------------------
        proc    get_cmdln near
;       - read characters into cmdln until we get a LF.  If
;         we exceed the buffer length, discard everything
;         and make it a bad command.  process backspaces.
;       - si is zero
;       - last char of cmdln is a LF
;
;       subroutines: getch, puts, putch
;---------------------------------------------------------------
        xor     si,si                   ; clear si (n)
get_cmdln_a:
        call    getch                   ; get the chars into al
        cmp     al,BS                   ; is it a BS?
        jne     get_cmdln_b             ;   nope cmp     si,0                    ; any chars in cmdln?
        je      get_cmdln_a             ;   nope.

mov     bx,offset backup        ; backup message
        call    puts                    ; print it out
        dec     si                      ; reduce n by one
        jmp     short get_cmdln_a       ; got get another one.
get_cmdln_b:
        call    putch                   ; echo the char
        mov     [bp+si+cmdln],al        ; save it to the cmdln
        inc     si                      ; save n
```

```
        cmp     al,LF                   ; are we done? (CRs are made LF on out)
        jne     get_cmdln_c             ;   nope xor     si,si                   ; and clear si
        ret                             ; got the command line, got home
get_cmdln_c:
        cmp     si,CMDSIZ               ; have we exceeded the cmdln buffer?
        jl      get_cmdln_a             ;   nope, go get some more chars
get_cmdln_d:
        call    getch                   ; get the chars into al
        call    putch                   ; put the char in al out
        cmp     al,LF                   ; done echoing the garbage?
        jne     get_cmdln_d             ;   nope xor     si,si                   ; clear si
        mov     [bp+cmdln],'A'          ; a forced bad command.

mov     [bp+cmdln+1],LF         ; save off the line feed
        ret endp    get_cmdln ;--------------------------------------------------------------------
        proc    get_cmdln_ch near
;       - return the next command line character unless a
;          LF was seen, then return the LF again.
;--------------------------------------------------------------------
        mov     al,[bp+cmdln+si]        ; get next char in cmdln
        cmp     al,LF                   ; eol?
        je      get_cmdln_ch_exit       ;   yes, so don't increment si
        inc     si                      ; point to next char
get_cmdln_ch_exit:
        ret                             ; and return endp    get_cmdln_ch ;--------------------------------------------------------------------
        proc    get_cmdln_pch near
;       - skip spaces in the command line.  don't alter al.
;
;       subroutines: skip_space, get_cmdln_ch
;--------------------------------------------------------------------
        call    skip_space
        call    get_cmdln_ch
        ret endp    get_cmdln_pch ;--------------------------------------------------------------------
        proc    get_cmdln_word near
;       - return a sixteen bit number in the bx register.  Get
;          the characters from the command line. Assume the
```

;        number is hex.  If no number is found return 0 in bx
;           with the carry set, otherwise clear carry.
;
;        subroutines: skip_space, get_cmdln_ch, ishex
;-----------------------------------------------------------------------
        xor     bx,bx                   ; clear answer
        xor     cx,cx                   ; clear count
        call    skip_space              ; move up to first char
get_word_a:
        call    get_cmdln_ch            ; get a char
        call    ishexch                 ; is it a hex char?
        jc      get_word_b              ;    not a hex cha..

inc     cx                      ; number of digits seen
        shl     bx,4                    ; x 16 (only on 186's +)
        add     bx,ax                   ;  + digit
        jmp     short get_word_a        ; do it again
get_word_b:
        cmp     al,LF                   ; are we at a line feed?
        je      get_word_c              ;    yep
        dec     si                      ; otherwise put last char back
get_word_c:
        cmp     cx,0                    ; how many did we see?
        jne     get_word_d              ;    more than one.

stc                             ; got an error
        ret
get_word_d:
        clc                             ; assume we converted some digits
        ret endp    get_cmdln_word ;-----------------------------------------------------------------------
        proc    skip_space near
;       - skip spaces in the command line.  don't alter al.
;-----------------------------------------------------------------------
        mov     al,[bp+cmdln+si]        ; get next char in cmdln
        cmp     al,SPA                  ; get next char in cmdln a space?
        jne     skip_spa_a              ; nope.
        inc     si                      ; point to next char
        jmp     short skip_space
skip_spa_a:
        cmp     al,LF                   ; is it a line feed?
        ret endp    skip_space ;-----------------------------------------------------------------------
        proc    chk_eol near
;       - get the next command line char.  if we are at
;         EOF return, otherwise complain and return to
;         the callers caller.

```
;       subroutines: get_cmdln_ch, puts
;-----------------------------------------------------------------
        call    get_cmdln_pch           ; last cmp was al to LF
        je      chk_eol_exit            ; nope.
        pop     ax                      ; stack should have callers caller.
        mov     bx,offset em_extarg     ; error message
        call    puts                    ; and print it out
chk_eol_exit:
        ret endp    chk_eol ;-----------------------------------------------------------------
        proc    ishexch near
;       - if al is 0-9, A-F ascii, return the binary value
;         and a clear carry.  Otherwise set carry and return.
;         Be sure to clear ah.
;       - ah = 0, al has binary value.  Carry set or cleared
;-----------------------------------------------------------------
        xor     ah,ah                   ; clear high part
        cmp     al,'F'                  ; is it greater than F?
        jg      ishexch_bad             ;   yep
        cmp     al,'0'                  ; is it less than a zero?
        jl      ishexch_bad             ;   yep
        cmp     al,':'                  ; is it a colon?
        je      ishexch_bad             ;   yep
        sub     al,'0'                  ; make it 0-9, 17-22
        cmp     al,0ah                  ; is it 0-9?
        jl      ishexch_good            ;   yep
        sub     al,7                    ; subtract another 7 to get 10-15.
ishexch_good:
        clc                             ; it is a good char
        ret
ishexch_bad:
        stc                             ; bad character
        ret endp    ishexch ;-----------------------------------------------------------------
        proc    putbyt near
;       - output what is in al as two hex digits
;
;       subroutines: putch
;-----------------------------------------------------------------
        mov     ah,al                   ; save high part
        shr     al,4                    ; get upper nibble and     al,0fh                  ; mask off any unused bits
        cmp     al,0ah                  ; test for alpha or numeric
        jl      num1                    ; take the branch if numeric
        add     al,7                    ; add the adjustment for hex alpha
```

```
num1:
        add     al,'0'              ; add the numeric bias
        push    ax                  ;
        call    putch               ; send to the console
        pop     ax mov     al,ah               ; get low part and     al,0fh              ; mask off any unused bits
        cmp     al,0ah              ; test for alpha or numeric
        jl      num2                ; take the branch if numeric
        add     al,7                ; add the adjustment for hex alpha
num2:
        add     al,'0'              ; add the numeric bias
        call    putch               ; send to the console
        ret                         ; exit endp    putbyt ;--------------------------------------------------------------------
        proc    puts near
;       - put out string pointed to by cs:bx.
;
;       subroutines: putch
;--------------------------------------------------------------------
        mov     al,cs:[bx]
        cmp     al,0
        je      puts_a
        call    putch
        inc     bx
        jmp     short puts
puts_a:
        ret endp    puts ;--------------------------------------------------------------------
        proc    putch near
;       - wait till we don't have an xoff, and the last character
;          has transmitted before sticking the char into the buffer.
;       - CR's are transmitted as two characters, CR, LF. al will
;          return with a LF in it.
;--------------------------------------------------------------------
        push    dx                  ; this is for modem
        mov     ah,al               ; save putch(al) to ah
putch_a:
        cmp     [bp+xmoff],1        ; can we send?
        je      putch_a             ;   no!

IFDEF   DOS
        mov     al,ah               ;
        call    dos_putch           ;
ELSE
        test    [bp+flags],USE_MODEM ; are we connected to the modem?
```

```
        jz      putch_b                 ;   nope mov     dx,MSR                  ; what is the
        in      al,dx                   ; the status of CTS?
        test    al,10h                  ; is it high?
        jz      putch_a                 ;   no, wait till it goes high mov     dx,LSR                  ; wait till the transmit shift
        in      al,dx                   ; register and transmit hold
        and     al,60h                  ; registers are empty.
        cmp     al,60h                  ; are they empty?
        jne     putch_a                 ;   no, wait till it empties mov     dx,RBR                  ; place to put the char
        mov     al,ah                   ; char to send
        out     dx,al                   ; now send it on its way.

jmp     short putch_c           ; jump around the SCU code putch_b:
        in      al,SST                  ; is the buffer empty?
        and     al,1                    ;
        jz      putch_a                 ;   no mov     al,ah                   ;
        out     SBUF,al                 ; putch
ENDIF
putch_c:
        cmp     al,CR                   ; was that last char a cr?
        jne     putch_d                 ;   nope.

mov     ah,LF                   ; always put out a lf after a cr.
        jmp     short putch_a           ; and do it again
putch_d:
        pop     dx                      ; this if for modem
        ret endp    putch ;------------------------------------------------------------------
        proc    watch_dog_service
;       - set the watch dog
;       - reinitialize timer 0
;------------------------------------------------------------------
        push    ax mov     [bp+tareg],0aah         ; begin timed access; ints disabled
        mov     [bp+tareg],055h         ; end timed access
        or      [bp+rireg],80h          ; reset watch dog mov     al,020h                 ; Set timer 0 to mode 0, binary
        out     TMD,al                  ; but mostly, clear TOUT0
```

```
            mov     al,0ffh                 ; ff00 counts
            out     TCT0,al                 ;

mov     al,20h                  ; do a non specific
            out     IRR,al                  ; End of Interrupt IFDEF       PROTO
            push    dx                      ; turn off the watch dog
            mov     dx,0140h                ; it is at 140h
            mov     al,0ffh                 ; most anything will clear it.
            out     dx,al
            pop     dx inc     byte ptr [bp]           ; First byte of ram
            mov     al,[bp]                 ; nothing should be here
            out     40h,al                  ; to display 1
ENDIF pop     ax
            iret endp    watch_dog_service ;---------------------------------------------------------------------
            proc    ACE_8250_service
;           - serial interrupt service
;
;           subroutines: continue with generic serial loading
;---------------------------------------------------------------------
            push    ax                      ; save ax, we are going to destroy it mov     al,20h                  ; allow another interrupt now
            out     IRR,al                  ; by clearing ICU
            sti                             ; and enabling ints push    dx                      ; dx is used for IO address mov     dx,RBR                  ; read buffer and
            in      al,dx                   ; clear ints maybe
            mov     ah,al                   ; save input char into ah mov     dx,IIR                  ; this clears ints on some 8250's
            in      al,dx                   ; just to be sure!

mov     dx,MSR                  ; DSR has to be low
            in      al,dx                   ; for this to be a valid char
            test    al,20h                  ; what is DSR status
IFDEF       USE_IRQ4
            nop
            nop
ELSE
            jnz     ACE_invalid             ;   if 1, then invalid char
```

ENDIF

```
        test    [bp+flags],USE_MODEM    ; has the modem been validated?
        jnz     ACE_continue            ;   yep.

;----------------------------------------------------------------
;       ACE validated.
;       - set USE_MODEM bit
;       - disable SCU interrupts
;       - return through restart
;----------------------------------------------------------------
        cli                             ; timer may if i don't diable them
        mov     [bp+tareg],0aah         ; begin timed access; ints disabled
        mov     [bp+tareg],055h         ; end timed access
        or      [bp+flags],USE_MODEM    ; modem is now available
        sti                             ; allow int again IFDEF   USE_IRQ4
        mov     al,0eeh                 ; timer0 and 8250 (irq0, irq4)
ELSE
        mov     al,0f6h                 ; timer0 and 8250 (irq0, irq3)
ENDIF
        out     IMR,al                  ; no SCU (irq1)

pop     dx                      ; restore it,
        pop     ax                      ; trash the input char
        pop     ax                      ; old offset
        mov     ax,offset restart       ; address to restart at
        push    ax                      ; new place to return to
        iret                            ; I got to get out of this place...

ACE_continue:
        mov     al,ah                   ; restore input char
        pop     dx                      ; restore, since nobody else uses it jmp     generic_serial          ; continue with generic processing ACE_invalid:                            ; DSR is low, don't use input
        pop     dx                      ; clear the stuff we
        pop     ax                      ; pushed
        iret                            ; and go on back endp    ACE_8250_service ;----------------------------------------------------------------
        proc    SCU_service
;       - serial interrupt service for V40 SCU.
;       - detect break and restart
;
;       subroutines: generic_serial (just fall through)
;----------------------------------------------------------------
        push    ax                      ; save ax, we are going to destroy it

IFDEF   DOS
```

```
            mov     ah,8        ; DOS
            int     21h         ; DOS
ELSE
            mov     al,20h                  ; allow another interrupt now
            out     IRR,al
            sti                             ;

in      al,SST                  ; Serial Port Status
            test    al,040h                 ; This a break?
            jz      scu_a                   ;   nope.
scu_brk:
            in      al,SST                  ; Wait till break
            test    al,40h                  ;   goes away
            jnz     scu_brk mov     al,035h                 ; Clear Errors
            out     SCM,al                  ;
            in      al,SBUF                 ; clear Receive buffer pop     ax                      ; junk we saved
            pop     ax                      ; old return offset
            mov     ax,offset main          ; address to restart at
            push    ax                      ; where we will restart
            iret                            ;
scu_a:
            test    al,038h                 ; framing, parity, or overrun error?
            jz      scu_b                   ;   nope, process the char mov     al,035h                 ; Clear Errors
            out     SCM,al                  ;
            in      al,SBUF                 ; clear Receive buffer jmp     short generic_x
scu_b:                                      ;
            in      al,SBUF                 ; Receive buffer to al
ENDIF
                                            ; fall through to the generic stuff
            endp    SCU_service ;-----------------------------------------------------------------
            proc    generic_serial
;       - process the input character for the serial input.
;       - check for xon/xoff and set appropriate byte
;       - check for control c, and return to restart
;       - validate input character and insert if it is ok.
;-----------------------------------------------------------------
            cmp     al,XON                  ; start flow?
            jne     generic_a               ;
            mov     [bp+xmoff],0            ; clear our flag
            jmp     short generic_x         ;
generic_a:                                  ;
            cmp     al,XOFF                 ; stop flow?
            jne     generic_b               ;
```

```
        mov     [bp+xmoff],1        ;
        jmp     short generic_x     ;
generic_b:                          ;
        cmp     al,CTRLC            ; Did they abort?
        jne     generic_c           ;

pop     ax                  ; thing we saved
        pop     ax                  ; old offset
        mov     ax,offset restart   ; address to restart at
        push    ax                  ; new place to return to
        iret                        ; I got to get out of this place...
generic_c:
        push    bx                  ; save it
        mov     bx,offset xtab      ; translation table offset
        and     al,7fh              ; make sure it is 0-127
        xlat    cs:xtab             ; ds changes in fill,crc and dump
        pop     bx                  ; restore it, we are done
        cmp     al,0                ; zero when throw away character
        je      generic_x           ;

IFDEF   PROTO
        push    ax                  ; output number
        mov     al,[bp+nchs]        ; of chars input buffer
        out     060h,al             ; to display 2
        pop     ax                  ; as a diagnostic
ENDIF
        cmp     [bp+nchs],BUFSIZ    ; any room left?
        jge     generic_x           ;   nope, discard the character mov     [bp+di+buffer],al   ;
        inc     [bp+nchs]           ;
        inc     di                  ;
        and     di,BUFMSK           ;
generic_x:
        pop     ax
IFDEF   DOS
        ret
ELSE
        iret
ENDIF
        endp    generic_serial IFDEF   DOS
;----------------------------------------------------------------
        proc    dos_putch
;       - put out char in al.  cr's are converted to lf
;----------------------------------------------------------------
        push    dx
        push    ax
        mov     dl,al
        mov     ah,2
        int     21h
        pop     ax
```

```
        pop     dx ret endp    dos_putch
ENDIF

;-------------------------------------------------------------------
        proc    NMI_service
;       - Non Maskable Interrupt service
;       - Poll Low Voltage Detect while it is high, and do
;           an IRET as soon as it goes low.
;-------------------------------------------------------------------
        mov     [bp+tareg],0aah     ; begin timed access, ints disabled
        mov     [bp+tareg],055h     ; end timed access
        or      [bp+rireg],80h      ; reset watch dog
        nop                         ; let the timed access close
        nop                         ; let the timed access close
        nop                         ; let the timed access close
        test    [bp+rireg],20h      ; check the LVD bit
        jnz     NMI_service         ; wait till it goes low iret endp    NMI_service ;-------------------------------------------------------------------
        proc    do_nothing_service
;       - don't do anything on vector 0, 1, 3, 4, 5, 6, and
;           7 interrupts.
;
;       outputs: none
;
;       variables:
;
;       subroutines:
;-------------------------------------------------------------------
        iret endp    do_nothing_service ;-------------------------------------------------------------------
;       strings.asm
;-------------------------------------------------------------------
banner          db      CR
                db      "DS5340 SERIAL LOADER VA.0.0  COPYRIGHT (C) 1990, "
                db      "DALLAS SEMICONDUCTOR", 0
badcrc          db      CR, " - BAD CRC DETECTED -", 0
reg_string      db      'MCWDMOPO',0
mcreg_str       db      'MC:', 0
wdreg_str       db      ' WD:', 0
moreg_str       db      ' MO:', 0
poreg_str       db      ' PO:', 0
```

```
prompt          db      CR, "> ", 0
backup          db      BS, " ", BS, 0
crcmsg          db      "CRC = ", 0
onmsg           db      "ON", 0
offmsg          db      "OFF", 0
un_avail_msg    db      "UN"
avail_msg       db      "AVAILABLE", 0
mod_avail_msg   db      CR, " MODEM AVAILABLE", 0
crc1_msg        db      CR, " CRC 1 > ", 0
crc2_msg        db      CR, " CRC 2 > ", 0 fresh_err       db      "RELOAD PIN MUST BE ACTIVE TO ENABLE FRESHNESS",0
fresh_msg       db      "POWER DOWN TO MAINTAIN FRESHNESS",CR,0
nofresh_msg     db      "DID NOT CONFIRM",0
confirm         db      "CONFIRM: ", 0
fresh           db      "FRESH", LF ih_endrec       db      ":00000001FF", CR, 0
ih_segrec       db      ":02000002", 0 em_argreq       db      "E:ARGREQ", 0
em_badadr       db      "E:BADADR", 0
em_badadr0      db      "E:BADADR-MODE 0", 0
em_badcks       db      CR, "E:BADCKS ", 0
em_badcmd       db      "E:BADCMD", 0
em_badlen       db      CR, "E:BADLEN ", 0
em_badrec       db      CR, "E:BADREC ", 0
em_extarg       db      "E:EXTARG", 0
em_illopt       db      "E:ILLOPT", 0
em_memver       db      CR, "E:VERIFY ", 0
em_nothex       db      CR, "E:NOTHEX ", 0
em_badreg       db      'E:BADREG',0 xtab    db      0,0,0,0,0,0,0,0,   BS,SPA,0,0,0,CR,0,0
        db      0,0,0,0,0,0,0,0,   0,0,0,0,0,0,0,0
        db      SPA,0,0,0,0,0,0,0, 0,0,0,0,0,0,0,0
        db      '0123456789:',     0,0,0,0,0
        db      0, 'ABCDEFGHIJKLMNO'
        db      'PQRSTUVWXYZ',     0,0,0,0,0
        db      0, 'ABCDEFGHIJKLMNO'
        db      'PQRSTUVWXYZ',     0,0,0,0,BS DS2219_init:    ; bytes used to init DS2219 DRAM SipStick
                ; page 670, 1989 Data Book
                ; these bytes are obtained by 0c0h or (byte shl 2)
        db      0C0h, 0D0h, 0C4h, 0D4h, 0DCh, 0DCh, 0C4h, 0C8h
        db      0D8h, 0DCh, 0D8h, 0C4h, 0C8h, 0CCh, 0D4h, 0D0h
        db      0D4h, 0CCh, 0D4h, 0C8h, 0DCh, 0CCh, 0DCh, 0D0h EVENDATA
ab_table:       ;Test   RL    N Delay   ; 14.3 or 19.6 MHz
        dw      0fff8h,  8,   8,  5     ; 28.8 or 38.4
        dw      0fff4h, 12,  13, 14     ; 19.2 or 25.6
```

```
        dw      0fff0h,   16,   18,   20   ;  1.4 or 19.2
        dw      0ffe9h,   23,   27,   33   ;  9600 or 13.6
        dw      0ffe1h,   32,   38,   45   ;  7000 or 9600
        dw      0ffa8h,   93,  117,  130   ;  2400 or 3303
        dw      0ff88h,  128,  161,  170   ;  1748 or 2400
        dw      0ff51h,  186,  236,  270   ;  1200 or 1652
        dw      0ff10h,  256,  325,  400   ;   874 or 1200
        dw      0fd40h,  746,  952, 1200   ;   300 or  412
        dw      0fc40h, 1024, 1308, 1400   ;   218 or  300
        dw           0,    0,    1,    1   ; last entry (Break or slow baud rate)

cmd_table:
        dw      bad_cmd         ; a
        dw      bad_cmd         ; b
        dw      crc             ; c
        dw      dump            ; d
        dw      exit            ; e
        dw      fill            ; f
        dw      bad_cmd         ; g
        dw      bad_cmd         ; h
        dw      bad_cmd         ; i
        dw      bad_cmd         ; j
        dw      klear_crcs      ; k
        dw      load            ; l
        dw      modem_avail     ; m
        dw      freshness       ; n
        dw      bad_cmd         ; o
        dw      bad_cmd         ; p
        dw      bad_cmd         ; q
        dw      read            ; r
        dw      bad_cmd         ; s
        dw      toggle          ; t
        dw      bad_cmd         ; u
        dw      verify          ; v
        dw      write           ; w
        dw      bad_cmd         ; x
        dw      bad_cmd         ; y
        dw      bad_cmd         ; z IFDEF   EXIT_ROM
exit_rom_msg:   db      CR,'--Exiting Rom--',CR
ENDIF
rom     ends end     reset
```

Exiting Control Software Execution

The control software can be exited in the following ways:

- By clearing the "ROM" bit in the adjunct chip's RAM: This automatically causes a reset to be issued, following which the microprocessor will be allowed to run in application mode.

- By driving the RL* pin high: the positive edge on the RL* pin will clear the *ROM* bit.

Exiting Control Software Execution
The control software can be exited in the following ways:
By clearing the "ROM" bit in the adjunct chip's RAM: This automatically causes a reset to be issued, following which the microprocessor will be allowed to run in application mode.
By driving the RL* pin high: the positive edge on the RL* pin will clear the ROM bit.

Memory Map Seen by the Microprocessor

The memory map, as seen by the microprocessor, will differ depending on whether the microprocessor is running control software or user software. Moreover, the memory maps used are different for the various target microprocessors.

Memory Map Adaptations for Different Processors

Figures 1, 3A:
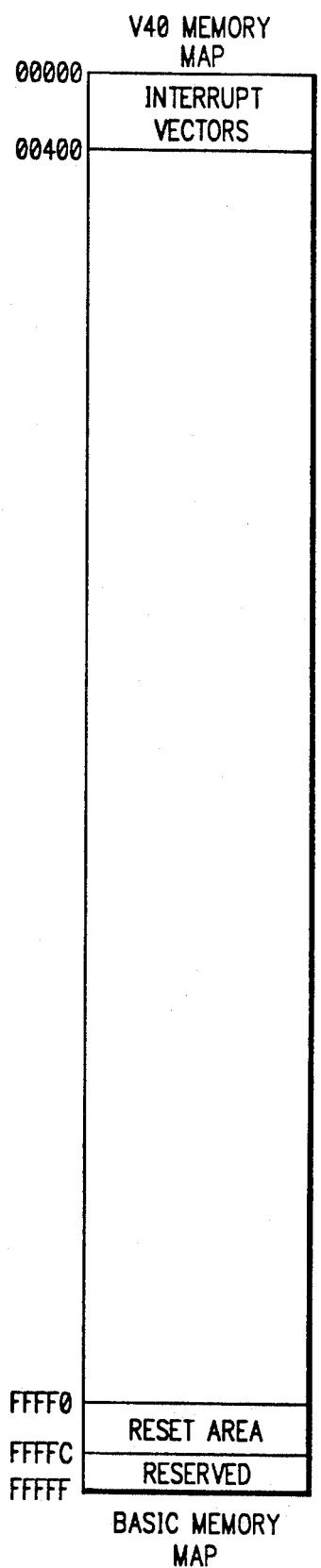
Figures 2, 3A:
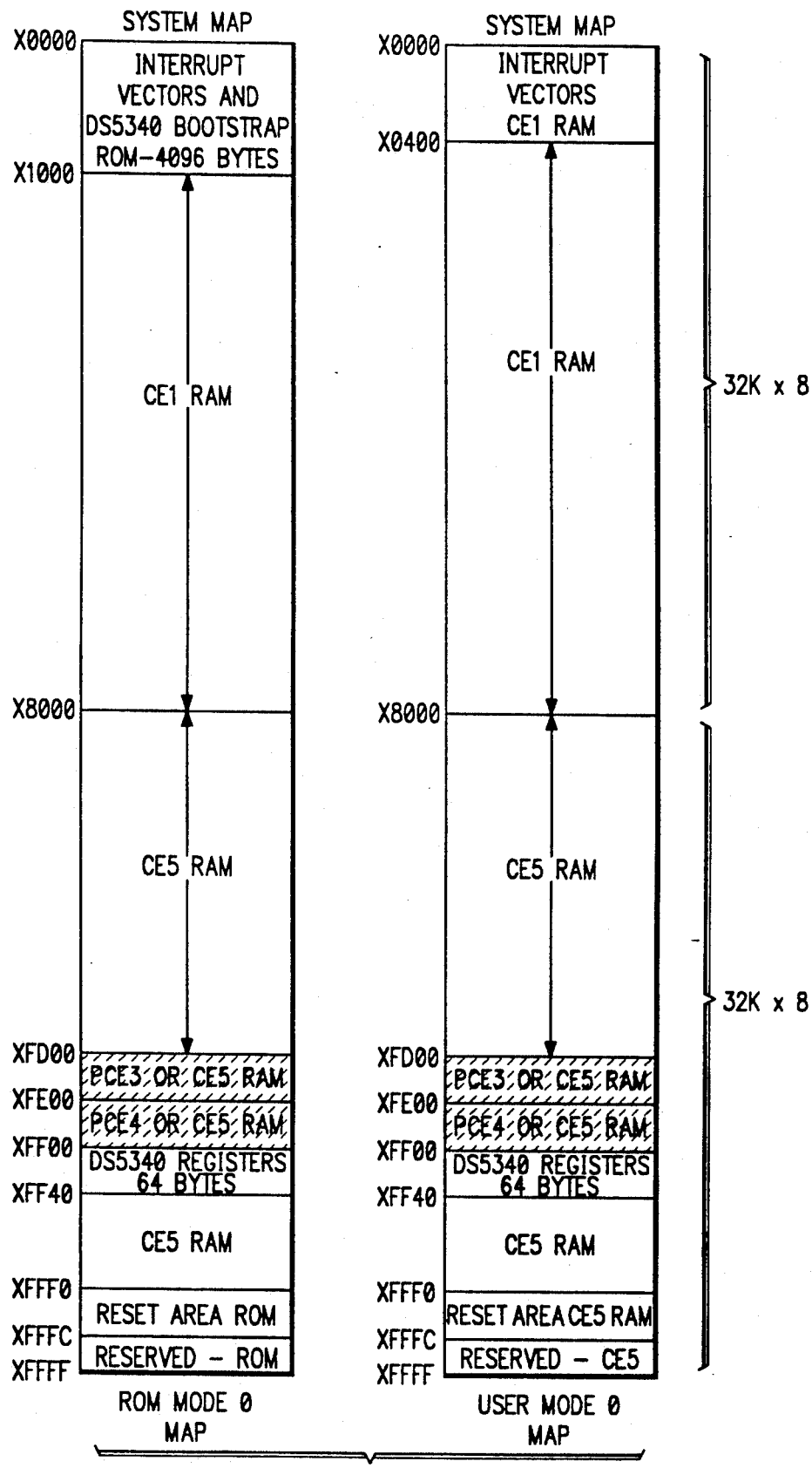

FIG. 3A-1 shows the memory map normally used in a V40 microprocessor. Addresses from $00000_H$[3] to $00400_H$ are normally used for interrupt vectors. Addresses from $00400_H$ to $FFFF0_H$ are available for data or program memory. Addresses $FFFF0_H$ through $FFFFC_H$ are used for reset information, and the remaining higher addresses are reserved.

[3]The subscript H is used herein to denote a hexadecimal number. Thus, for example, $400_H = 1024$.

Figures 3, 3A:
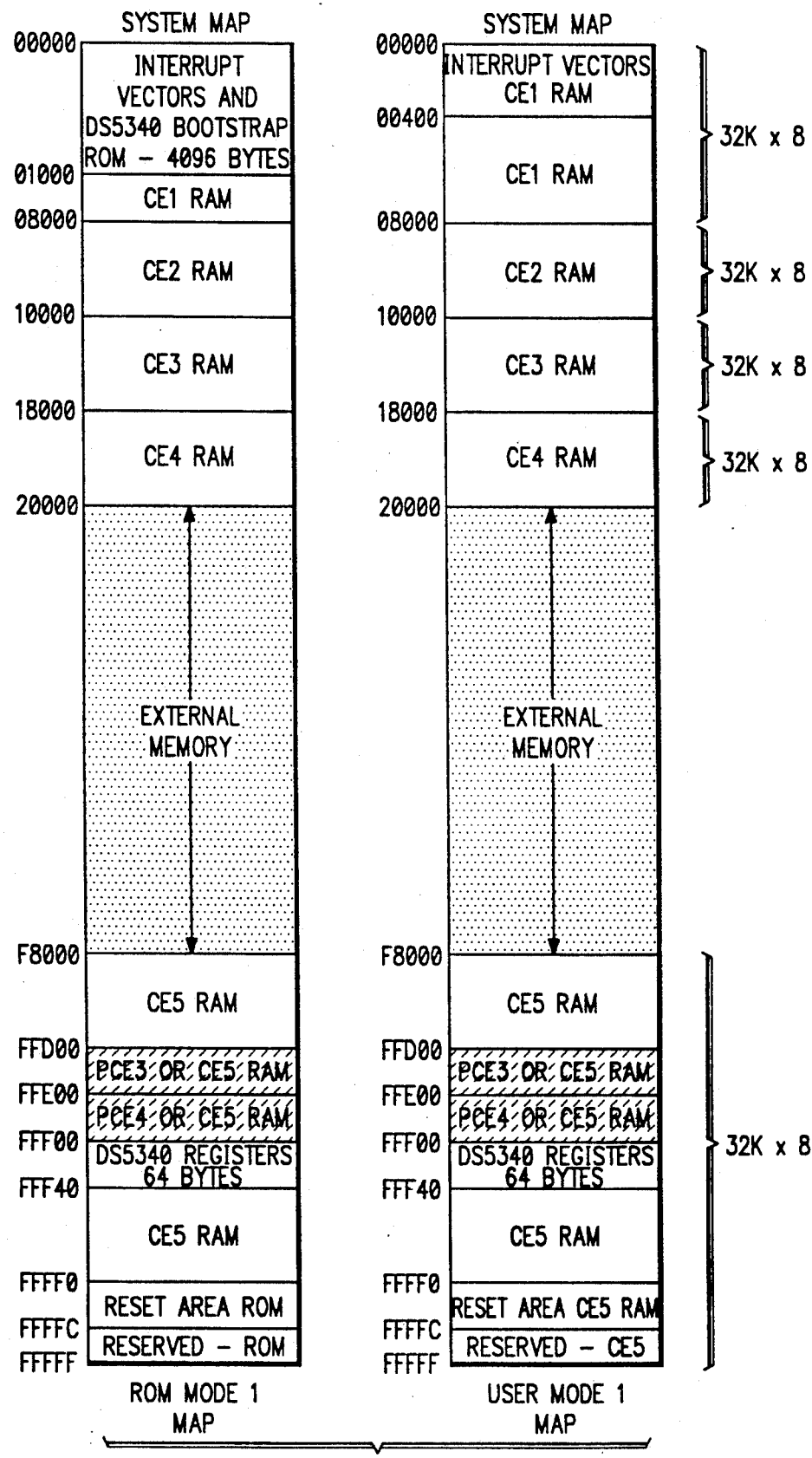

This basic map of the V40 processor is modified in the operation of the system of FIGS. 1A-1 and 1A-2 several ways. FIGS. 3A-2, 3A-3, 3A-4, 3A-5, and 3A-6 show five modes of operation. These modes are selectable to accommodate various memory configurations. FIG. 3A-2 shows control and user software operating modes in mode 0, where the RAM configuration is two 32K×8 memories. FIG. 3A-3 shows control and user software memory assignments for a system which has five 32K×8 RAMs. (In this configuration, a full 1M (20 bits) of address space is available. The five 32K memories pick up only a fraction of this address space, and the remainder is available for use by external memory. The five 32K memories are each separately controlled by chip-enable lines CE1* through CE5*.

Figures 3, 3A, 4:
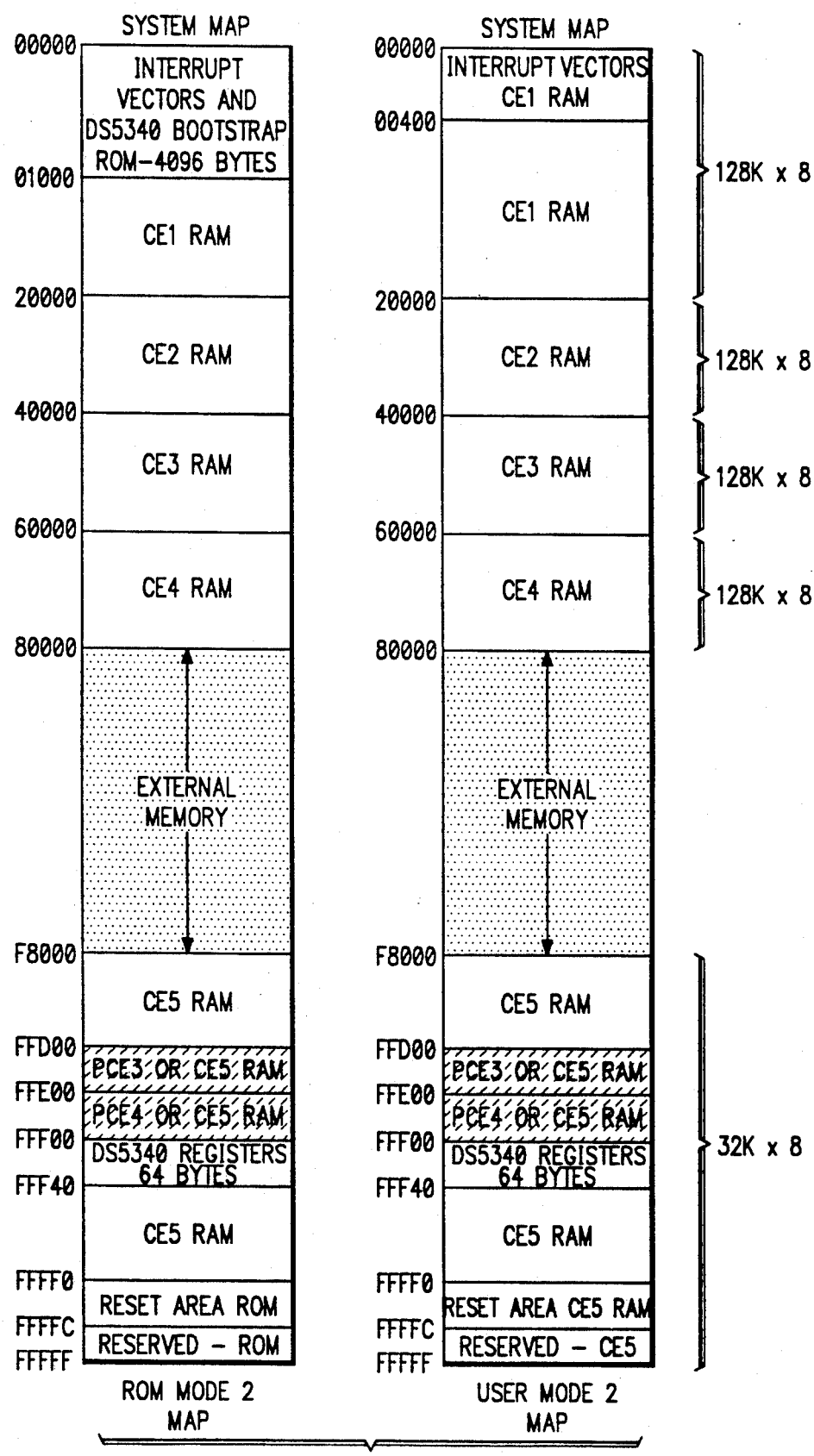
Figures 3, 3A, 4, 5:
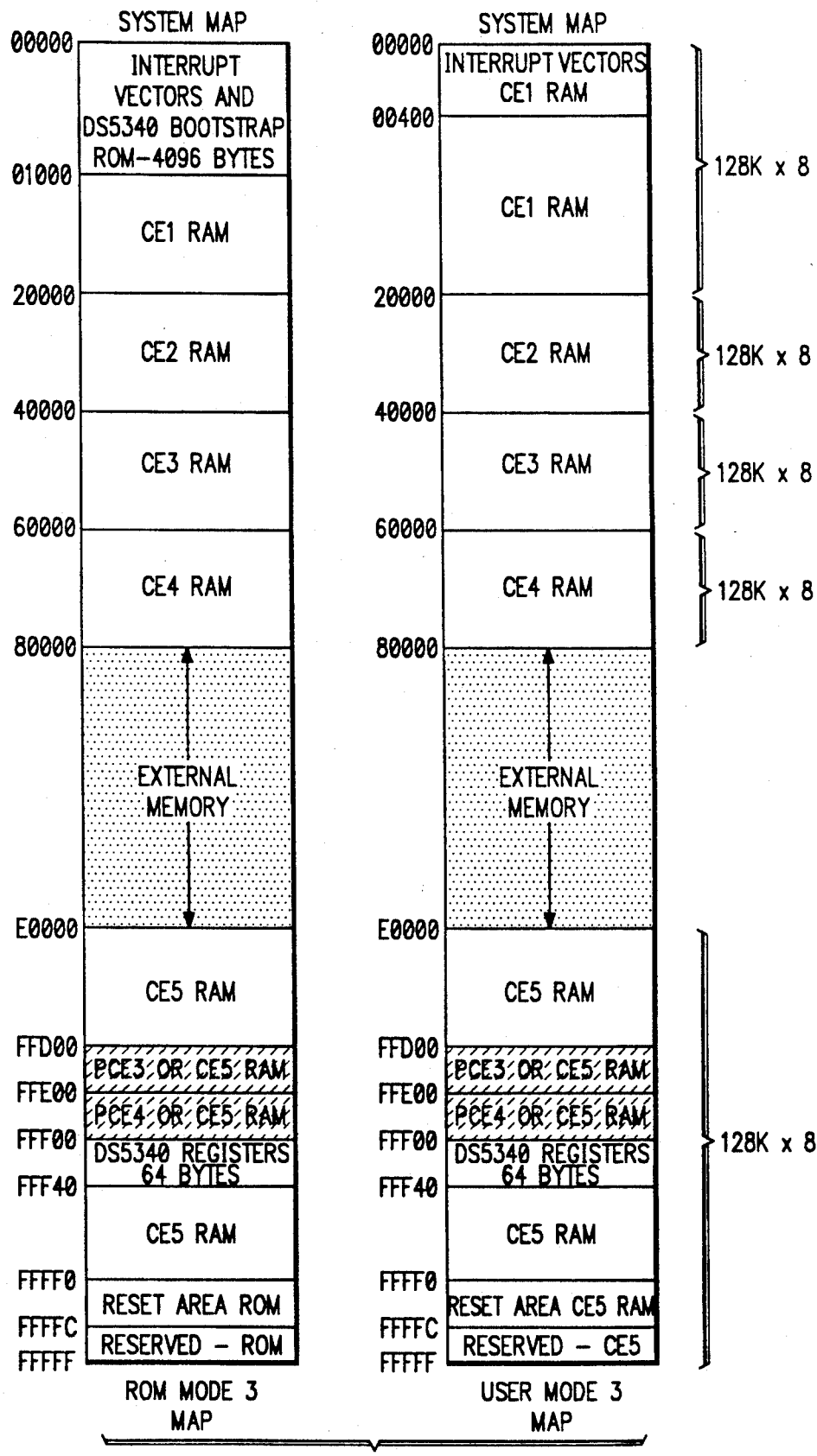
Figures 3, 3A, 4, 5, 6:
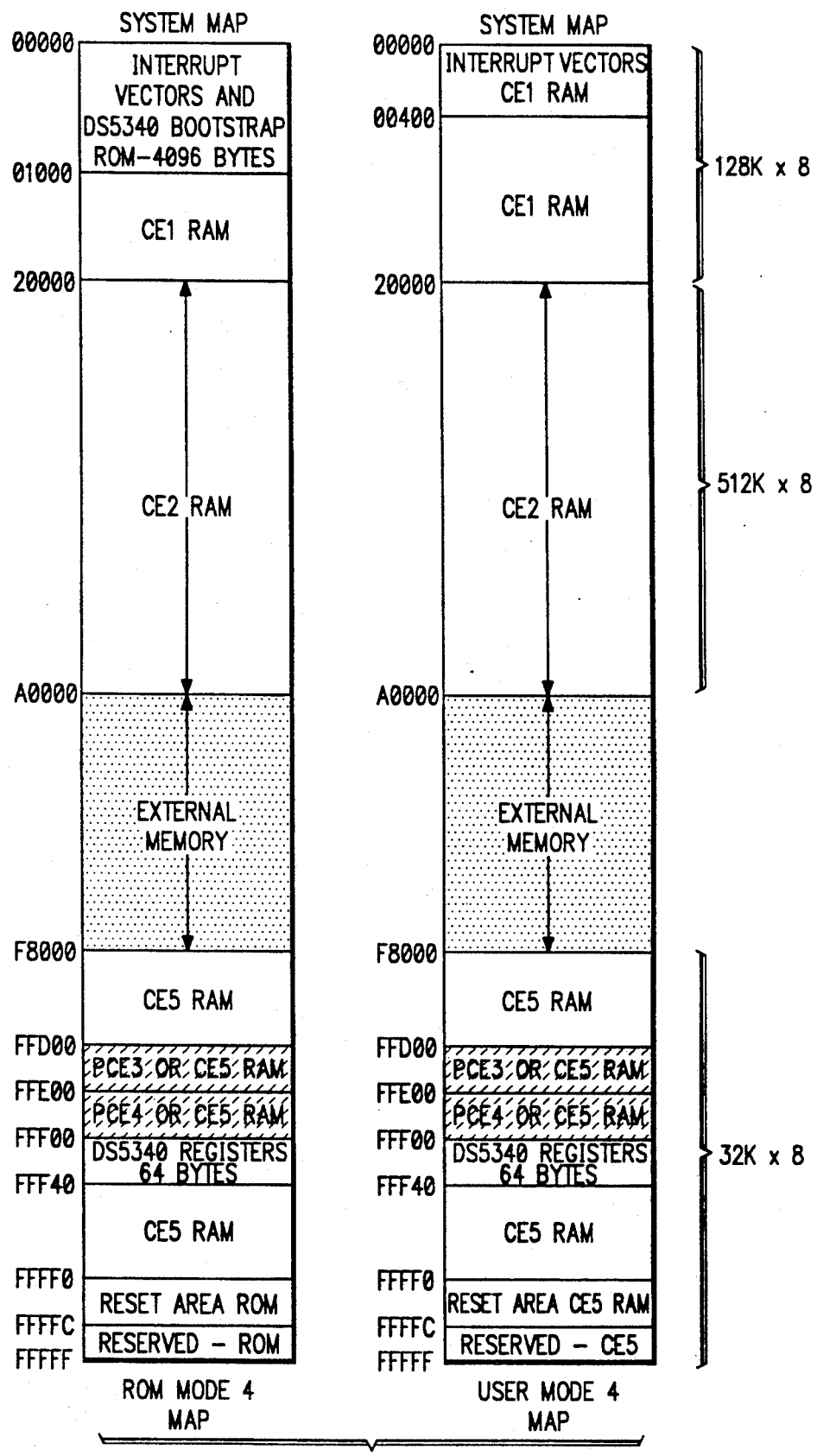

FIG. 3A-4 shows an operating mode which is generally similar to that of FIG. 3A-3, except that four 128K×8 memories and one 32K memory are used. Thus, 480K remain for external memory. Similarly, FIG. 3A-5 shows memory mapping for a case where chip-enable signals CE1*, CE2*, CE3*, CE4*, and CE5* each control a 128K memory. FIG. 3A-6 shows control and user software memory maps for Mode 4, wherein CE1* controls a 128K×8 memory, CE2* controls a 512K×8 memory, and CE5* controls a 32K×8 memory. Thus, in this example, 352K of address space remains to be allocated to external memory.

Figures 1, 3B:
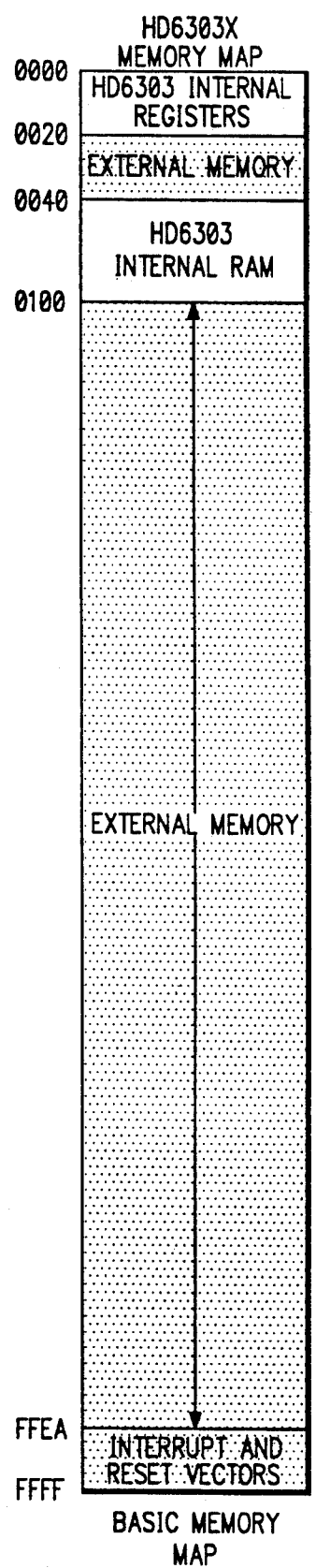
Figures 2, 3B:
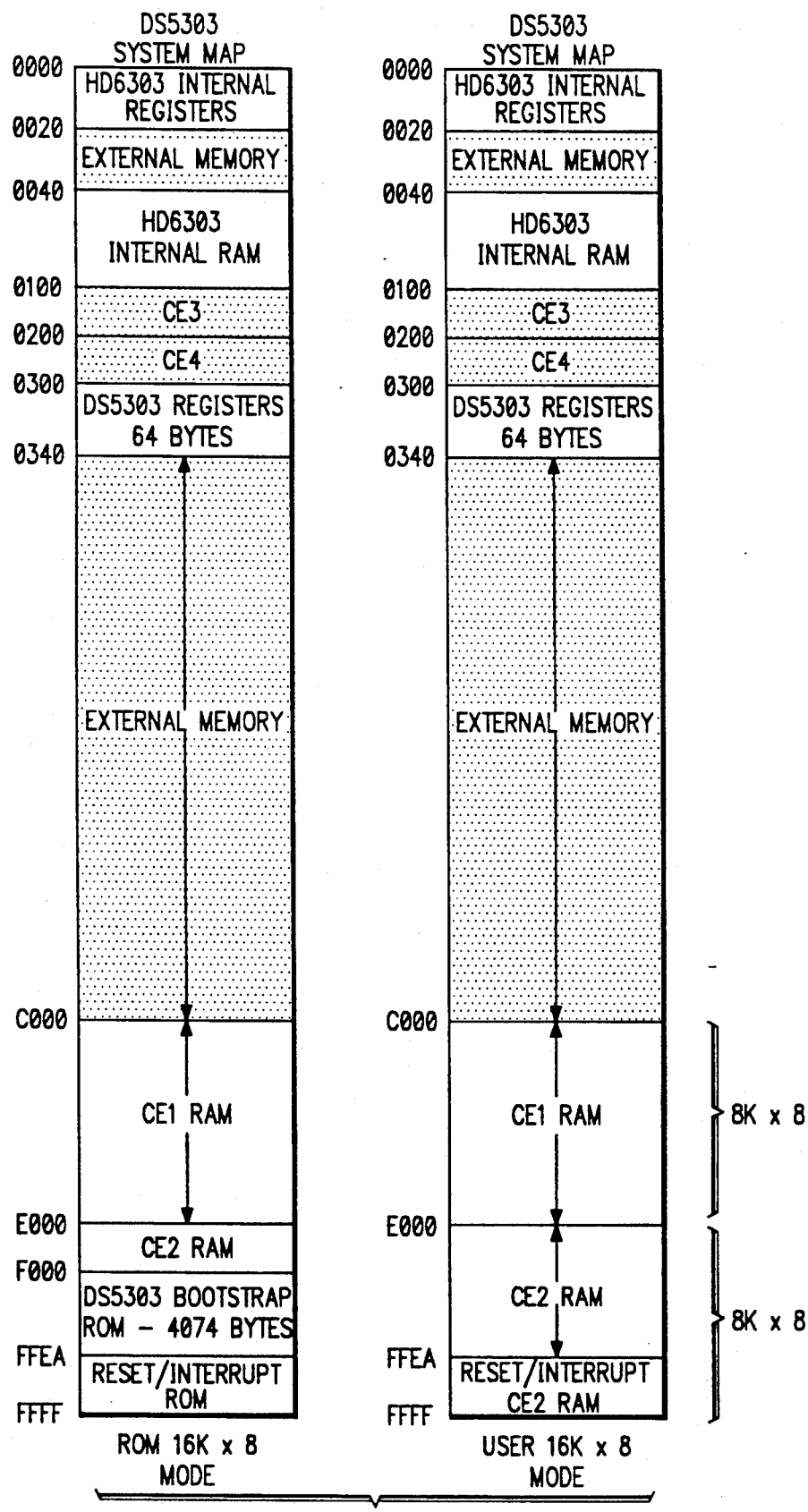
Figures 3, 3B:
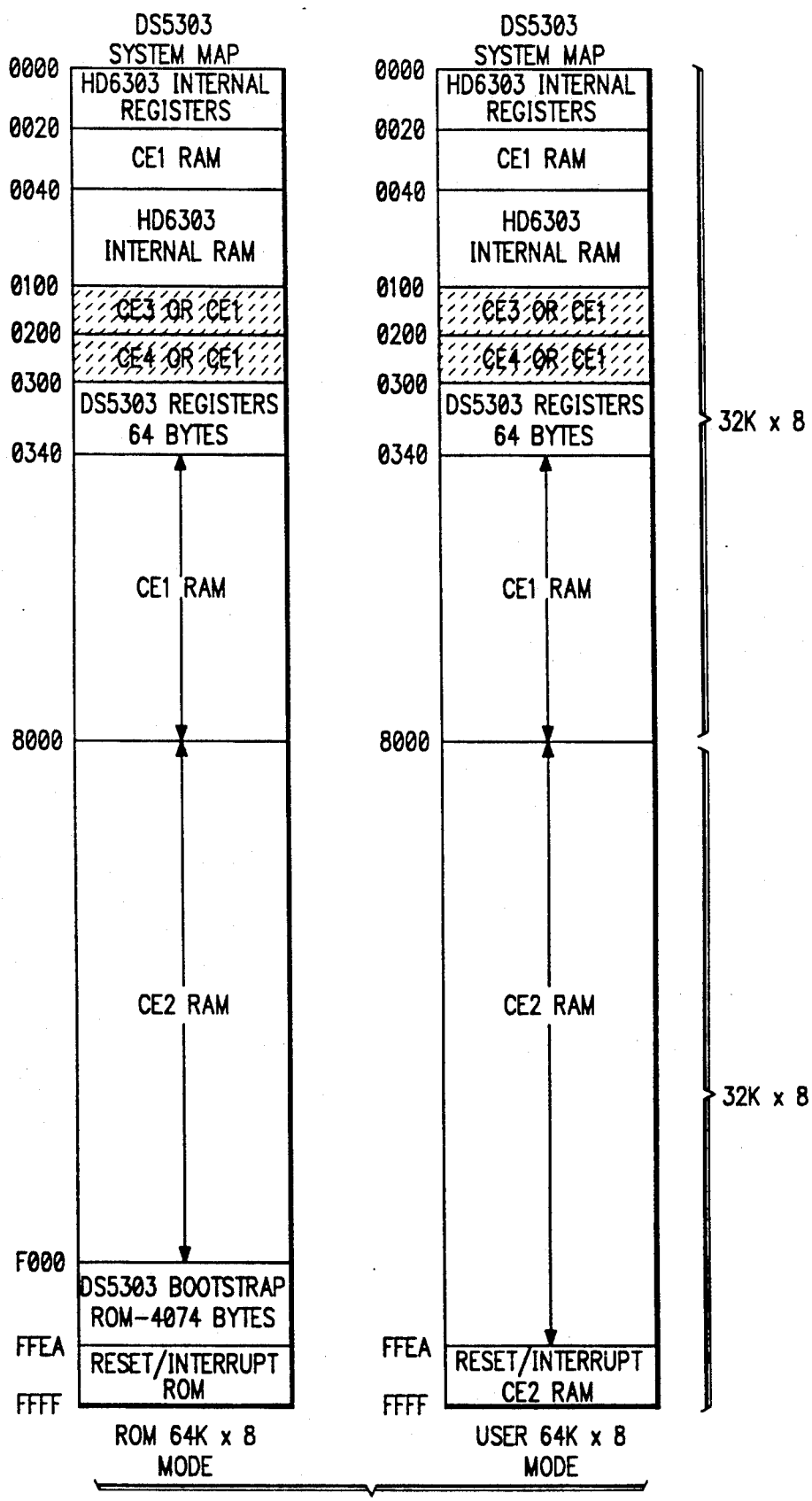

FIGS. 3B-1 through 3B-3 show memory maps used with a 6303X microprocessor. (This is the microprocessor shows in the example of FIGS. 2A-1 and 2A-2. However, it is now contemplated that use of the 6303Y microprocessor may be more advantageous.) FIG. 3B-1 shows the basic memory map of the HD6303X. Addresses from $0000_H$ to $0020_H$ are used for internal registers. Addresses from $0020_H$ to $0040_H$ and $0100_H$ to $FFEA_H$ are used for external memory. Addresses $0040_H$ to $0100_H$ are used for internal random access memory. Addresses $FFEA_H$ to $FFFF_H$ are used for interrupt and reset vectors.

FIG. 3B-2 shows how this address space is reallocated in a first mode, where 16K bytes are controlled by chip enables CE1* and CE2*, in control software operation and user software operation.

FIG. 3B-3 shows how the 64K of address space of the 6303 is remapped in a different operating mode, wherein 64K bytes of RAM are locally available. In this case, note that no space for external memory is available.

Figures 1, 3C:
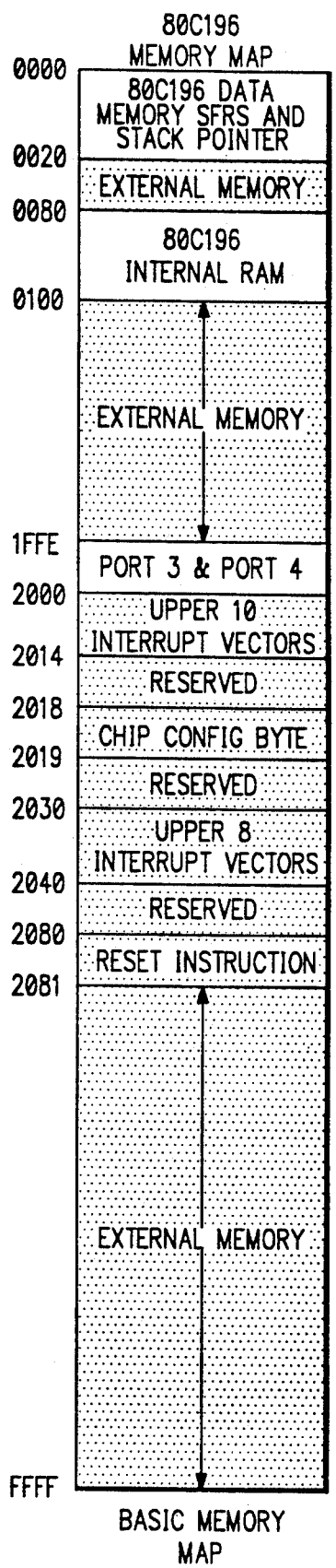
Figures 2, 3C:
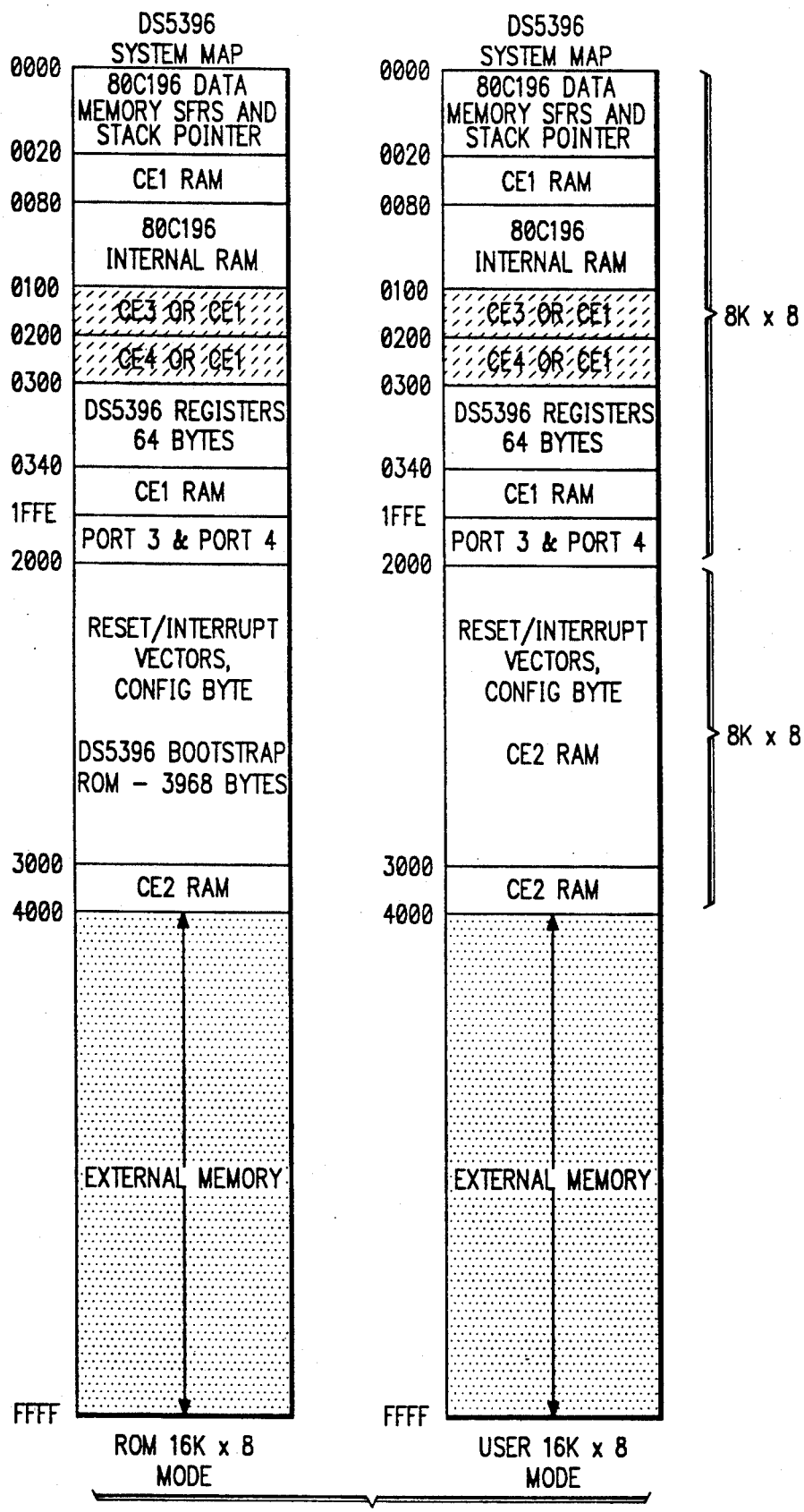
Figures 3, 3C:
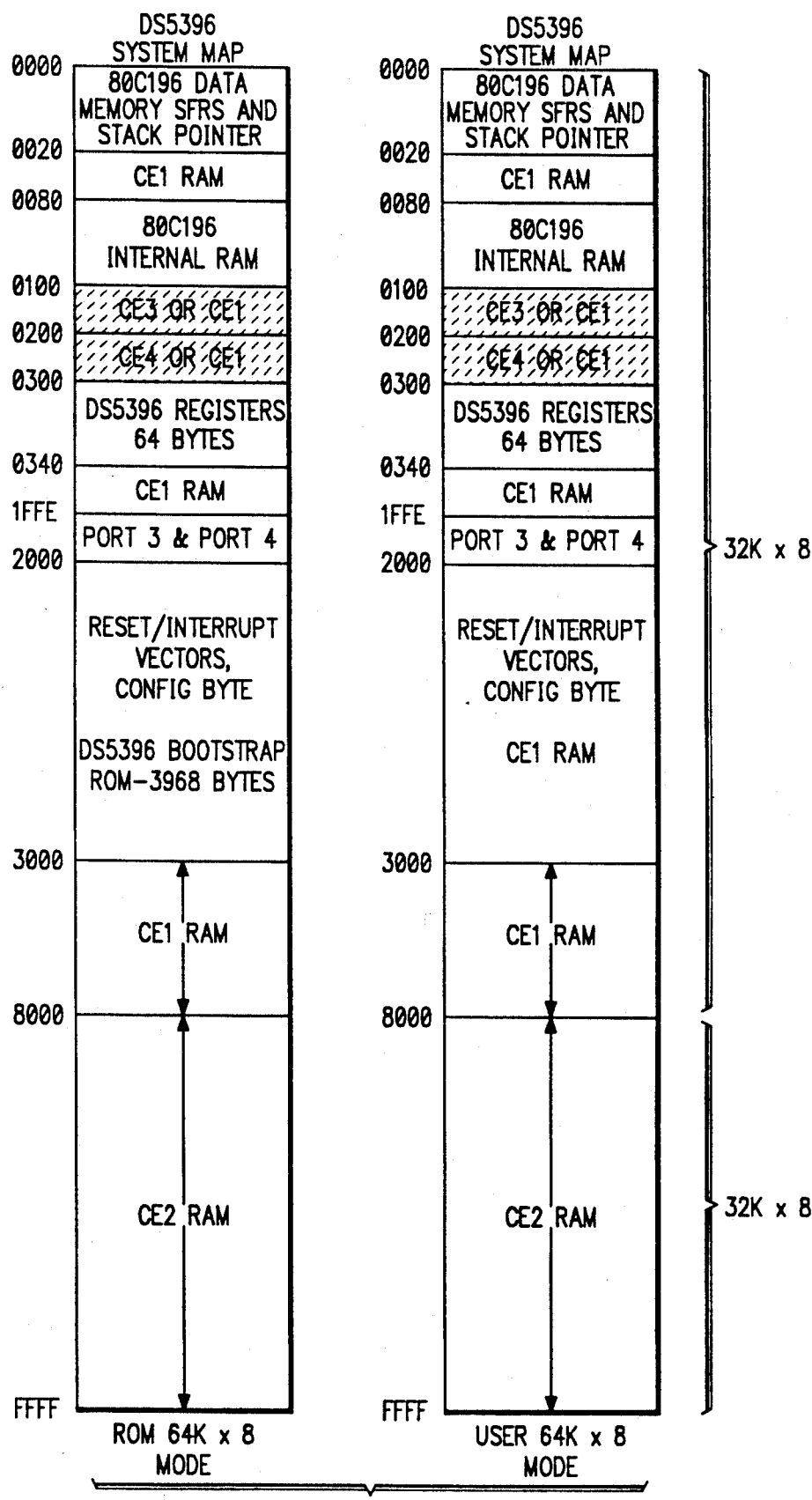

FIGS. 3C-1, 3C-2, and 3C-3 show remapping for an Intel 80C196 microprocessor. As shown in FIG. 3C-1, the basic memory map of this microprocessor is 64K, and is mapped as shown.

FIG. 3C-2 shows how this memory space is remapped in a system which combines an 80C196 with an adjunct chip as disclosed herein, in a module which includes two 8K×8 RAMs. Addresses $0000_H$ to $0020_H$ are used for 80C196 data memory, SFRS, and stack pointer. Addresses $0020_H$ to $0080_H$ are used for CE1-RAM. Addresses $0080_H$ to $0100_H$ are used for 80C196 internal RAM. Addresses $0100_H$ to $0200_H$ are used for CE3- or CE1-RAM. Addresses $0200_H$ to $0300_H$ are used for CE4- or CE1-RAM. Addresses $0300_H$ to $0340_H$ are used for adjunct-chip registers (64 bytes). Addresses $0340_H$ to $1FFE_H$ are used for CE1-RAM. Addresses $1FFE_H$ to $2000_H$ are used for Port 3 and Port 4. Addresses $2000_H$ to $3000_H$ are used for reset/interrupt vectors, configuration byte, and adjunct-chip bootstrap ROM (3968 bytes). Addresses $3000_H$ to $4000_H$ are used for CE2-RAM. Addresses $4000_H$ to $FFFF_H$ are used for external memory.

FIG. 3C-3 shows how the memory space is remapped in a slightly different embodiment, which includes 32K of memory directly controlled by the adjunct chip. Note that no memory space, in this version, is available for external memory.

Figures 1, 3D:
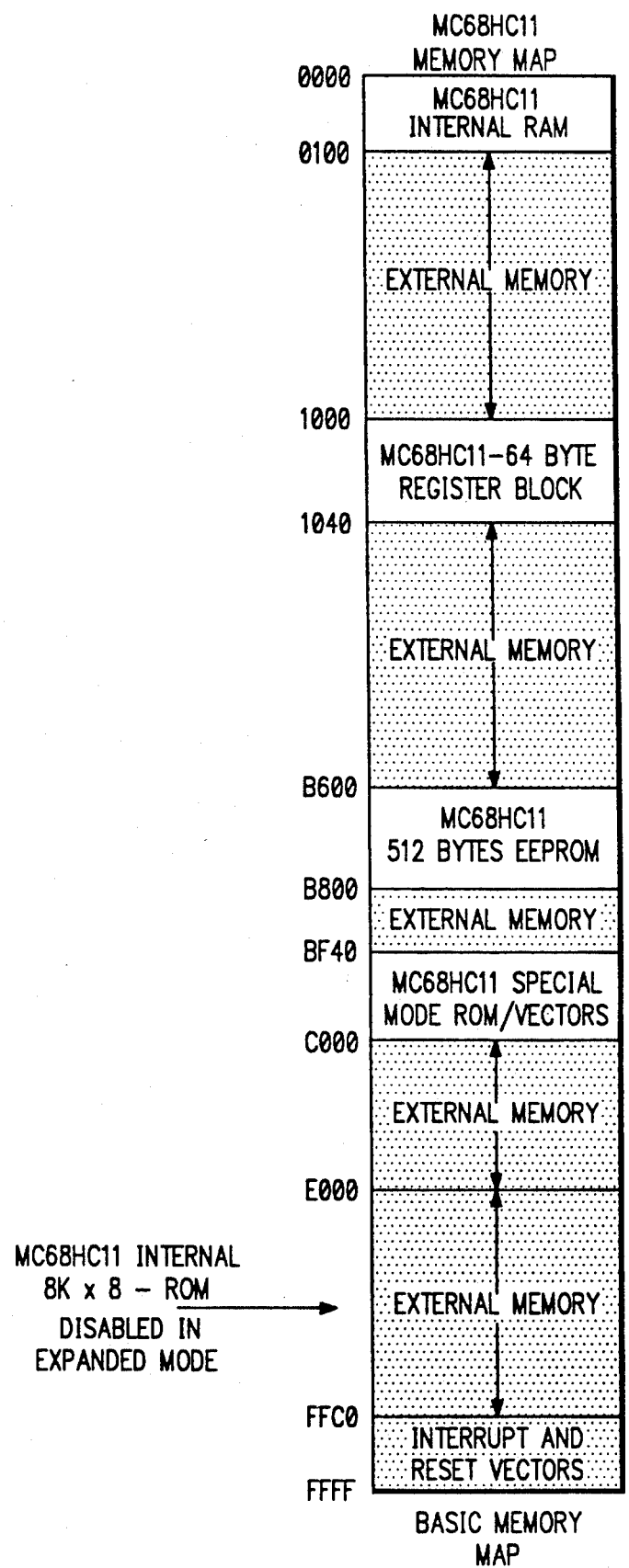
Figures 2, 3D:
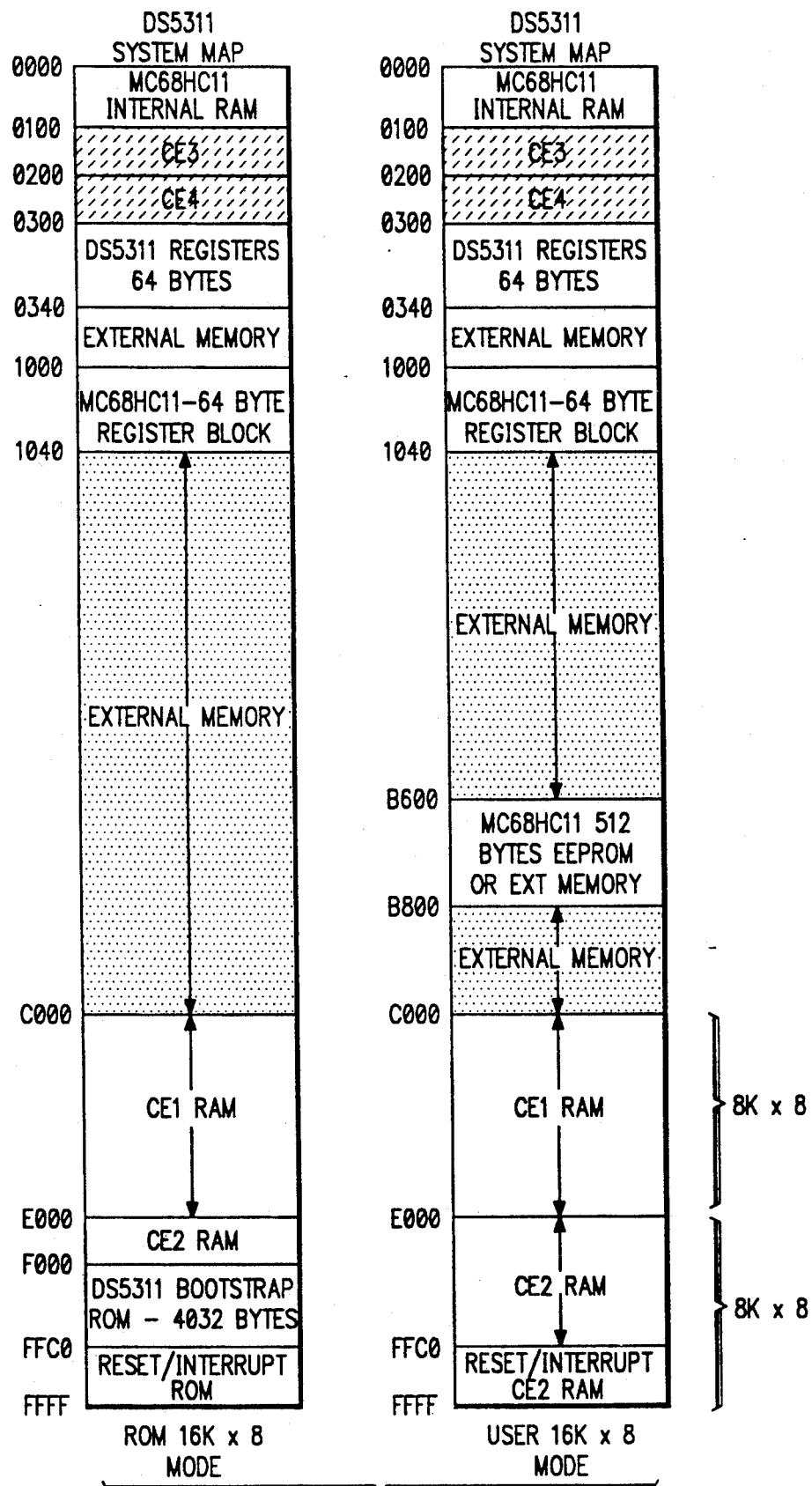
Figures 3, 3D:
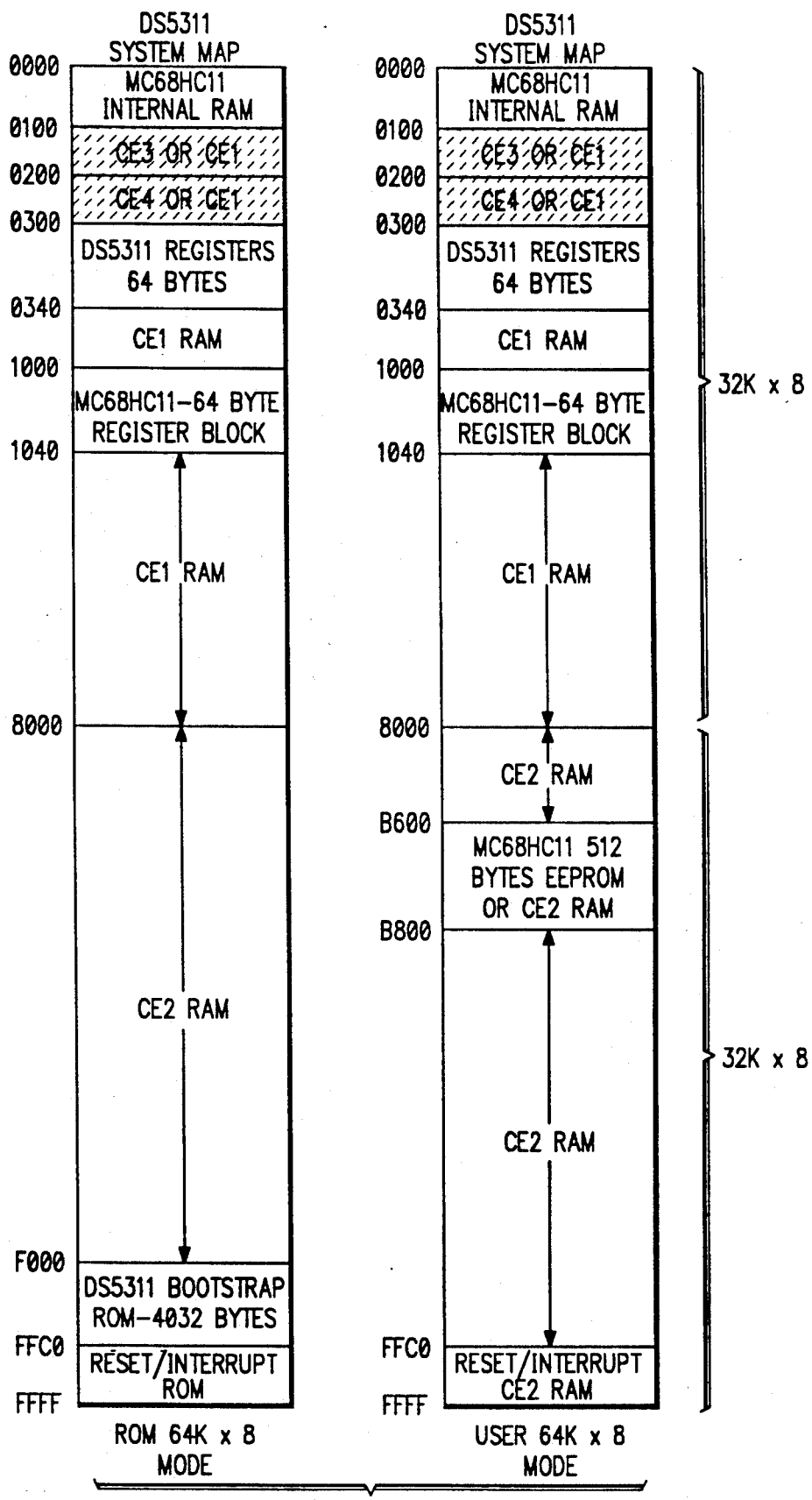

FIG. 3D-1 shows the basic memory map of a Motorola 68HC11 microprocessor. Again, note that this is a 64K memory map. Addresses $0000_H$ to $0100_H$ are used for internal RAM. Addresses $0100_H$ to $1000_H$, $1040_H$ to $B600_H$, $B800_H$ to $BF40_H$, $C000_H$ to $E000_H$, and $E000_H$ to $FFC0_H$ are available for external memory. Addresses $1000_H$ to $1040_H$ are register block. Addresses $B600_H$ to $B800_H$ are used for 512 bytes EEPROM. Addresses $BF40_H$ to $C000_H$ are used for special mode ROM/vectors. Addresses FFC0$_H$ to FFFF$_H$ are used for interrupt and reset vectors.

FIG. 3D-2 shows a memory map for a module which includes this microprocessor with an adjunct chip as disclosed, and two 8K×8 SRAMs in the module. In this case, some memory space remains accessible by external memory. Note also that chip enables CE3* and CE4* control memory which is mapped onto portions of the memory space.

FIG. 3D-3 shows a memory map for another version, which is generally similar to the version of FIG. 3D-2 except that two 32K memories are used. Note that, in this case, no address space remains for external memory.

Figures 1, 3E:
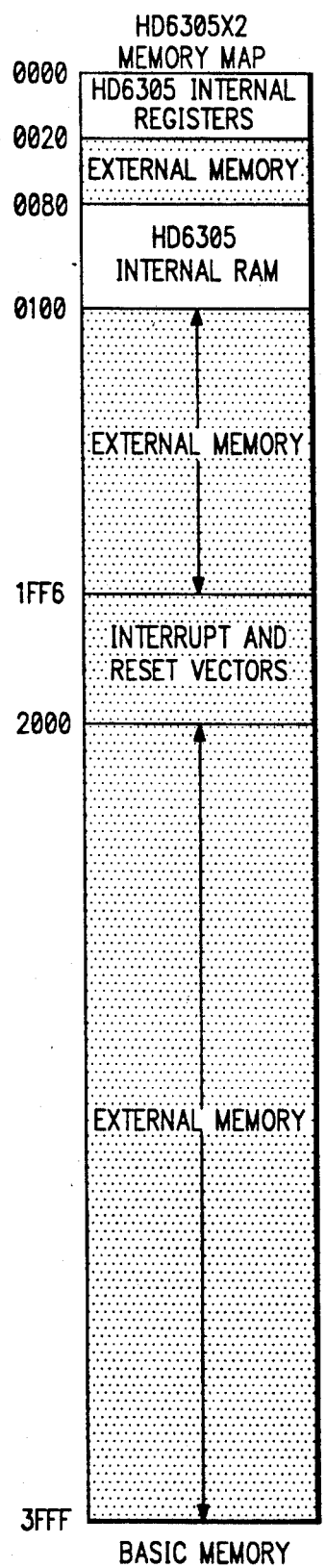
Figures 2, 3E:
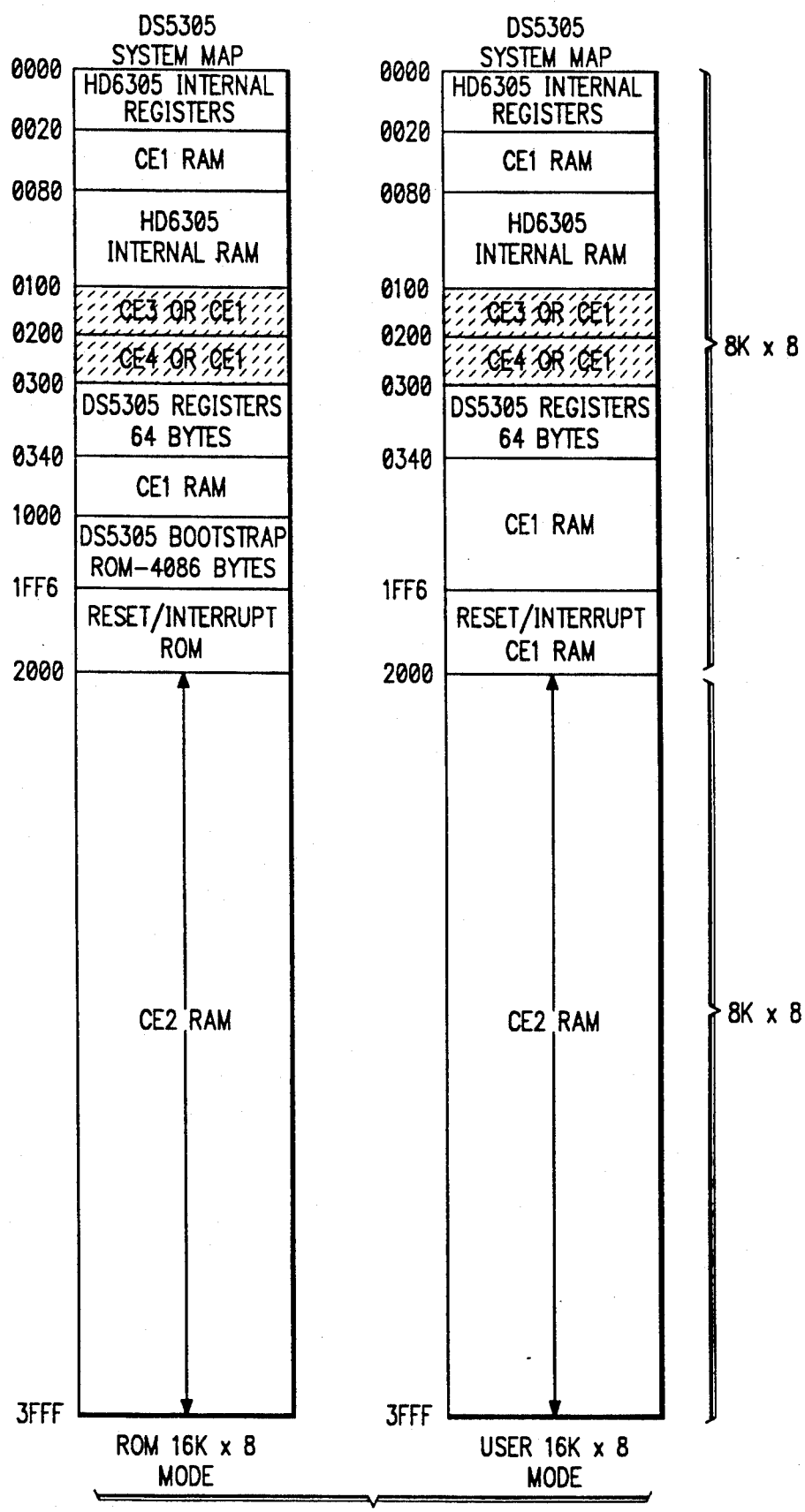
Figure 5:
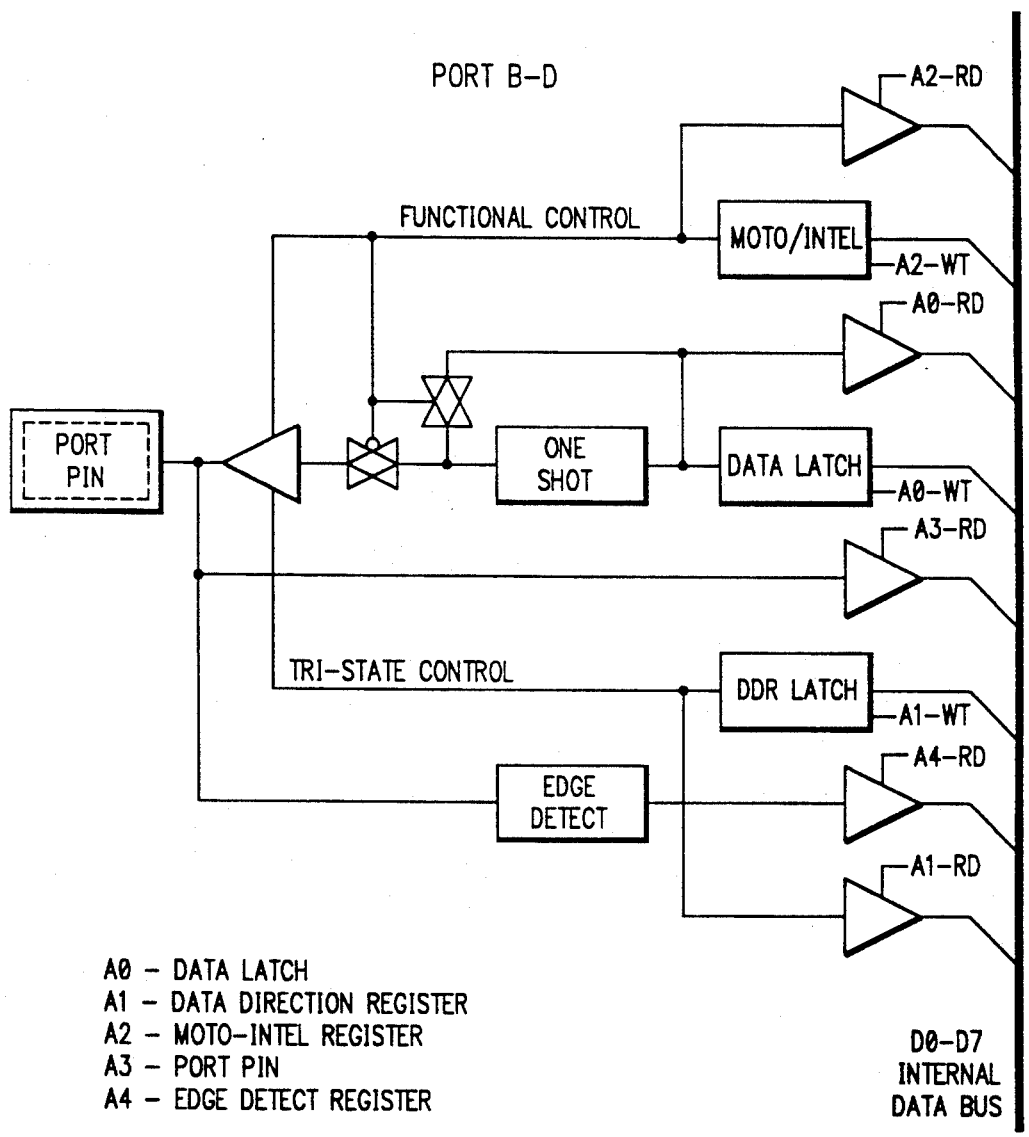
Figure 6A:
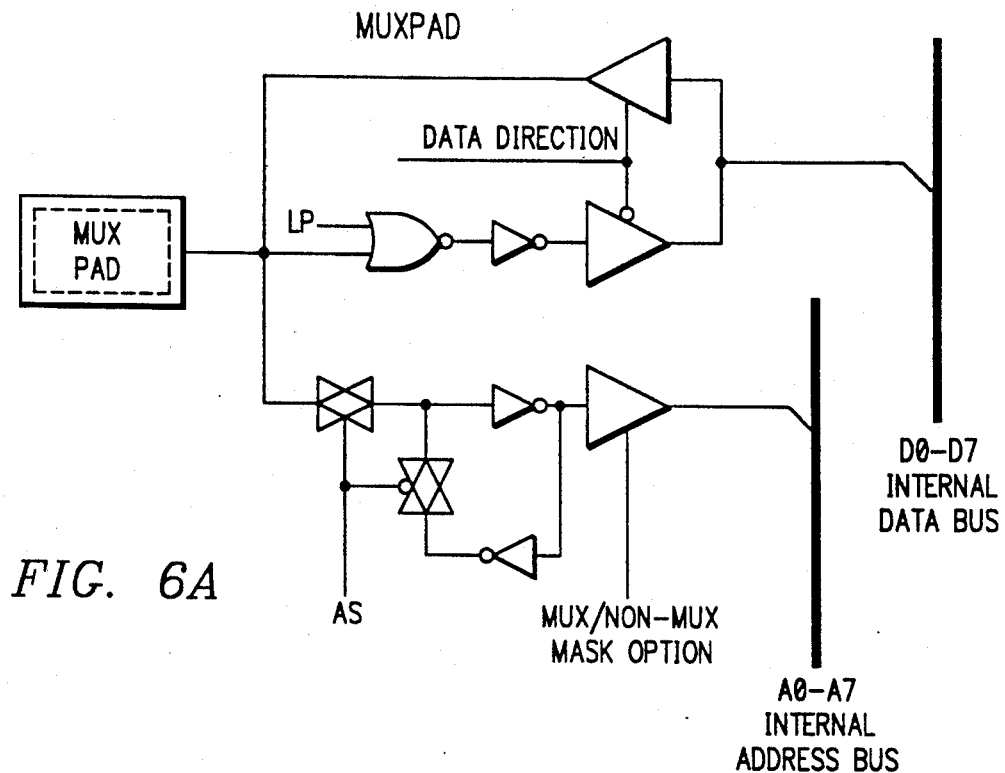
FIG. 6A shows the architecture preferably used for the multiplexed interface 186, in the adjunct chip embodiments of FIGS. 1B and 2B.
Figure 6B:
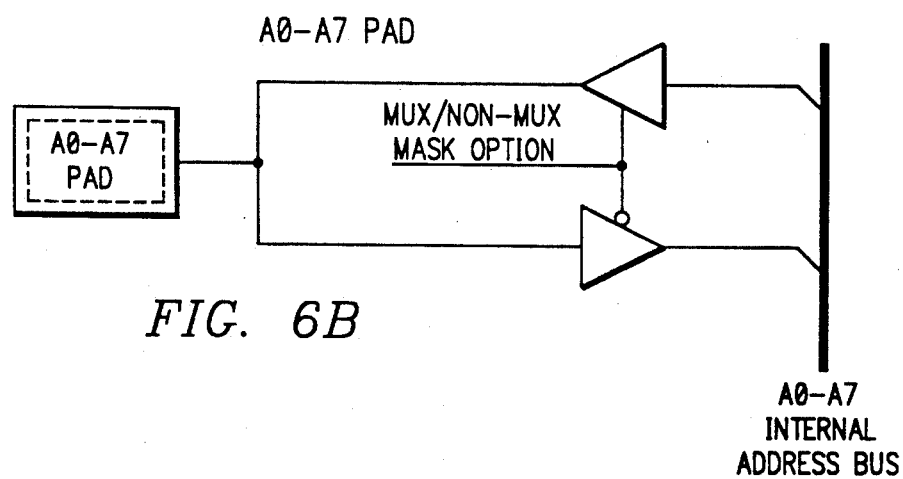
FIG. 6B shows the architecture preferably used for the buffers 169 and 269, in the adjunct chip embodiments of FIGS. 1B and 2B (respectively).
Figure 6C:
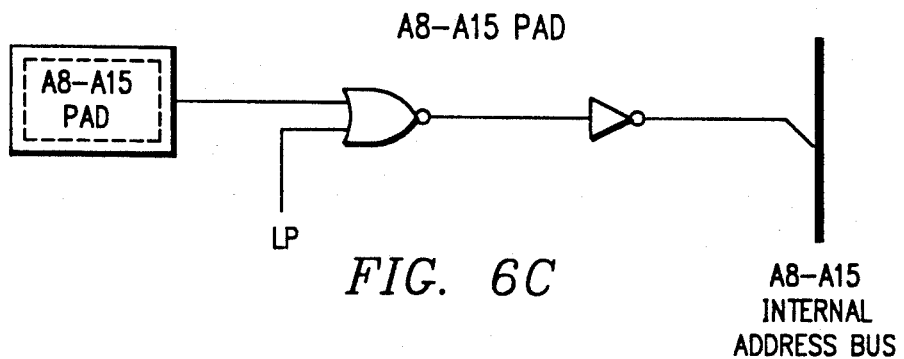
FIG. 6C shows the simple interface 188 preferably used for latching in high-order address bits, in the adjunct chip embodiments of FIG. 1B and 2B.
Figure 8A:
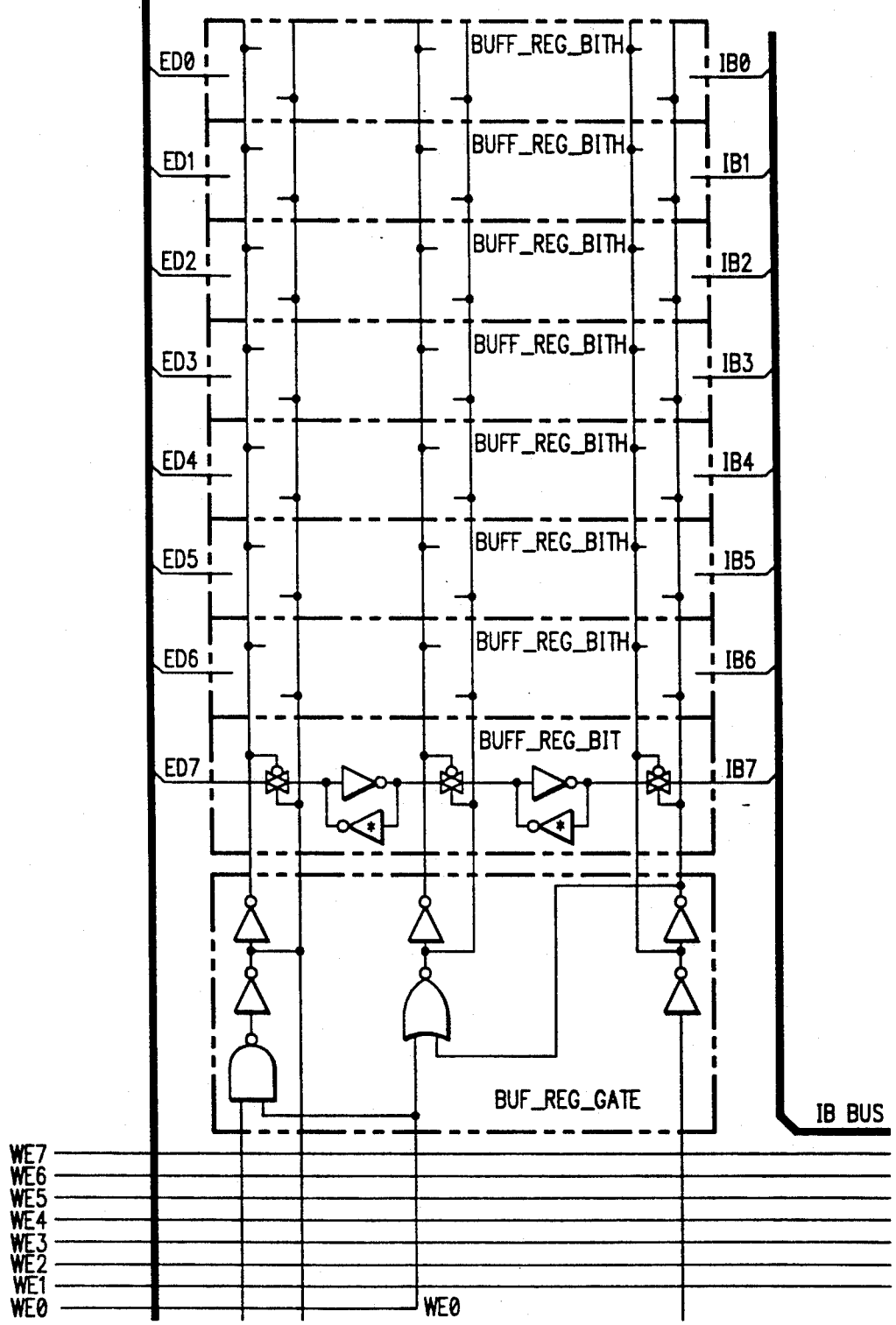
FIG. 8A schematically shows one register of the input buffers and flags, in the Register File Structure of an adjunct chip of FIG. 1B, in the presently preferred embodiment.
Figure 8B:
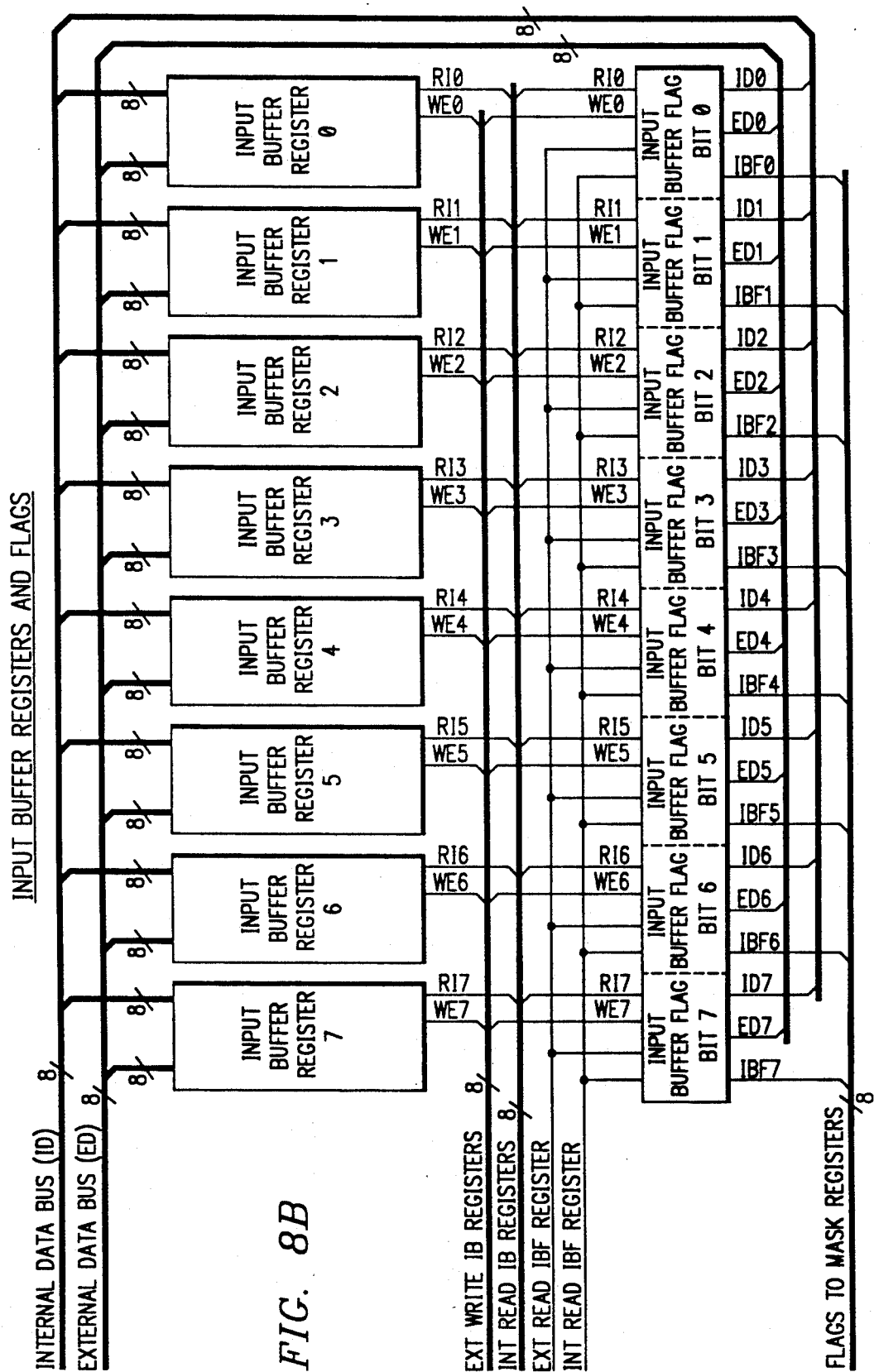
FIG. 8B shows how multiple cells as in FIG. 8A are combined to provide the full input buffer register and flag structure.
Figure 8C:
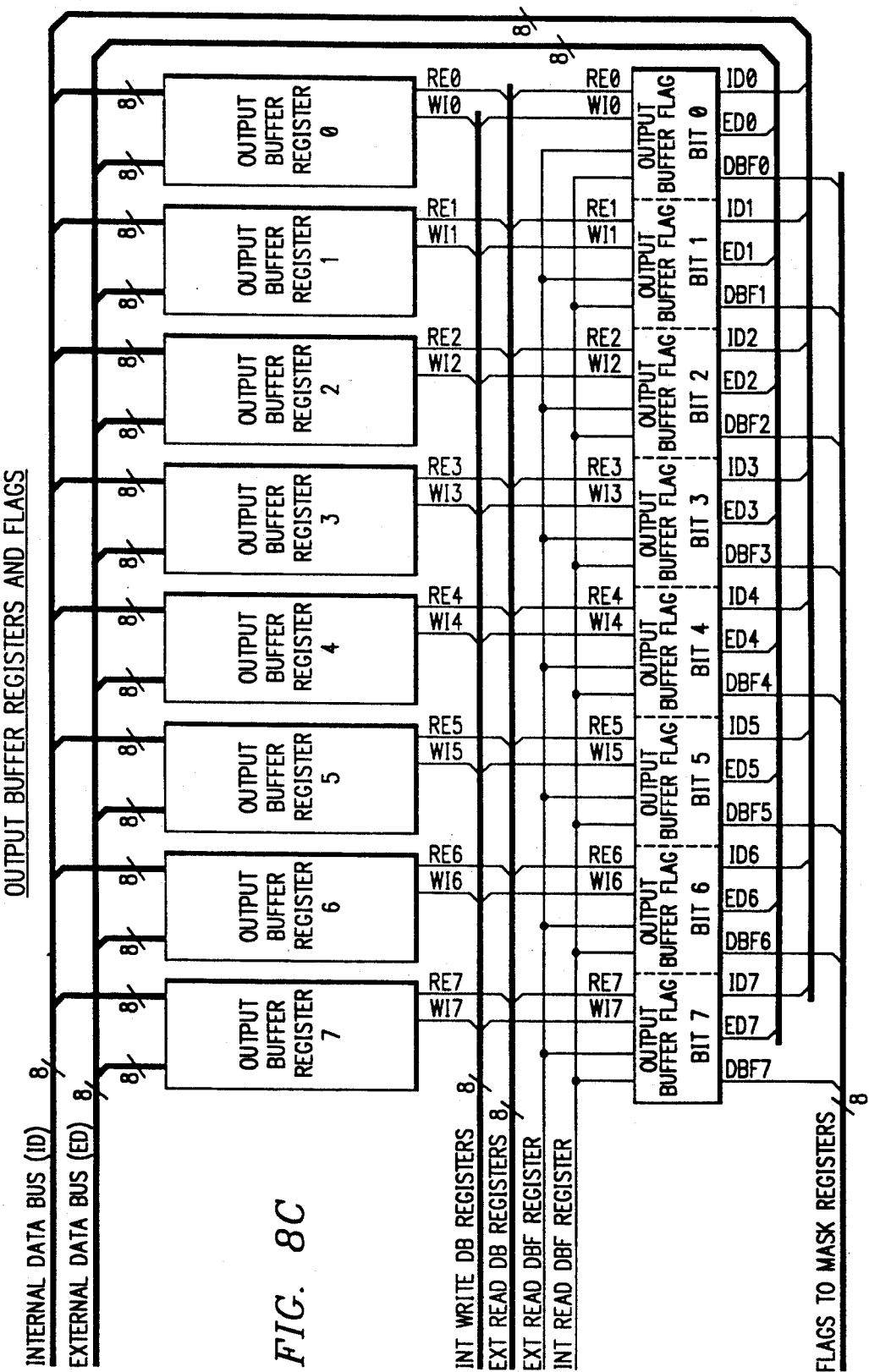
FIG. 8C shows how multiple cells as in FIG. 8A are combined to provide the output buffer register and flag structure.
Figure 9A:
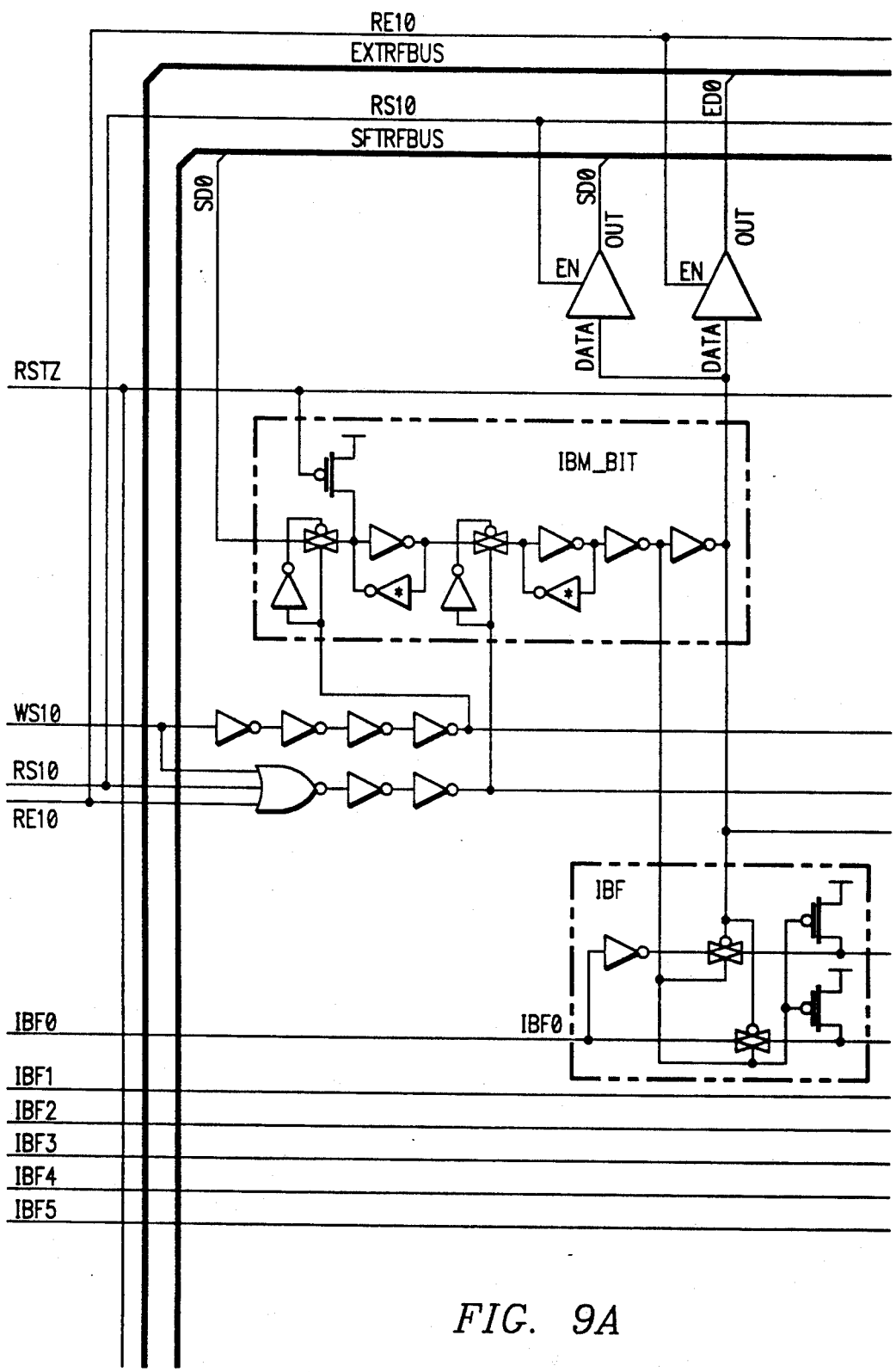
FIG. 9A schematically shows one cell of mask register OBM.
Figure 9B:
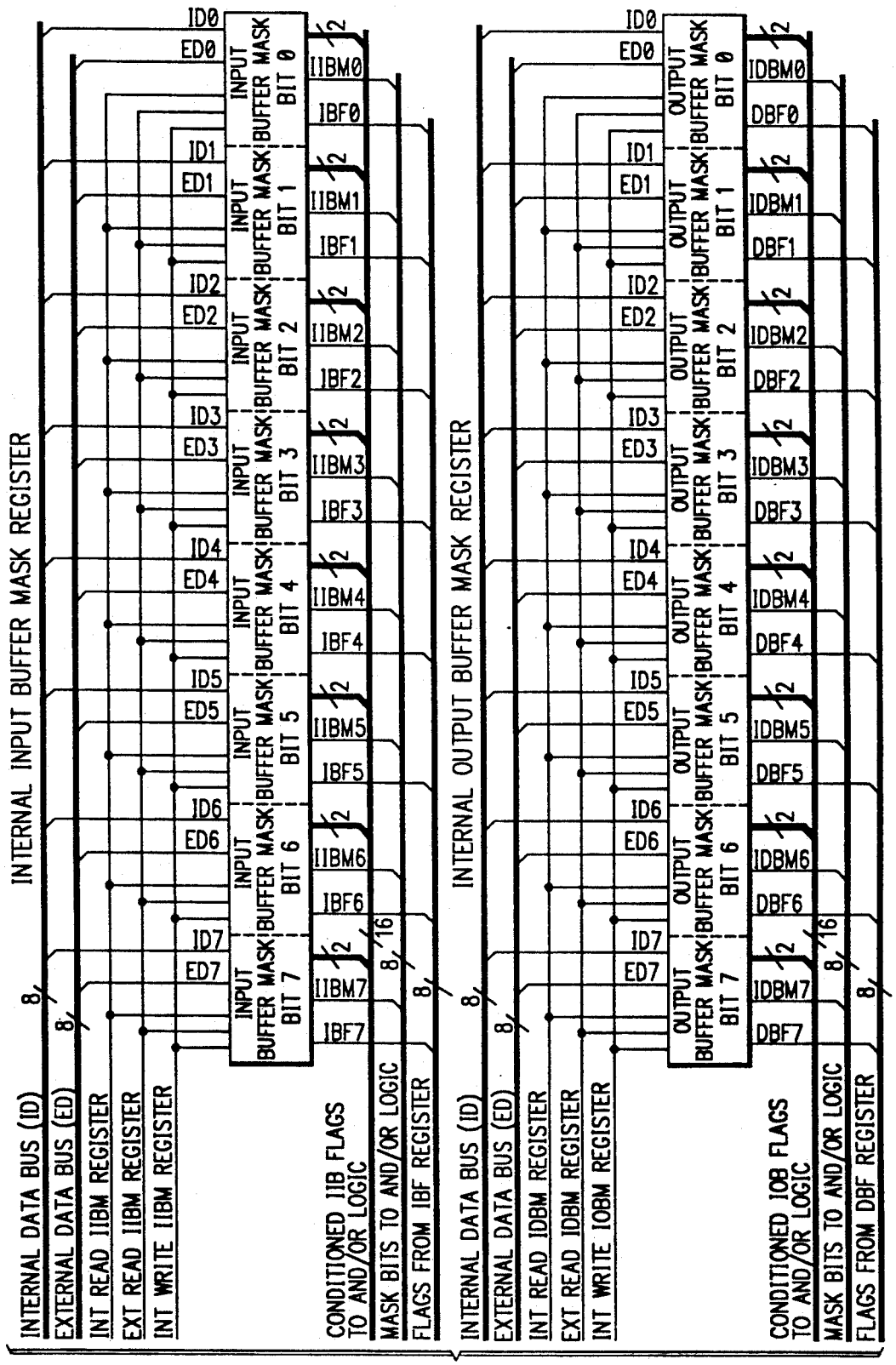
FIG. 9B shows how multiple cells as in FIG. 9A are combined to provide the Internal-IBM and Internal-OBM registers.
Figure 9C:
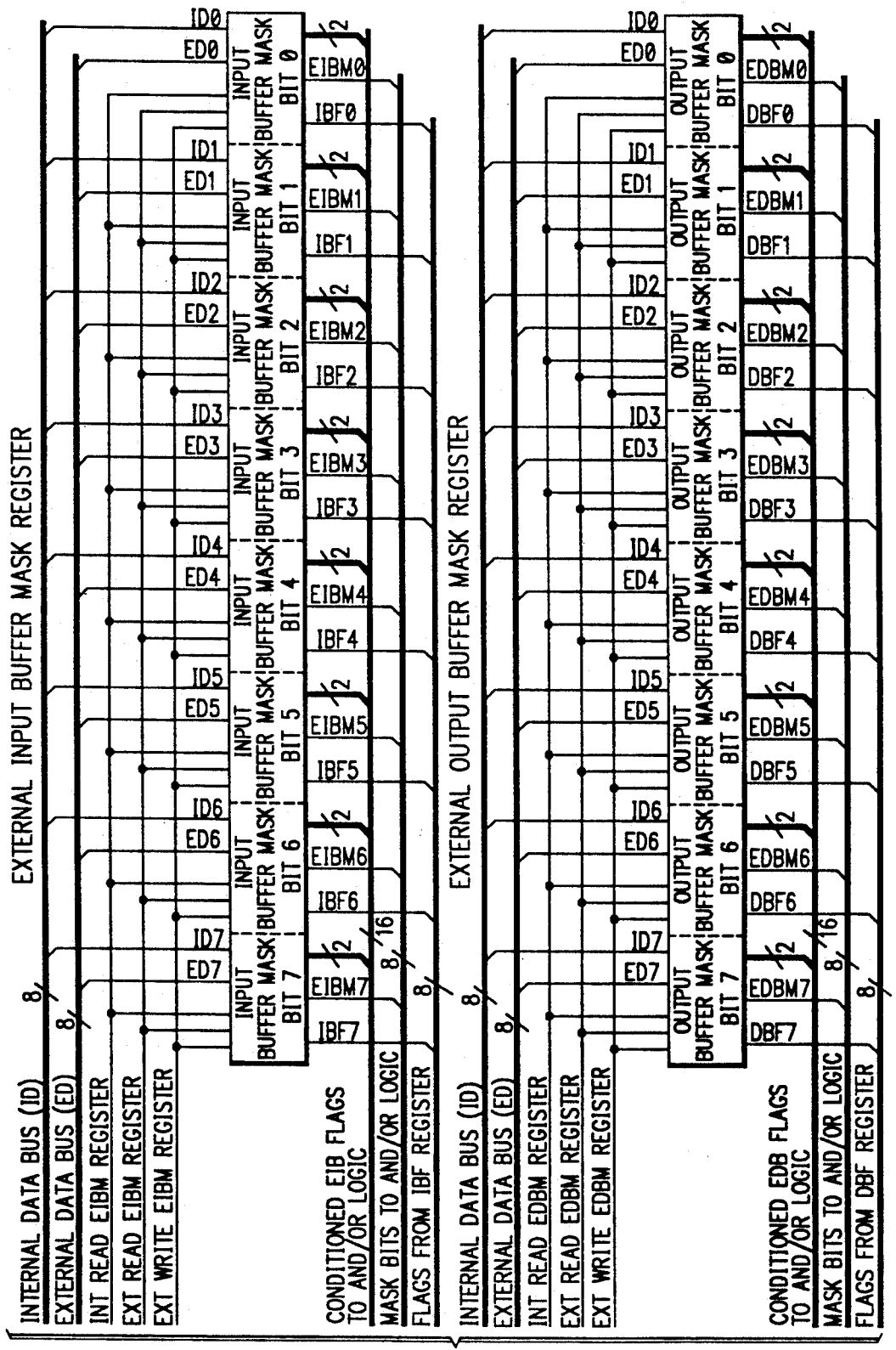
FIG. 9C shows how multiple cells as in FIG. 9A are combined to provide the External-IBM and External-OBM registers.
Figure 10:
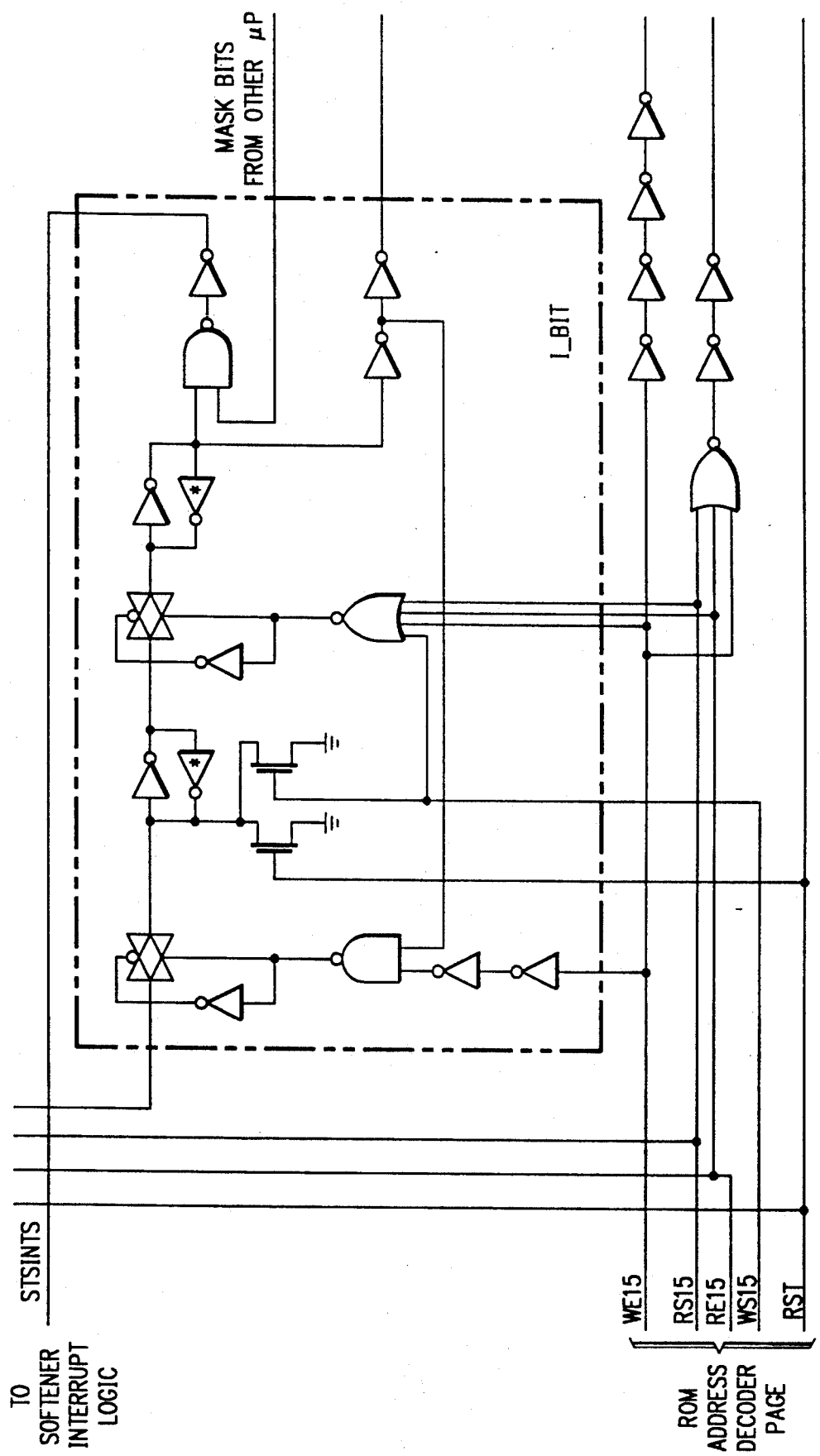
FIG. 10 schematically shows one IBIT cell of the status register.
Figure 11A:
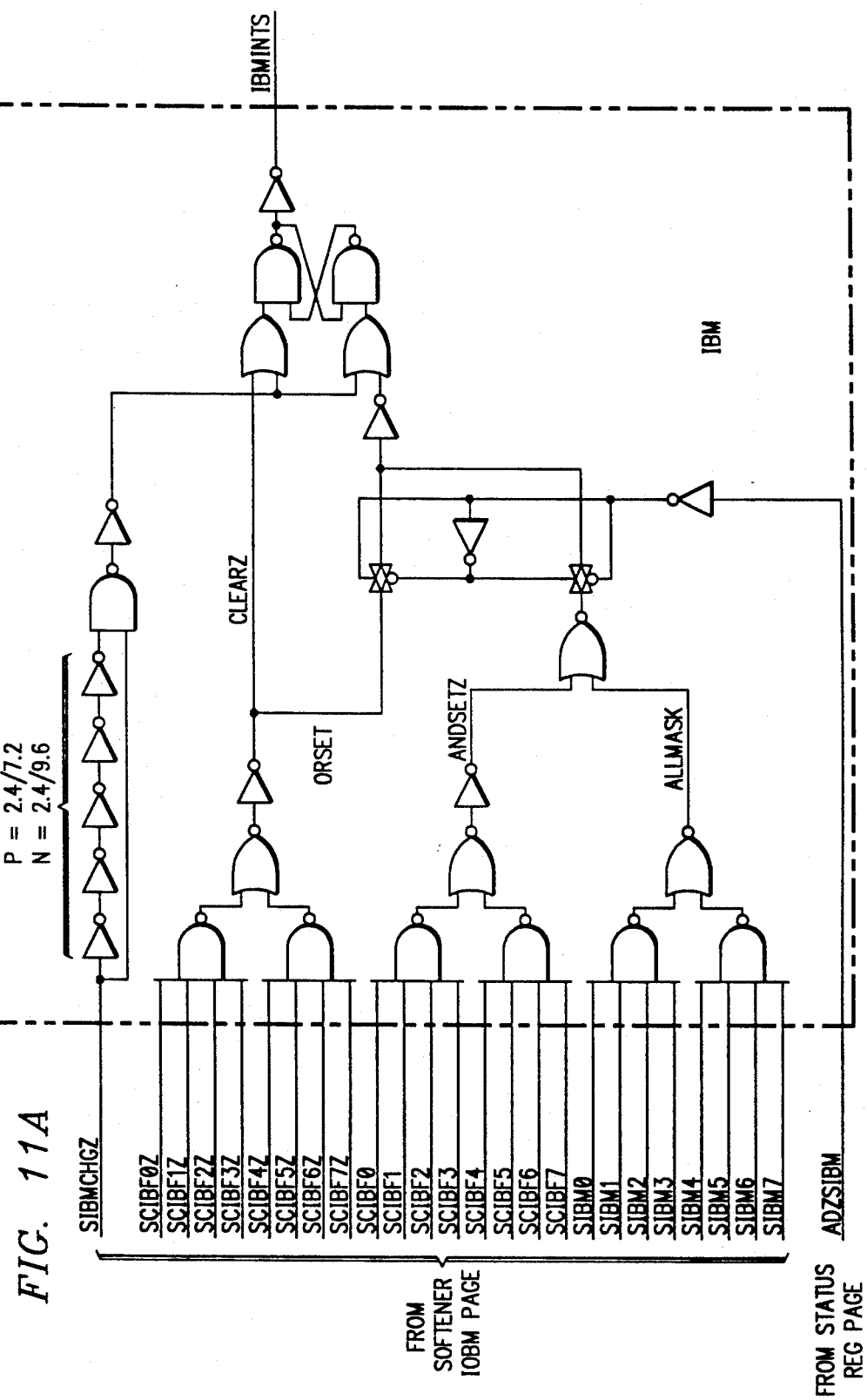
FIG. 11A schematically shows one cell of the AND/NOR logic which provides combinatorial masking dependence.
Figure 11B:
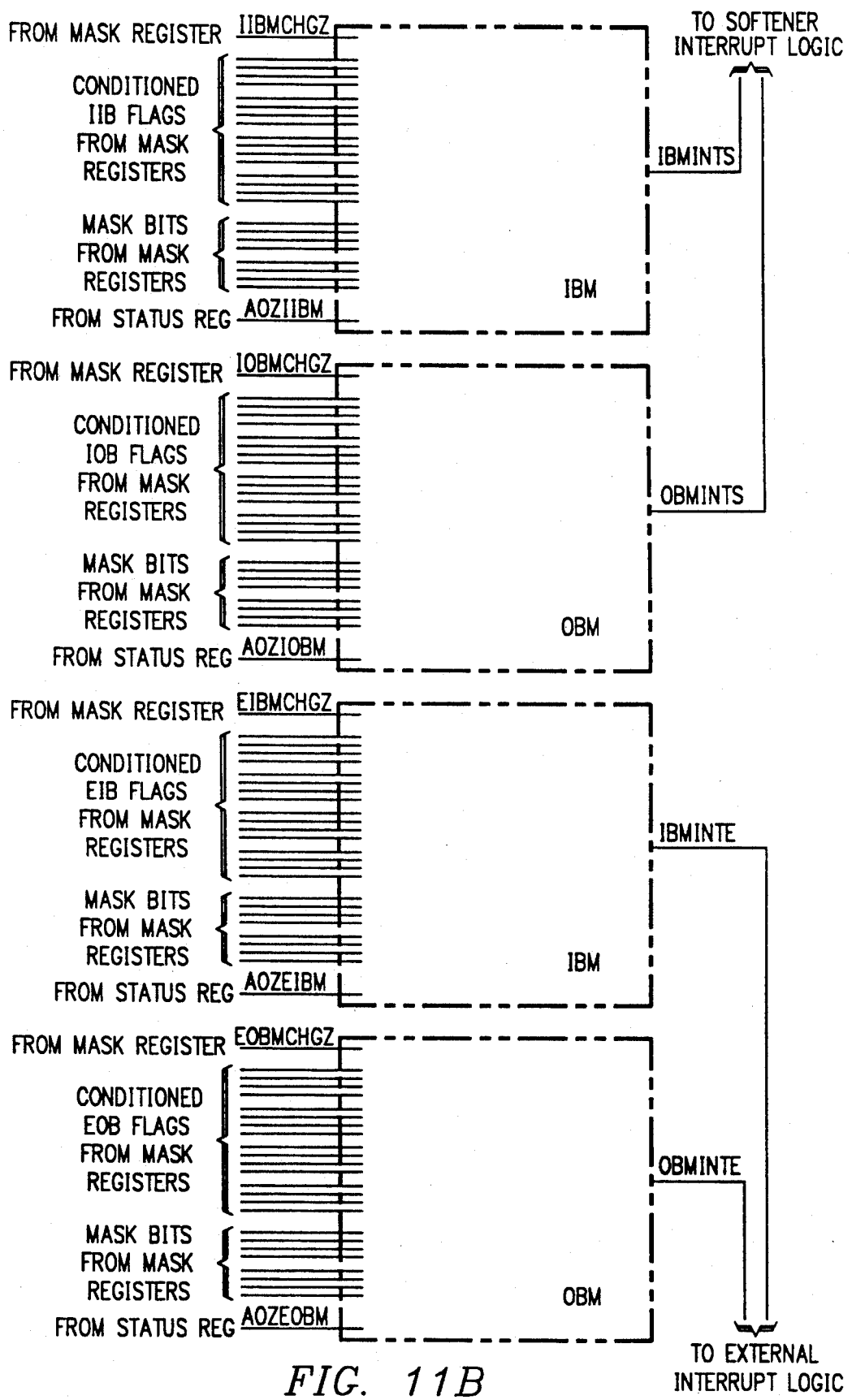
FIG. 11B shows how four cells as in FIG. 11A are combined to provide the AND/NOR select options for the Internal-IBM, Internal-OBM, External-IBM, and External-OBM registers.
Figure 12:
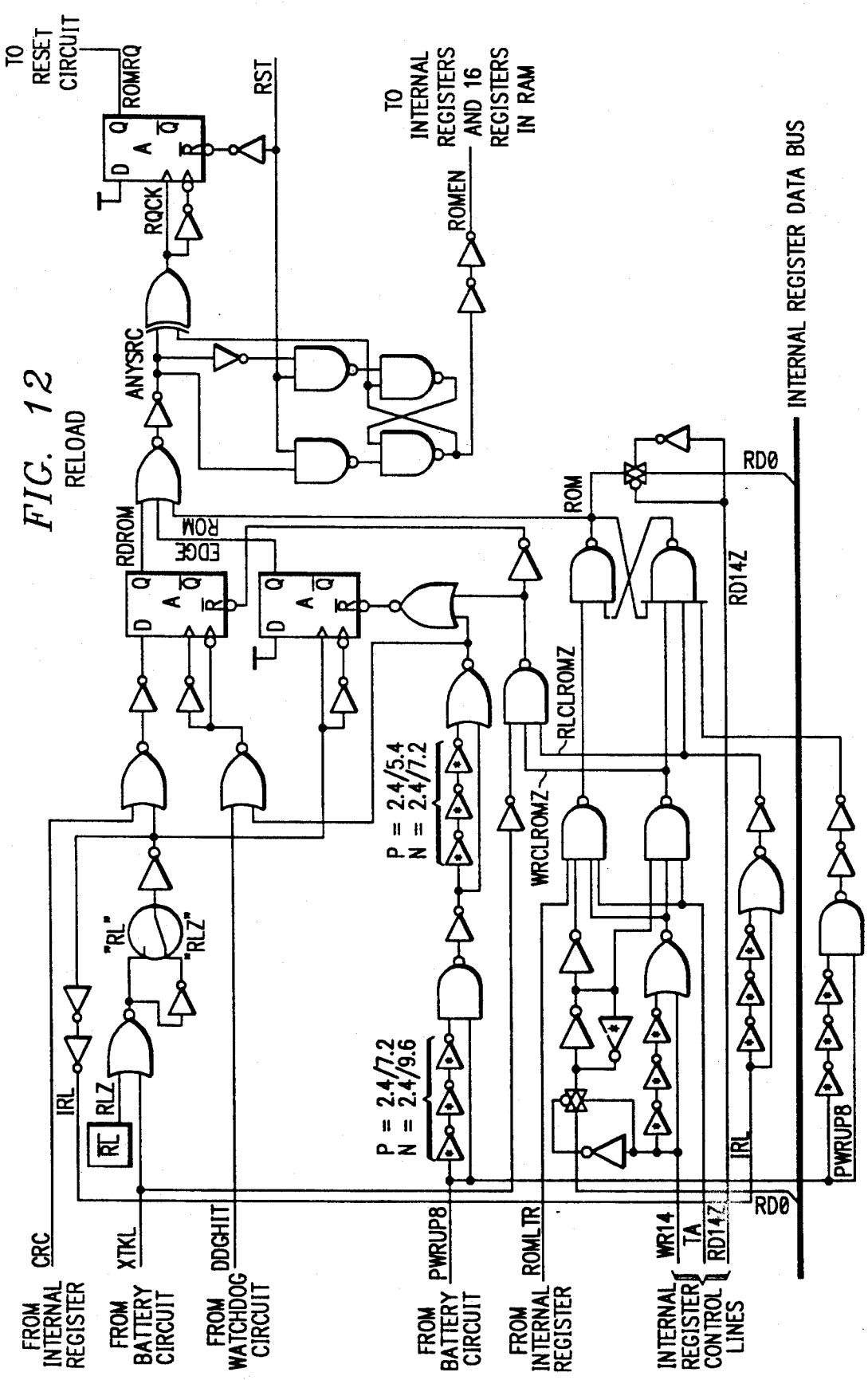
FIG. 12 schematically shows the logic which is used to capture rising and falling edges of the external reload signal RL*.
Figure 13A:
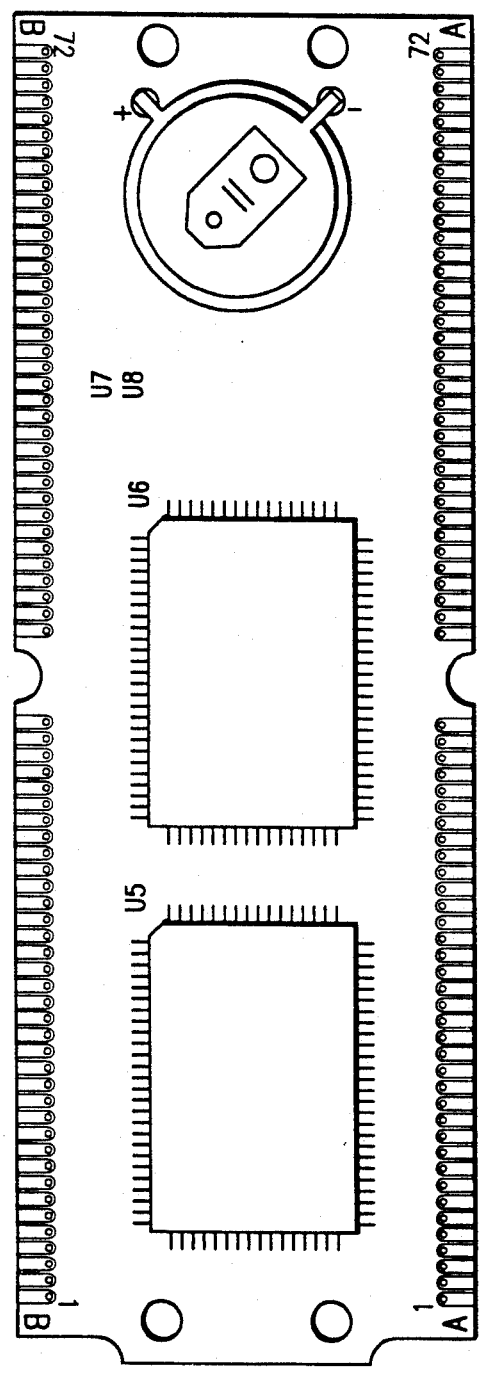
FIGS. 13A and 13B show the two sides of an innovative subsystem microboard used in a preferred subsystem embodiment.
Figure 13B:
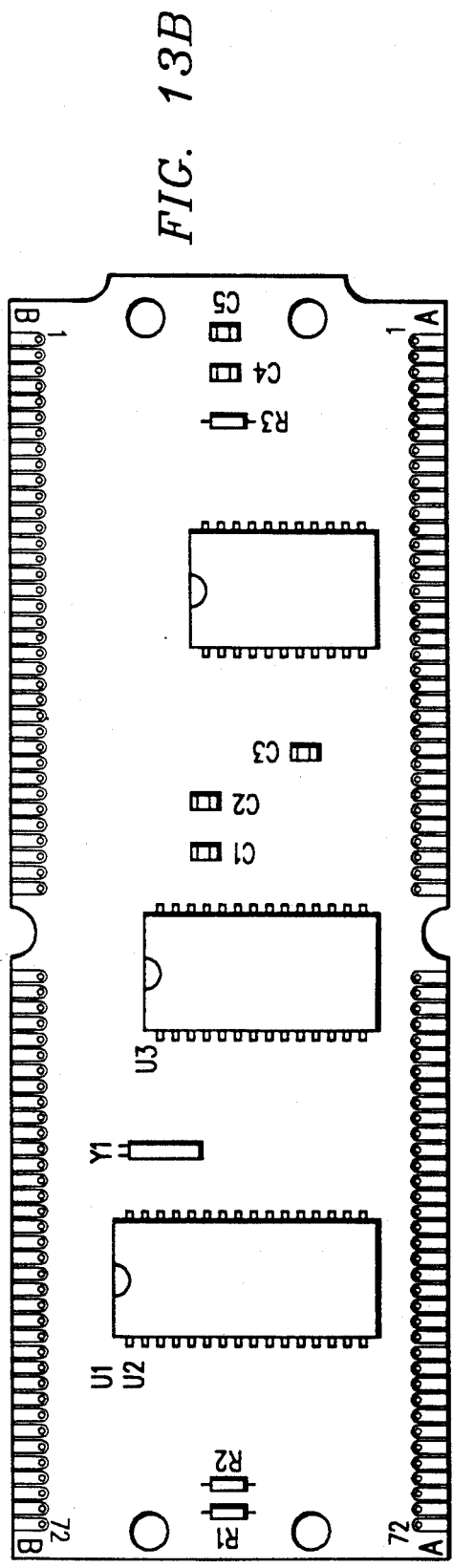
Figure 14:
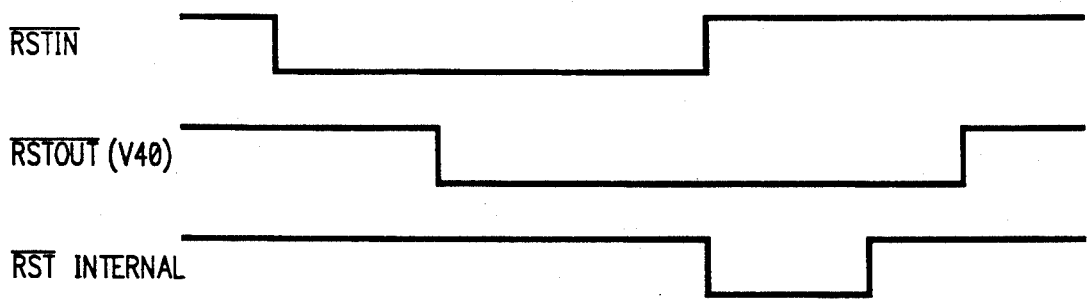
FIG. 14 schematically shows the timing relations which assure that the adjunct chip will never be in reset when the associated microprocessor comes out of reset.

FIG. 3E-1 shows the basic memory map for a Hitachi 6305X2 microprocessor. Addresses 0000$_H$ to 0020$_H$ are used for internal registers. Addresses 0020$_H$ to 0080$_H$, 0100$_H$ to 1FF6$_H$, and 2000$_H$ to 3FFF$_H$ are used for external memory. Addresses 0080$_H$ to 0100$_H$ are used for internal RAM. Addresses 1FF6$_H$ to 2000$_H$ are used for interrupt and reset vectors.

The leftmost portion of FIG. 3E-2 shows memory address allocations, in control software operation and user software operation, for a system which combines a 6305 microprocessor with a matched adjunct chip as described herein. In this example, two 8K×8 RAMs are available, controlled by chip-enable outputs CE1* and CE2*. Addresses 0000$_H$ to 0020$_H$ are used for internal registers. Addresses 0020$_H$ to 0080$_H$ are used for CE1-RAM. Addresses 0080$_H$ to 0100$_H$ are used for internal RAM. Addresses 0100$_H$ to 0200$_H$ are used for CE3- or CE1-RAM. Addresses 0200$_H$ to 0300$_H$ are used for CE4- or CE1-RAM. Addresses 0300$_H$ to 0340$_H$ are used for adjunct-chip registers (64 bytes). Addresses 0340$_H$ to 1000$_H$ are used for CE1-RAM. Addresses 1000$_H$ to 1FF6$_H$ are used for adjunct-chip bootstrap ROM (4086 bytes). Addresses 1FF6$_H$ to 2000$_H$ are used for reset/interrupt ROM. Addresses 2000$_H$ to 3FFF$_H$ are used for CE2-RAM.

The rightmost portion of FIG. 3E-3 shows a slightly different assignment, where addresses 0000$_H$ to 0020$_H$ are used for internal registers. Addresses 0020$_H$ to 0080$_H$ are used for CE1-RAM. Addresses 0080$_H$ to 0100$_H$ are used for internal RAM. Addresses 0100$_H$ to 0200$_H$ are used for CE3- or CE1-RAM. Addresses 0200$_H$ to 0300$_H$ are used for CE4- or CE1-RAM. Addresses 0300$_H$ to 0340$_H$ are used for adjunct-chip registers (64 bytes). Addresses 0340$_H$ to 1FF6$_H$ are used for CE1-RAM. Addresses 1FF6$_H$ to 2000$_H$ are used for reset/interrupt CE1-RAM. Addresses 2000$_H$ to 3FFF$_H$ are used for CE2-RAM.

External Interfaces Seen by the Microprocessor

The microprocessor is not only able to access Port 0 and Port 1 as usual, but can also make use of ports A-D on the adjunct chip, as described below, by setting the appropriate register bits in the adjunct chip.

Moreover, the microprocessor can also use the adjunct chip to provide programmable interrupt-masking, as described below.

The adjunct chip also provides smart control of microprocessor sleep mode and resets, as described below.

Adjunct Chip Architecture

FIG. 1B shows the overall architecture of the adjunct chip 120 shown in FIGS. 1A-1 and 1A-2.

Different Versions for Different Processor Families

In the presently preferred embodiment, the adjunct chip can exist in several different versions, which each have slightly different features (implemented by simple mask options), depending on which target microprocessor is to be used. In the present class of embodiments, five different versions of the adjunct chip are contemplated, aimed at five different families of target microprocessor. Of course, further versions of the adjunct chip can also be added, with other target microprocessors.

A further advantage of the adjunct chip is that it can provide great versatility in the device-level architecture of the target microprocessor. Thus, the CMOS adjunct chip can be combined with an NMOS, or even bipolar, target microprocessor to provide a low-power and crash-proof system.

The five target architectures presently planned for use are the following:

(1) The NEC V40 microprocessor. This is the presently preferred embodiment and will be primarily referred to in the detailed description below. The NEC V40 is generally similar to an Intel 8086, but without on-chip memory or ports.

(2) The Hitachi 6303.

(3) The Motorola 68HC11 architecture (there are several versions of this—the 68HC11A0 version is probably the most useful in combination with the adjunct chip, but others could be used as well).

(4) The Intel 80C196 (a redesign of the 8096 architecture) is a 16-bit microcontroller, which is extremely fast.

(5) The Hitachi 6305. This chip is generally similar to the Motorola 6805. It has a 16K address map.

Most of the above chips have 64K memory maps, except that the V40 has a 1-meg memory map and the Hitachi 6305 has a 16K memory map.

Reset and Interrupt Control 152

A reset and interrupt control 152 can receive interrupts on pins INT1* and INT2*, and can also output interrupts on those pins, in order to direct interrupts to the microprocessor 120. Similarly, logic block 152 is also connected to receive externally generated resets and to send resets to microprocessor 110 on line RSTOUT*.

Reload control logic 154 receives the external input RL*, which can command initiation of a reload, as described below.

Figure 18A:
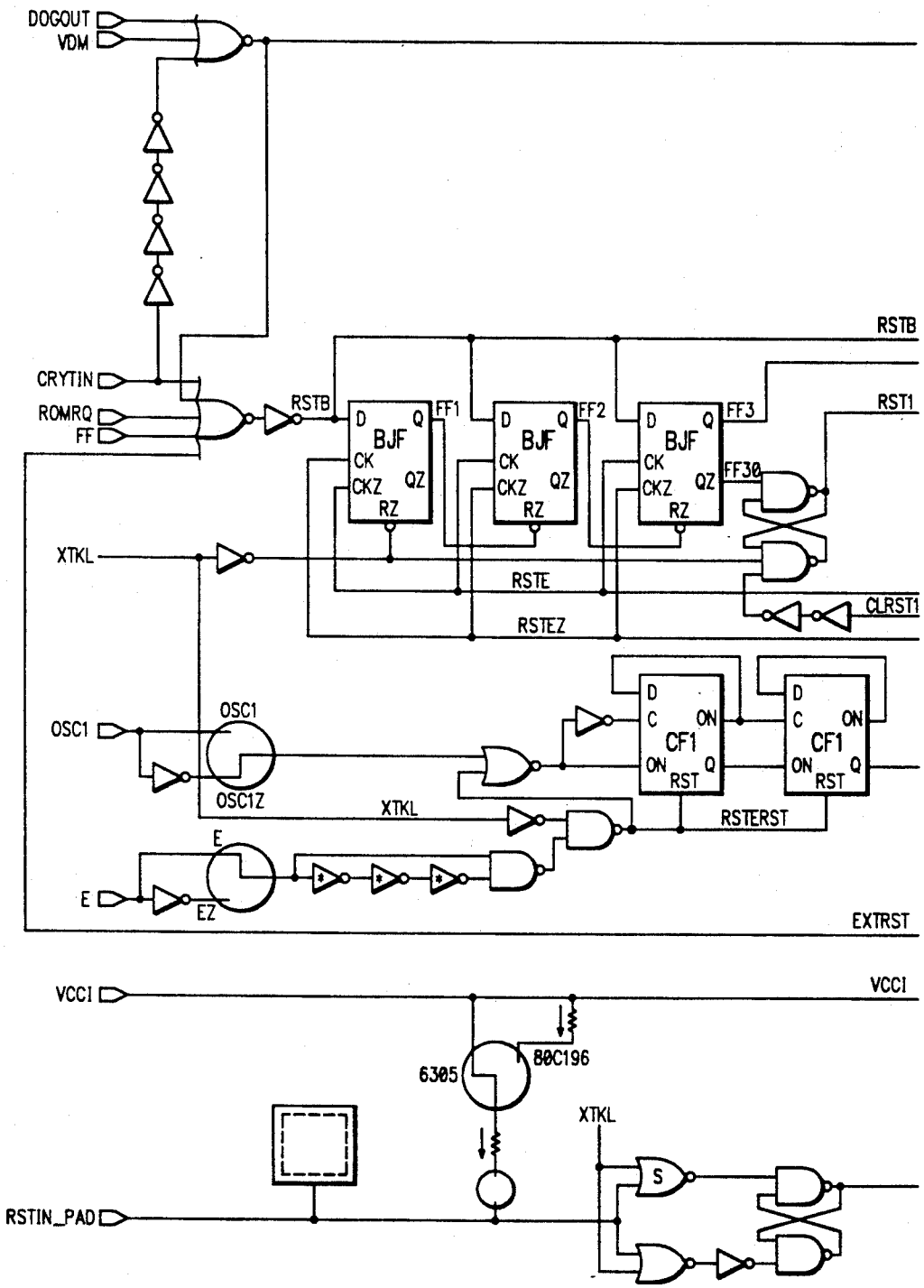
FIGS. 18A, 18B, and 18C show the circuitry used, in the presently preferred embodiment, to implement the Reset Control circuits 152 in the adjunct chip of FIGS. 1A-1 and 1A-2.
Figure 18B:
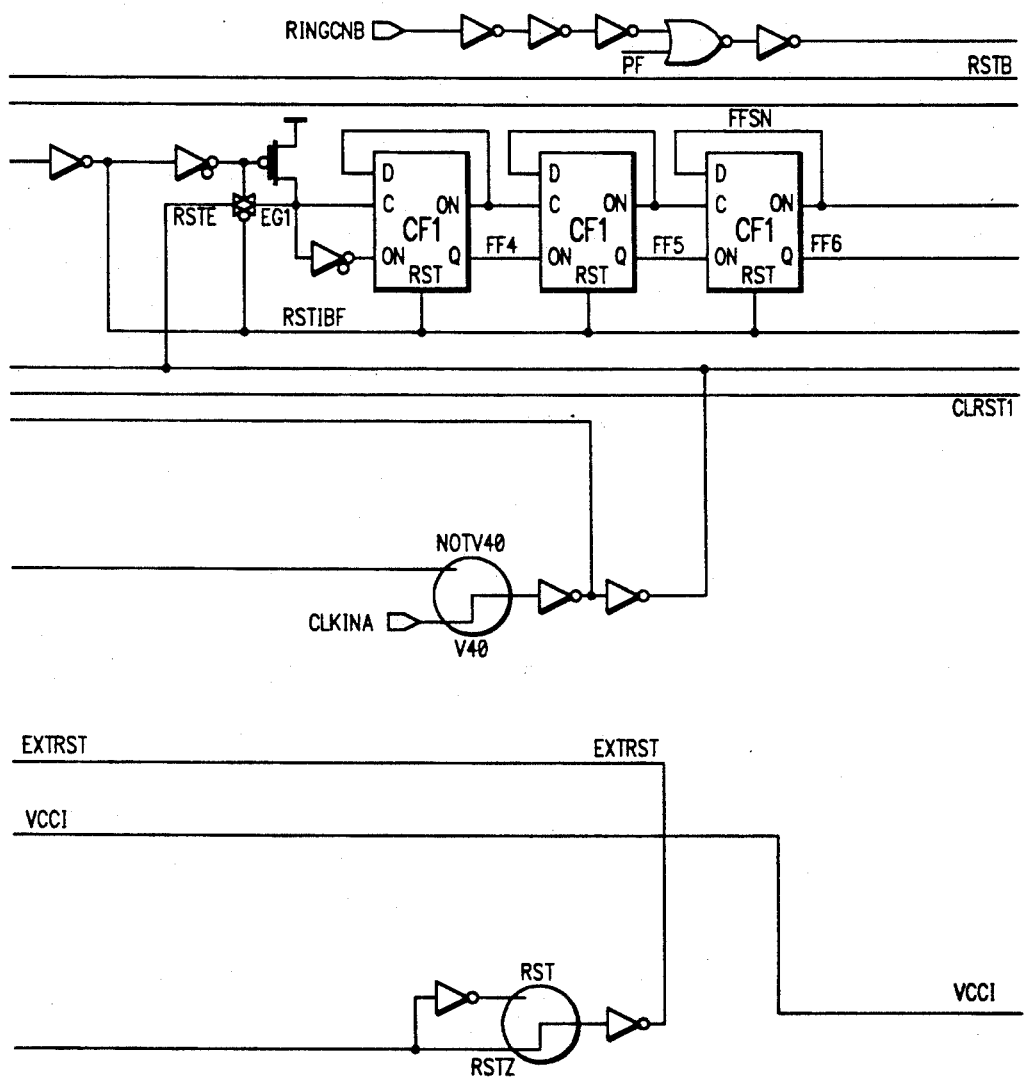
Figure 18C:
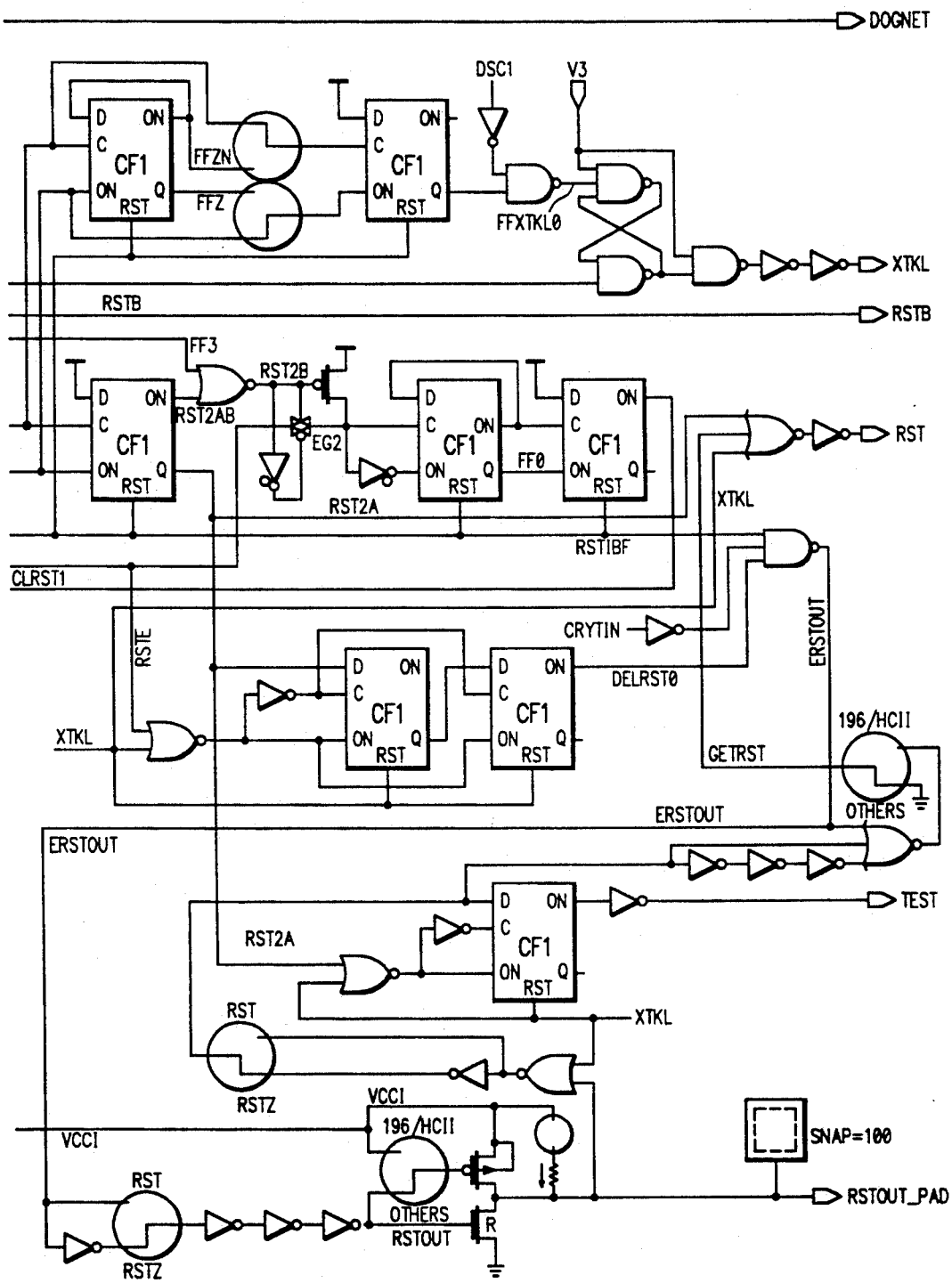

FIGS. 18A, 18B, and 18C show the circuitry used, in the presently preferred embodiment, to implement the reset and Interrupt Control circuits 152 in the adjunct chip of FIGS. 1A-1 and 1A-2.

Battery Circuits 164

Battery circuits 164 include freshness seal logic 165, a current source 166, and a bandgap voltage reference 167. The circuit block 164 receives both a battery voltage VBAT and a system power supply voltage VCCI as inputs, and can detect failure of the system power supply voltage accurately with reference to the bandgap voltage reference 167. The circuit block 164 also provides the power output V$_{CC}$ which powers the other circuits on-chip. The circuit block 164 also includes comparators, which can detect variation in the level of the system supply voltage VCCI. In the embodiment shown, this circuit block also generates two logic output signals, which can be used to switch other devices or to provide warnings or interrupts to other ICs or subsystems in the same system of imminent power failure. In the presently preferred embodiment, signal V45* indicates that the power supply VCCI has fallen to 4.5 volts, and that shut-down procedures should therefore be initiated. Signal V30* indicates that the system voltage has fallen to 3.0 volts, and that parts having a battery voltage input should therefore switch over to battery backup for data maintenance.

Figure 19:
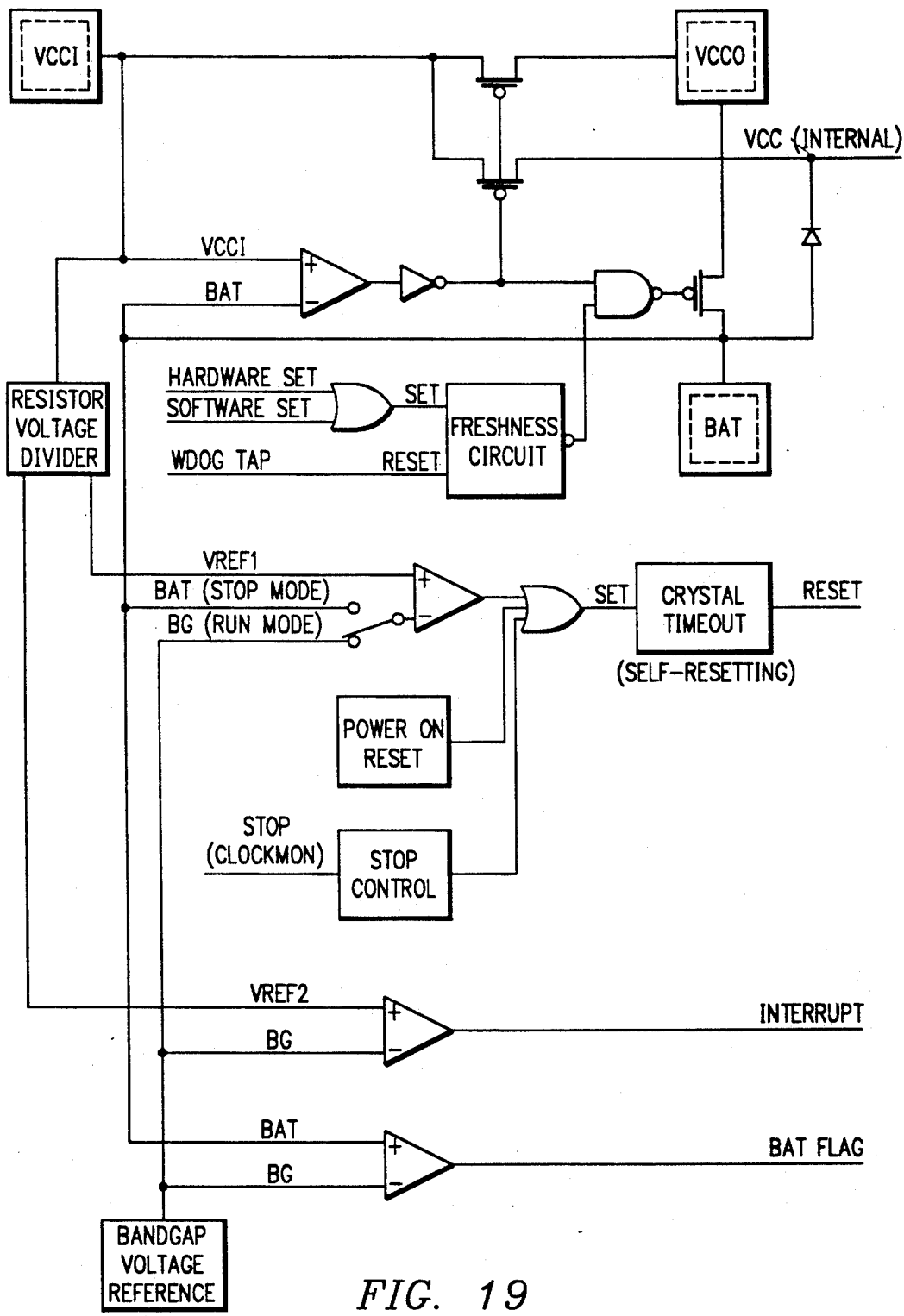
FIG. 19 shows the circuitry used, in the presently preferred embodiment, to implement the battery circuits 164 in the adjunct chip of FIG. 1A.

FIG. 19 shows the circuitry used, in the presently preferred embodiment, to implement the battery circuits 164 in the adjunct chip of FIGS. 1A-1 and 1A-2.

ROM 174

The address bus 168 is also received by a "reload and reset-vector ROM" 174. This block of ROM contains the control software routines for reloading and CRC check, discussed above. This block of ROM also includes the reset-vector memory, which is a small amount of memory (16 bytes, in the presently preferred embodiment) at the address first accessed by the microprocessor after a reset. This is normally used for a long jump instruction.

Internal Buses 168 and 170

An address bus 168 and a data bus 170 are routed around the chip. In the presently preferred embodiment, the address bus and data bus are both 8-bits wide.

Address/Data Interfaces 169/269, 186, 188

An address output buffer 169 can be selected to externally output the addresses on the address bus 168.

The address bus 168 is also received by internal registers and port controls (block 176). This block also has a bidirectional connection to data bus 170.

Note that address/data multiplexed interfaces 186 are also interfaced to the address bus 168 and to data bus 170, under control of the signals RDIN*, WRIN*, and AST*. Latches 188 latch in the high-order address bits A8 through A15.

Address and CE Decoder 172

This circuitry is merely a straightforward use of conventional address decoder architecture. The only unusual feature is that an additional bit CESL is introduced into the decoder. This bit provides the additional input to implement the sliding address overlay.

Clock Monitor and Watchdog Circuits 182

The clock output of the microprocessor (CLKIN) is received by a stop detect and watchdog circuit 182. Although these circuits have some resemblances, they are two different circuits, in the presently preferred embodiment.

Clock Monitor

Watchdog

In addition to the clock monitor circuit, the adjunct chip also contains a watchdog function. This function, too, is made programmable. Thus, the user can determine what period of inactivity the watchdog function should wait for before activating a reset or interrupt.

The watchdog function is always active when the microprocessor is being operated from adjunct chip ROM. The watchdog parameters include user-programmable options: For example, the inactive time required before the watchdog activates a reset is programmable. Moreover, the watchdog can optionally be turned off.

Oscillator Control Circuit 184

A clock oscillator control 184 is connected to the crystal terminals XTAL1 and XTAL2 and provides switching from the crystal stabilized oscillation to a ring oscillator clock on power-down, as will be described later.

Figure 17A:
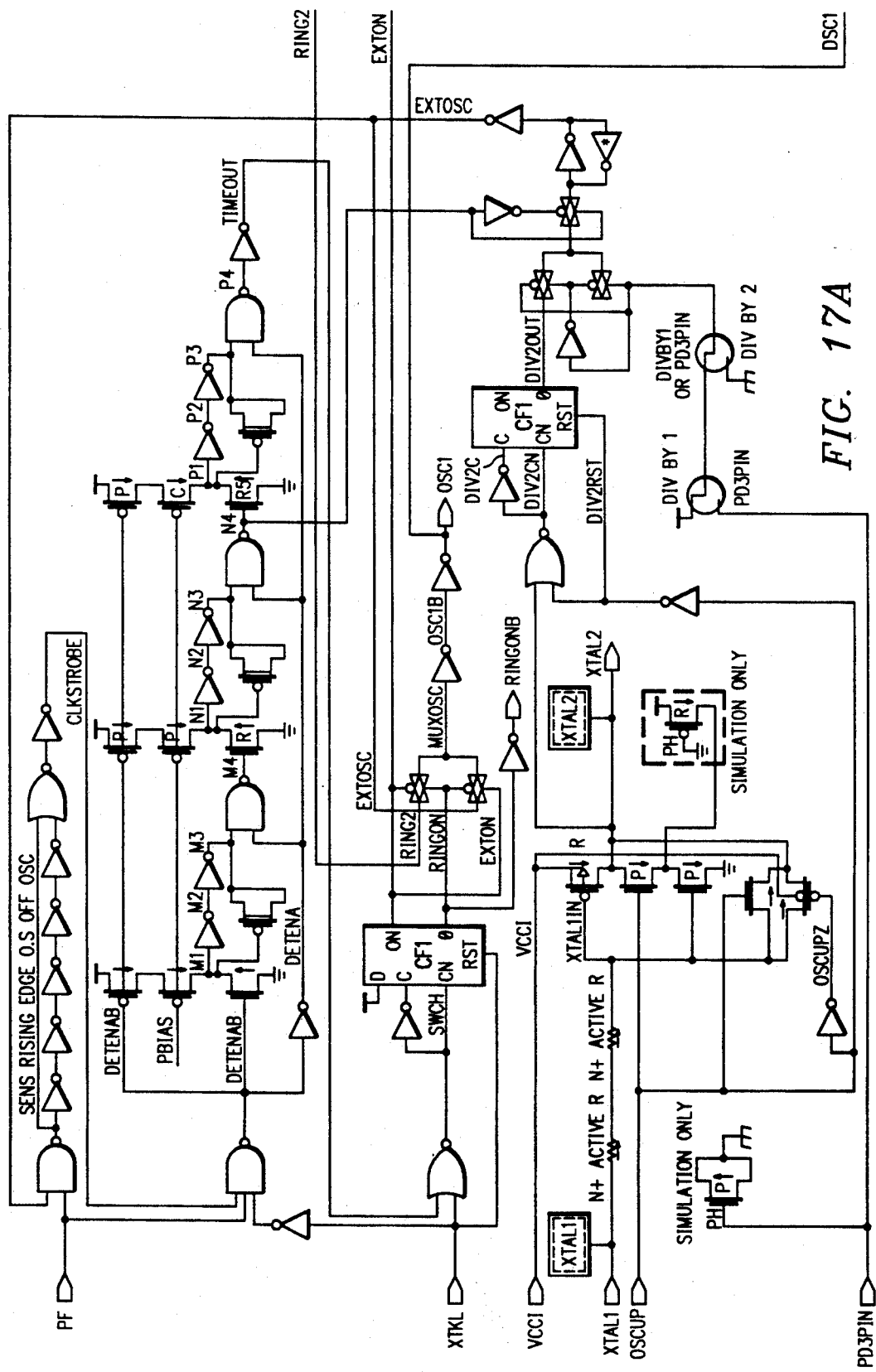
FIGS. 17A and 17B show the circuitry used, in the presently preferred embodiment, to implement the oscillator control circuitry 184 in an adjunct chip of FIGS. 1A-1 and 1A-2.
Figure 17B:
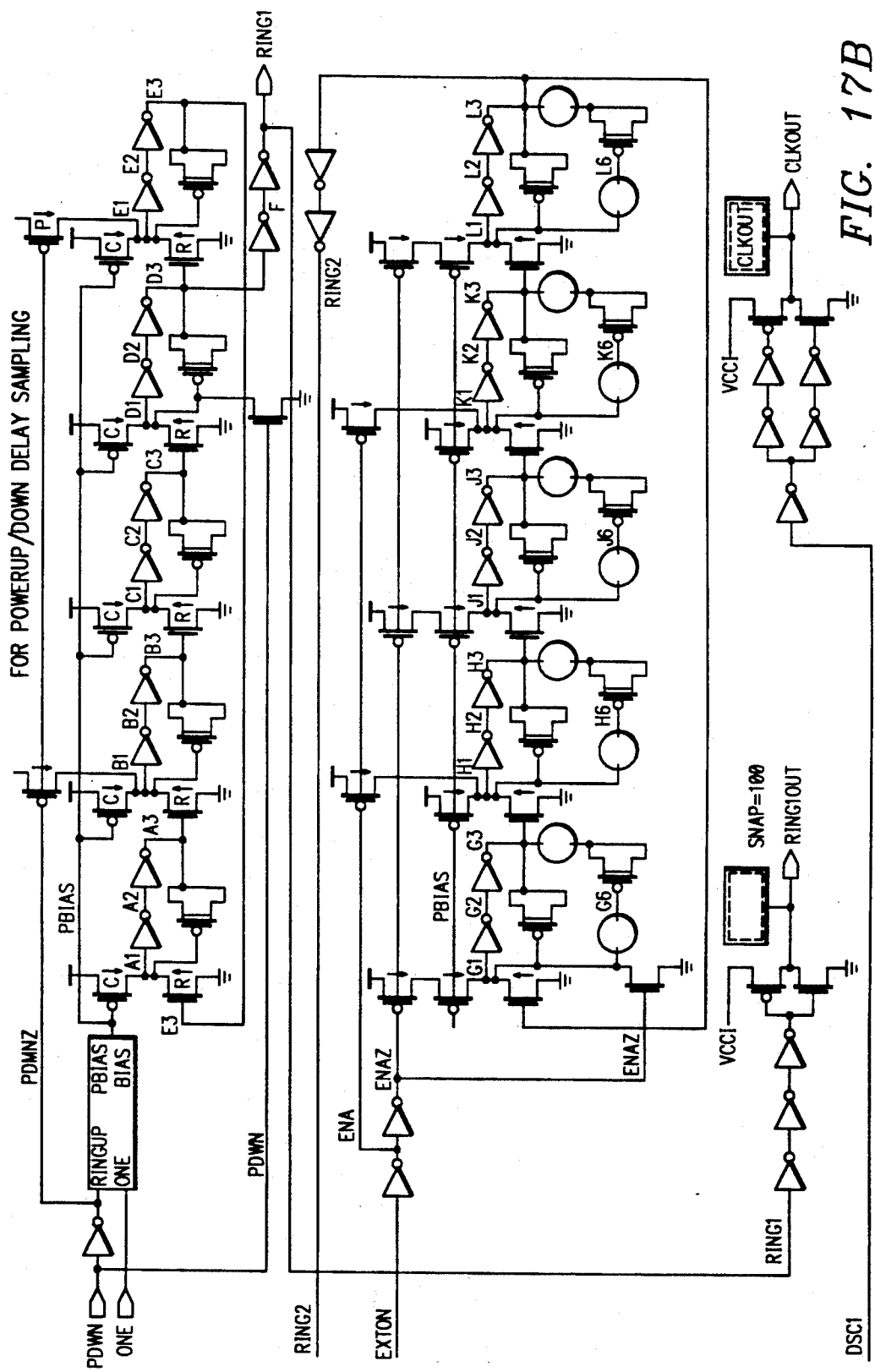

FIGS. 17A and 17B show the circuitry used, in the presently preferred embodiment, to implement the oscillator control circuitry 184 in an adjunct chip of FIGS. 1A-1 and 1A-2.

Interface Register File 180 (Addresses $00_H$ through $0F_H$)

The address and data buses 168 and 170 are also connected to a register file 180. In the presently preferred embodiment, this register file 180 is externally interfaced through ports B and C. This register file provides an extremely versatile control interface.

The Interface Register File on the Adjunct chip is designed to provide an asynchronous interface between two independent microprocessors. The microprocessor which is connected as the controller of the Adjunct chip is able to transform two of the normal ports of the adjunct chip into a PC bus compatible address/data bus interface. This interface allows an external microprocessor such as an 8088 to asynchronously access internal registers on the Adjunct chip. These registers are broken into four configurations:

1. Status Registers
2. I/O Buffer Registers
3. I/O Buffer Flag Registers
4. Interrupt Mask Registers Each microprocessor interface is assigned one status register which serves as a general purpose register with which each processor communicates configuration information to the other processor to establish a file protocol. The I/O Buffer Registers are the actual registers by which the data transfers are made. Eight Input Buffer and eight Output Buffer registers are assigned to each processor. This allows each processor to work in either a single register or block data transfer configuration. Each processor can also read two flag registers to monitor the status of each read and write of both the Input and Output Buffer Registers. Two Interrupt Mask Registers are also assigned to each processor. The two Interrupt Mask Registers assigned to each processor allow each processor to selectively mask or unmask specific register flags as sources of interrupts to itself.

Addresses 0 through 15 ($00_H$ through $0F_H$) are reserved for the register file. The interface register file includes the following registers:

1. Internal Status Reg. (ISR) (Address $0E_H$)
2. External Status Reg. (ESR) (Address $0F_H$)
3. Input Buffer Reg. (IBR) (Addresses $00\text{-}07_H$)
4. Output Buffer Reg. (OBR) (Addresses $00\text{-}07_H$)
5. Input Buffer Flag Reg. (IBF) (Address $08_H$)
6. Output Buffer Flag Reg. (OBF) (Address $09_H$)
7. Internal Input Buffer Interrupt Mask Reg. (Int.IBM) (Address $0A_H$)
8. Internal Output Buffer Interrupt Mask Reg. (Int.OBM) (Address $0B_H$)
9. External Input Buffer Interrupt Mask Reg. (Ext.IBM) (Address $0C_H$)
10. External Output Buffer Interrupt Mask Reg. (Ext.OBM) (Address $0D_H$).

Two of the most critical of these registers will now be described in detail.

Internal Status Register ISR (Address $0E_H$)

The internal status register is composed of four status bits (ST3-ST0), an internal to external interrupt bit (I1), an external to internal interrupt mask (M2), and two AND/OR control bits (IAO and OAO) for input and output buffer flag interrupt configurations. The Internal Status Register is configured as a full read/write register to the internal processor. The internal register is a read only register to the external processor, except for the I1 bit.

Bit I1—The internal processor to external processor interrupt control bit.

Bit M2—The M2 interrupt mask blocks the I2 interrupt from external status register as issued by the external processor (to the internal processor).

Bit OAO—The output buffer AND/OR interrupt control select:

Bit IAO—The input buffer AND/OR interrupt control select.

Bits ST3-ST0—General purpose status register bits written by the internal processor to the external processor.

The internal processor is able to write a status word into the status bits and set the interrupt bit which in turn will interrupt the external processor if the M1 mask bit in the external status register is cleared. Once an interrupt has been issued, the external processor can clear the interrupt by writing to the internal status register which automatically clears the I1 bit. It is important to note that a write by the external processor to the internal status register is independent of data, will not alter other bits, and will only clear the I1 bit. Once the I1 bit has been set by the internal processor it can only be cleared by either the external processor or a Reset. The internal processor is not able to clear the I1 bit once it is set.

The mask bit M2 is used to block the interrupt issued by the external processor by the I2 bit in the external status register.

The internal processor can receive an interrupt as a function of the reading and writing of the Input and Output Buffers. The reading and writing of these buffers provide interrupts in either a byte or block interrupt mode. This selection is provided through the use of the OAO or IAO bits.

The IAO and OAO bits are used to allow the internal processor to select an AND or an OR relationship in relation to when an interrupt will be issued via the appropriate mask register. Setting the OAO bit to a one initiates the AND relationship and setting it to a zero initiates the OR mode. In the AND mode the OAO bit requires that all of the Output Buffer Registers, which are not masked in the Internal Output Buffer Mask Register, be read by the external processor before an interrupt will be issued to the internal processor. In the OR mode the OAO bit initiates or continues an interrupt each time an Output Buffer register, which is not masked in the Internal Output Buffer Mask Register, is read by the external Processor.

When in the AND mode the IAO bit requires that all of the registers in the Input Buffer, which are not masked in the Internal Input Buffer Mask Register, be written by the external processor before an interrupt will be issued to the internal processor. In the OR mode the IAO bit allows an interrupt to the internal processor whenever any Input Buffer register, which is not masked in the Internal Input Buffer Mask Register, is written by the external processor.

To prevent a read/write collision between the external and internal processors both the Output and Input Buffers are configured as read before write registers. As an example, a write to the Input Buffer by the external controller is only completed by the Softener when the Input Buffer has been previously read by the internal processor. This prevents a potential loss of data which could occur if the external processor were to attempt to write over the Input Buffer before the internal processor has read the previous data in the Input Buffer.

In a like manner the Input and Output registers are also configured to provide correct data if read when the appropriate flag is set in the Input and Output Flag register. As a result once a buffer has been read by the appropriate processor and the related flag is cleared, future reads of the same buffer can not be considered valid until the respective flag is again set by a new write from the appropriate processor.

External Status Register ESR (Address 0F$_H$)

The external status register is composed of four status bits (ST3-ST0), an external to internal interrupt bit (I2), an internal to external interrupt mask (M1), and two AND/OR control bits (IAO and OAO) for input and output buffer flag interrupt configurations. The External Status Register is configured as a full read/write register to the external processor. The external register is a read only register to the internal processor except for the I2 bit.

Bit I2 is the external processor to internal processor interrupt control bit.

Bit M1 is an interrupt mask which blocks the I1 interrupt from internal status register as issued by the internal processor (to the external processor).

Bit OAO is the output buffer AND/OR interrupt control select.

Bit IAO is the input buffer AND/OR interrupt control select.

Bits ST3-ST0 are general purpose status register bits written by the external processor to the internal processor.

The external processor is able to write a status word into the status bits and set the interrupt bit which in turn will interrupt the internal processor if the M2 mask bit in the internal status register is cleared. Once an interrupt has been issued, the internal processor can clear the interrupt by writing to the external status register which automatically clears the I2 bit. It is important to note that a write by the internal processor to the external status register is independent of data, will not alter other bits, and will only clear the I2 bit. Once the I2 bit has been set by the external processor it can only be cleared by either the internal processor or a Reset. The external processor is not able to clear the I2 bit once it is set.

The mask bit M1 is used to block the interrupt issued by the internal processor by the I1 bit in the internal status register.

The external processor can receive an interrupt as a function of the reading and writing of the Input and Output Buffers. The reading and writing of these buffers provide interrupts in either a byte or block interrupt mode. This selections is provided through the use of the OAO or IAO bits.

The IAO and OAO bits are used to allow the external processor to select an AND or an OR relationship in relation to when an interrupt will be issued via the appropriate mask register. Setting the OAO bit to a one initiates the AND relationship and setting it to a zero initiates the OR mode. In the AND mode the OAO bit requires that all of the Output Buffer Registers, which are not masked in the External Output Buffer Mask Register, be written by the internal processor before an interrupt will be issued to the external processor. In the OR mode the OAO bit initiates or continues an interrupt each time an Input Buffer register, which is not masked in the External Output Buffer Mask Register, is written by the internal Processor.

When in the AND mode the IAO bit requires that all of the registers in the Input Buffer, which are not masked in the External Input Buffer Mask Register, be read by the internal processor before an interrupt will be issued to the external processor. In the OR mode the IAO bit allows an interrupt to the external processor whenever any Input Buffer register, which is not masked in the External Input Buffer Mask Register, is read by the internal processor.

Other Register + Secure RAM 176

In the embodiment of FIGS. 1A-1, 1A-2, 2A-1, and 2A-2, note that specific allocations are made of 64 addresses for use within the adjunct chip. However, those 64 addresses may not appear in the same place for the different memory maps of FIGS. 3A through 3E. Many of those microprocessors have internal RAM, or internal registers at fixed addresses, and these address allocations must be respected. Therefore, the addresses onto which the 64 bytes required for internal space are mapped may be changed. For example, in the DS5303 (for use with the 6303 microprocessor) these internal addresses are mapped onto microprocessor addresses $0300_H$ through $0340_H$, in all modes. With the 6305 microprocessor. The same address mapping is used in FIGS. 3C, 3D, and 3E. However, this mapping can be changed if those addresses are not accessible. For example, in the memory map of FIGS. 3A-1 through 3A-6, these 64 bytes are mapped onto addresses $FFF00_H$ through $FFF40_H$. Therefore, in the following list, these registers will be named only by their least significant two nibbles (two hex characters).

Timed Access Register (Address $10_H$)

Address 16 (address $10_H$) is used for the timed access register TASR. For access to memory which is protected by a timed access relationship, the microprocessor must write a value of 170 ($AA_H$) to its register, followed by a value of 85 ($55_H$).

Port A Interrupt Mask Register (Address $11_H$)

Address 17 ($11_H$) is used for the Port A interrupt mask register (PTMK). This mask register contains 8 mask bits M7 through M0 which mask the corresponding 8 bits of Port A.

Memory Control Register (Address $12_H$)

Address 18 ($12_H$) is a memory control register. Four bits PA0–PA3 of this register are used memory-protection bits, to indicate which segment of memory are write-protected. Two bits are used for signals PCE3* and PCE4*, which provide chip enables.

Watchdog Register (Address $13_H$)

Address 19 ($13_H$) is a watchdog register (WDOG). In this register, three bits (WD0–WD2) are used for selecting the watchdog time-out value. These bits are writable only when the control software is running, and not when the user software is running. Additional bit WBM is used for a watchdog mask. This bit can turn on or turn off sensitivity to a watchdog interrupt. Setting of this bit is protected by a timed access relationship. An additional bit is the CRC bit, which forces execution of a CRC routine on a power-on reset or a watchdog hit. This bit is protected by a timed-access relationship and is writable only when the control software is executing. An additional bit is bit ROMLTR. This is a "ROM later" enable, which allows the user to reenter execution of control software by setting the "ROM" bit. The bit ROMLTR is protected by timed-access relationships. Moreover, this bit is writable only when control software is executing, and only when the external reload pin RL* is active.

Modes Register (Address $14_H$)

Address 20 (address $14_H$) is a modes register ("MODES"), and contains bits which set several important features of operation:

Bit RG is used to define at what point the address boundary between RAM controlled by output CE1* and RAM controlled by output CE2* will occur in microcontrollers. This bit is writable only from control software, and is protected by a timed-access relationship.

Bit PART is a partition-enable signal. This bit enables write-protection of memory.[4] This bit is protected by a timed-access relationship and is ROM writable only.

[4] The adjunct chip, in the presently preferred embodiment, implements memory protection along chip-enable boundaries. No write protection is active unless bit PART is set. Whenever bit PART is set, the memory controlled by CE5* will be protected. As long as this memory segment is protected, any other segment can also be selected for protection: Bit PA0 controls write protection of the memory controlled by signal CE1*, bit PA1 controls write protection of the memory controlled by signal CE2*, bit PA2 controls write protection of the memory controlled by signal CE3*, and bit PA3 controls write protection of the memory controlled by signal CE4*.

Bit RFEN is a register file enable bit. This is protected by a timed-access relationship.

Bits MD0–MD2 selected the mode of memory map. These bits would be used to select between the memory maps of 3A-2 and 3A-6, for operation with a V40 microprocessor. These bits are writable only from control software and are protected by a timed-access relationship.

Bit IRL is an internal reload flag. This indicates that the external reload pin RL* is active.

Bit ROM is the bit which enables execution of control software (the "ROM-enable" bit). As noted, this bit is extremely important to the operation of the system FIGS. 1A-1, 1A-2, or 2A-1, 2A-2. Writing of this bit is protected by a timed-access relationship. Thus, as extensively discussed above, the user software can write this bit to enter execution of control software. Changing the state of this bit may cause the adjunct chip to throw the microprocessor into reset, as described below.

Power Control Register (Address $15_H$)

Address 21 ($15_H$) contains bits relating to power control functions. This register is also referred to in the accompanying circuit diagrams as Register "POWER."

Bit CESL is an inversion control for bits A13–A15. These bits are inverted in the address decoder to permit program memory underneath the control ROM to be executed.

Bit SPLITWD provides an input into the middle of the watchdog chain, which accelerates testing. This bit is writable in test mode only, and otherwise will be cleared.

Bit CEBAT enables battery backup for outputs CE2*, CE3*, and CE4*. If this bit is set, then output lines CE2* through CE4* will be connected to the battery input, to be powered from battery 150 if system power VCCI goes down. Since these bits are active low, they would normally be high in standby mode. If the RAM's internal circuitry permits it to thieve power from the CE line, then this output will permit the RAM's data to be preserved. This output is writable only from the control software, and is protected by a timed-access relationship.

Bit LPE is a low-power enable. This allows the adjunct chip to go into a low-power (sleep) state when the microprocessor stops.[5] This bit is protected by a timed-access relationship.

[5] The adjunct chip's clock-monitor circuit detects when the microprocessor stops, as described above.

Bit LVM is a low-voltage mask bit, which masks the LVD interrupt described below. This bit is protected by a timed-access relationship.

Bit BATTEST turns on an op amp to check the battery voltage against the bandgap voltage reference.

Bit BAT is a battery health flag. This bit is controlled by hardware (from comparators).

Reset and Interrupt Status Register (Address 12$_H$)

Address 22 (16$_H$) is a reset and interrupt status register ("RIST"). This register also contains several flag bits which relate to various control functions.

Bit WDR is a watchdog reset bit. This is a write-only bit which is cleared automatically as soon as it is written. This bit is protected by a timed-access relationship.

Bit WDS is a watchdog status flag. This is cleared when read.

Bit LVD is a low-voltage detect flag. This bit is set by hardware, whenever comparison of VCCI against the bandgap voltage reference indicates that VCCI is out of tolerance. It is cleared when read.[6]

[6] If the low-voltage condition still exists, the hardware relation will immediately set the bit again. Thus, a user can check for a brown-out condition by performing two successive reads.

Bit PUP is a power-up indicator flag. This bit is cleared on any power-up reset. This bit can be set by software (if a timed-access relationship is satisfied). Thus, if a user sets this bit routinely, he can test it after a reset to ascertain whether the reset was a power-up reset.

Bit RFSTS is register filed status register interrupt.

Bit IB is a register file input buffer interrupt.

Bit OB is a register film output buffer interrupt.

Bit PA is a Port A interrupt.

Port Control (Addresses 17$_H$-2D$_H$)

Addresses 23 through 30 (17$_H$ through 1E$_H$) are used for control of Port A. Address 23 (17$_H$) is Port A's data latch register. Address 24 (18$_H$) is the data direction register. Address 25 (19$_H$) is the modo-Intel register, i.e., selects between Motorola and Intel emulation. Address 26 (1A$_H$) is a port pinwrite register and is read only (from the adjunct chip). Address 27 (1B$_H$) is an edge-detect register and is read-only (from the adjunct chip). Address 28 (1C$_H$) is a level detect register and is read only (from the adjunct chip). Address 29 (1D$_H$) selects between edge detect and level detect. Address 30 (1E$_H$) selects between positive and negative actuation, on the edge detect and level detect functions. Note that each of these registers has 8 bits, and thus the settings of these registers can be used to control the port on a bit-by-bit basis. Therefore, these registers provide tremendous versatility in controlling the operation of Port A.

Addresses 31 through 35 (1F$_H$ through 23$_H$) provide the interface to Port B. Addresses 36 through 40 (24$_H$ through 28$_H$) provide the interface to Port C. Addresses 41 through 45 (29$_H$ through 2D$_H$) provide the interface to Port D. Address 31 (1F$_H$), 36 (24$_H$), and 41 (29$_H$) are data latch registers and are read/write. Address 32 (20$_H$), 37 (25$_H$), and 42 (2A$_H$) are data direction registers and are read/write. Addresses 33 (21$_H$), 38 (26$_H$), and 43 (2B$_H$) are Motorola-Intel-select registers, and are read/write. Addresses 34 (22$_H$), 39 (27$_H$), and 44 (2C$_H$) are port pin registers and are read only. Addresses 35 (23$_H$), 40 (28$_H$), and 45 (2D$_H$) are edge-detect registers and are read only.

In the data direction registers, a zero-bit is used, in the presently preferred embodiment, to indicate that the data direction is in, and a "1" is used to indicate that the data direction is out.

In the Motorola-Intel registers, in the presently preferred embodiment, a "0" is used to select Intel emulation, and a "1" selects Motorola emulation.

In the edge/level select registers, in the presently preferred embodiment, a "0" is used to select edge-detect, and a "1" is used to select level-detect. In the positive/negative select register, a "0" is used to select negative operation, and a "1" is used to select positive operation. In the edge/level detect registers, a "0" means that no edge or level has been detected, and a "1" indicates that an edge or level has been detected. Addresses 2E$_H$ and 2F$_H$ (46 and 47) are the CRC registers. CRC computation is performed in hardware. From the microprocessor's point of view, the value in Address 47 (2F$_H$) is read, a series of writes is made to Address 46 (E$_H$), and then another read is made to Address 47 (2F$_H$) to get the updated CRC value. Finally, addresses 48 through 63 (30$_H$ through 3F$_H$) are reserved for internal RAM, as described below.

Register Reset Values

The reset values for the registers are as follows: The timed-access register TASR is reset to all zeroes. The Port A interrupt mask register PTMK is reset to all ones. The memory-control register has bits PA0-PA3 cleared on a no-battery reset and otherwise unchanged. Bits PCE3*-PCE4* of this register are set to zero on a reset.

The watchdog register WDOG has bits WD0-WD2 set to zero on a no-battery reset, and otherwise left unchanged. Bit WDM is set to one on a no-battery reset, and otherwise left unchanged. Bits CRC and ROMLTR are set to zero on a no-battery reset and otherwise left unchanged. The modes register "MODES" has bits RG, PART, and MD0-MD2 set to a zero on a no-battery reset and otherwise left unchanged. Bit RFEN is set to zero on a reset. Bit IRL is left unchanged on a reset. Bit ROM is set to zero on a power-on reset and otherwise left unchanged.

The power control register "POWER" bit CSL is set to zero when the control mode is exited by clearing the ROM bit. On any reset, other than a reset which occurs when the ROM bit is set, this bit will be cleared. Bit SPLITWD is cleared on any reset, except in test mode.

Bits CEBAT and LPE will be set to zero on a no-battery reset, and otherwise left unchanged. Bit LVM will be set to a one. Bit BATTEST will be set to a zero.

In the reset and interrupt status register RIST, bit WDS will be set to zero on a no-battery reset, and otherwise left unchanged. Bits LVD and PUP will be set to zero on a power-on reset, and otherwise left unchanged. Bits WDR, RFSTS, IB, OB, and PA will be set to zero.

Protection of Programmable Options

As noted, the softener chip also includes a small amount of parameter RAM, which is used to preserve the status of various programmable options. In the presently preferred embodiment, this RAM includes only 16 bytes, which are organized in two blocks: Each holds a start address, an end address, and a CRC value.

The watchdog program, like other programmable options, needs to be insulated against accidental corruption by application software. Several techniques are used to provide such protection:

(1) Some programmable bits are writable only while the microprocessor is executing code from the adjunct chip ROM.

(2) Some programmable bits are protected by timed-access relations, so that the bit can be accessed only within a certain time window defined with respect to a particular sequence of writes to a register. (See U.S.

patent application Ser. No. 163,980, Filed Mar. 4, 1988, which is hereby incorporated by reference.)

(3) Some bits are protected both by limitation to control software and by timed-access relationships.

In the presently preferred embodiment, the adjunct chip includes 4K of ROM. Of course, more or less space could be used if desired.

Ports A-D (156, 158, 160, 162)

Interfaces 156, 158, 160, and 162 provide 8-bit interfaces to ports $\underline{A}$ through $\underline{D}$ respectively. Ports $\underline{A}$, $\underline{B}$, and $\underline{C}$ each provide bidirectional IO capability. However, in this example, Port $\underline{D}$ is dedicated to control signals and high-order address signals, as described below.

Super-Adaptable Port 156

One of the features of the preferred adjunct chip architecture is that one of the ports is made extremely versatile and programmable. To ensure that port versatility is not lost, the preferred embodiment of the adjunct chip contains one port (Port $\underline{A}$) which has extraordinarily high versatility. This port is programmable bit-by-bit to emulate a very wide variety of port characteristics.

In conventional Intel port architecture (e.g. in the Intel 8051), each port is electrically configurable as read or write. To implement this, three strengths of pull-up are attached to each port: (1) a very strong pull-up, controlled by a one-shot, which initially writes a high state to the contact pad; (2) a very weak pull-up, which holds the contact pad high when a high state is being written, after the one-shot delay has expired and turned off the strong pull-up; and (3) a weak pull-up, which is the feedback of the data input latch. A simple, direct NMOS pull-down is used for driving this port in the opposite direction. Thus, in order to read a port pin, the microprocessor simply writes a high state and then waits for an external input to drive data onto the port (overriding the weak pull-up if necessary).

By contrast, the normal Motorola port simply uses a direct CMOS driver at the output, in combination with a data direction register which can disable the output driver.

In the Intel architecture, some instructions will read the data latch rather than the output pad to implement read-modify-write instructions.

The Motorola 6805 port architecture actually provides the capability to read the data latch independently of the voltage of the pad. A data-direction register bit is used to indicate whether the pad is being read from or written to, and the value of this bit gates the input to the data latch. Thus, if the data-direction register indicates that data is inbound, the read line will show the data appearing on the pad; but if the data-direction register indicates that data is outbound, the read line will merely show the data last latched in.

The port implemented in the adjunct chip can implement either full Motorola or full Intel port relationships. In addition, this port has the capability to read either the pad or the data register, independently of the data direction. Thus, the innovative port provides the capability for full Motorola emulation, and also provides additional flexibility.

This port also has the ability to sense an edge transition, of either sign, or to sense a level of either sign (as long as it remains for more than one bus cycle) and to generate interrupts therefrom, in accordance with mask bits.

The ability to sense edges is particularly useful, since one problem with microprocessor ports in general is that some input signals may generate an edge at the microprocessor port which does not correspond to a long-term level shift. The sampling time of the microprocessor may be long enough, that such a pulse could be missed.

In alternative embodiments, which are not implemented in the presently preferred embodiment, the port may further be made programmable to include additional options, such as an "inverse Intel" port (with graduated-strength pull-downs), or a combination of an Intel port with a high impedance state.

In the presently preferred embodiment, ports $\underline{C}$ and $\underline{D}$ are identical. Port $\underline{B}$ is almost identical to ports $\underline{C}$ and $\underline{D}$, except that port $\underline{B}$ defaults to the Motorola state after a reset. In the presently preferred embodiment, ports B and C are used for the file register, and port $\underline{D}$ is used to handle additional control lines of the microprocessor.

In general, the capabilities of ports $\underline{B}$, $\underline{C}$, and $\underline{D}$ are a subset of the capabilities of port $\underline{A}$. Ports $\underline{B}$, $\underline{C}$, and $\underline{D}$: cannot do level detect; can only detect negative edges; cannot generate an interrupt; but can switch between Motorola and Intel operation.

Adjunct Chip's Sleep Mode

The adjunct chip has a low-power sleep mode, which it can enter when the target microprocessor is asleep. It would be wasteful for the adjunct chip to remain in an active high-power mode if the microprocessor has gone into a low-power sleep mode. Thus, the following discussion relates not only to issues of shutting down and waking up the microprocessor, but also to issues of shutting down and waking up the adjunct chip.

When the adjunct chip enters sleep mode, it will typically interrupt the oscillator clock to the microprocessor; interrupt reset signals to the microprocessor; and turn off the watchdog circuit. Also, on entering sleep mode, the op amp's current source is turned down. This causes the op amp to react more slowly.

A signal called "STOP" is used on the adjunct chip to control these functions. However, this signal is not externally accessible.

The adjunct chip, in the presently preferred embodiment, also includes a clock monitor circuit as described above, which monitor electrical activity on the microprocessor's output lines. If a certain number of clocks (selectable up to $2^{10}$, in the presently preferred embodiment) pass with no activity whatsoever on the microprocessor's clock-output line, the adjunct chip can assume that the microprocessor has gone to sleep.

In the system architecture, the microprocessor is not directly connected to a clock. Instead, the adjunct chip is interposed between the microprocessor and its clocks. Similarly, the adjunct chip is interposed between the microprocessor's reset input and the external reset connection.

Thus, when the adjunct chip determines that the microprocessor is in sleep mode, the adjunct chip can turn off clock pulses to the microprocessor. Similarly, when the microprocessor is to wake up again, the adjunct chip can restart the oscillator, and wait for the oscillator to stabilize, before connecting the oscillator to the microprocessor. The oscillator will normally have a significant current burn, and it is desirable to avoid this when the system is in a minimum-power mode.

Some microprocessor architectures require that the microprocessor be awakened from sleep mode if an interrupt is received. Accordingly, the adjunct chip also has a mask option whereby the microprocessor will be awakened if an interrupt is received.

Other conditions wherein the target microprocessor will be reawakened include detection of a power-down condition (as described below) or a reload operation.

In sleep mode, the band-gap voltage reference is switched off. Instead, in sleep mode, the battery input is used as the reference input to comparators.

The watchdog function is turned off when the adjunct chip is in sleep mode.

Adjunct Chip's Test Mode

The adjunct chip, in the presently preferred embodiment, can be forced into test mode by driving external reset line RST* low, and also overdriving reset-out line RSTOUT* high (fighting the adjunct chip's drivers). After a certain minimum time, this will put the adjunct chip into test mode. Test mode is not normally used by end-users. The input into the middle of the watchdog's chain allows the various outputs of the watchdog chain to be tested rapidly, without having to wait for the delays needed to count down for the many cycles which would otherwise be necessary. A further feature in test mode is that the delay normally imposed at power-up is disabled.

Micro-Board System Module

Figure 16:
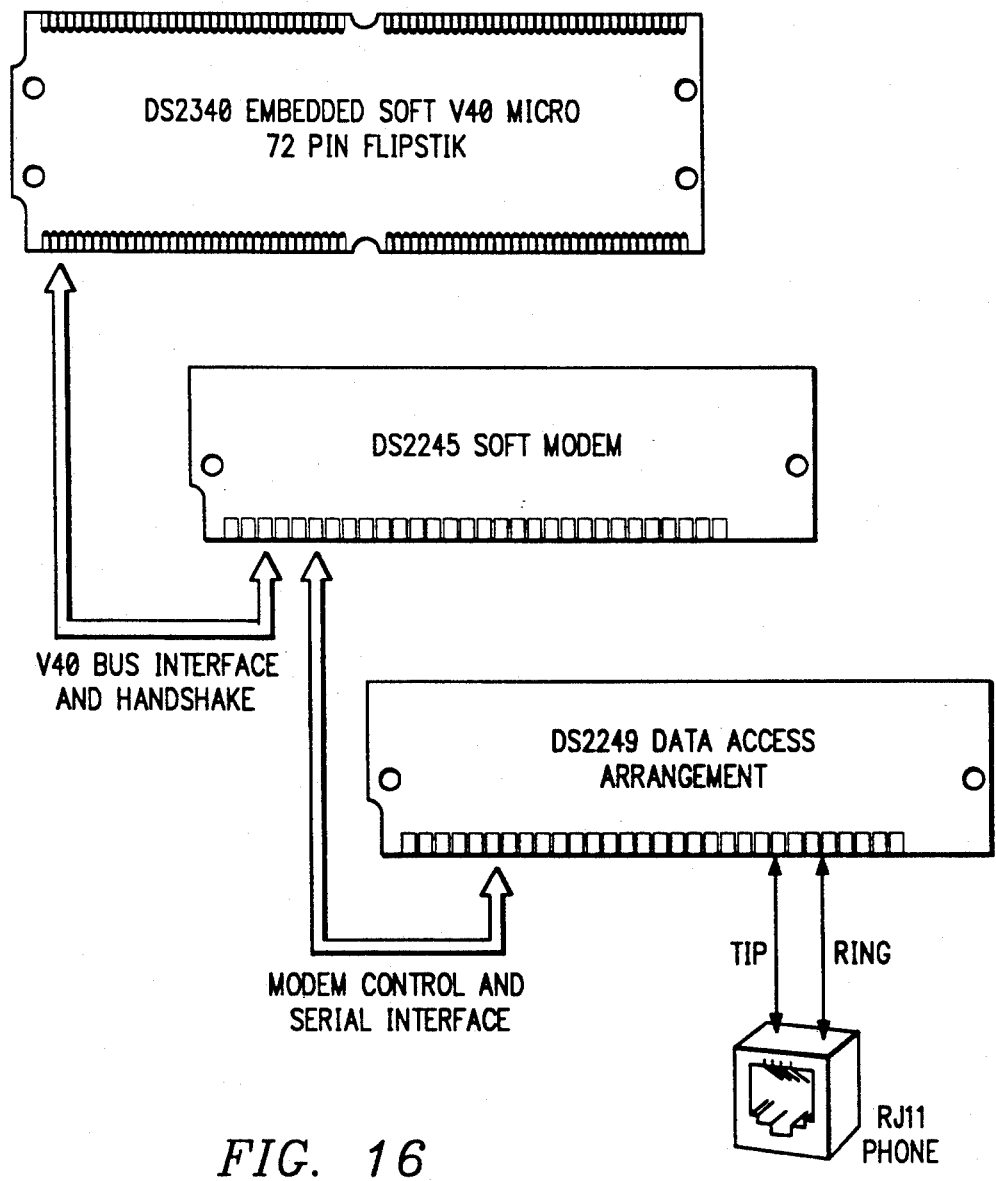
FIG. 16 shows an example of a complete subsystem, wherein a microprocessor and an adjunct peripheral chip are combined with a modem and a DAA. This Figure also illustrates the physical shape of a novel preferred micro-board package.

FIG. 16 shows the preferred microboard package for a system like that shown in FIGS. 1A-1, 1A-2, or 2A-1, 2A-2.

Configuration of Larger System

A particularly advantageous system embodiment is a combination of a nonvolatized microprocessor module (such as the DS2340 described below) in combination with other modules which permit dial-up access. For example, this is permitted by a DS2245 modem Stik in combination with a DS2249 DAA Stik.)

In the presently preferred embodiment, the 16 bytes of RAM on the adjunct chip are used not only to store CRC parameters, but also are used to store a modem-present flag and a "help-me" flag. The modem-present flag is programmed at the time of system configuration to indicate to the adjunct chip's control software that, when an error condition occurs, the dial-up capability can be used as part of the error handling routine.

Power-Fail Output Signals

In the presently preferred embodiment, the softener chip now has two power-fail output signals, called V30* and V45*. These signals can be propagated around a system to avoid skew on power-down timing.

This is useful even if other chips also have a bandgap reference on-chip: In a complex system, you do not want to have more than one bandgap operating independently: The softener would probably be the master power-fail detector and let the other nonvolatized subsystems use a power-fail input.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Note that the adjunct chip's ROM does not strictly have to be mask-programmed ROM: instead, it could be another type of memory (preferably, a highly secure memory). For example, a fuse-programmed PROM, or a FAMOS EPROM or EEPROM could be used.

For another example, the adjunct chip's "ROM" could even be configured as battery-backed nonvolatile memory instead, although in this case it is preferable that steps may taken for extra memory integrity. Various known memory architectures could be adapted for this purpose. For example, it has been proposed to configure SRAMs with polysilicon-channel load transistors, or resistors between the latch nodes, or with distributed redundant subarrays which are checked against each other and which can "vote" to detect and correct errors.

In a further alternative, the RAM cells in the adjunct chip can be modified to make them more resistant to disturbances, including single-event upset. This may be particularly advantageous where only a small number of RAM bits are used, as in the presently preferred embodiment. For example, it may be desired to make the transistors many times wider than the minimum gate width, or even to include resistors between the two nodes of each latch. Note also that the speed of these RAM cells is generally not critical, so that device modifications which degrade speed can be used (less preferably) if desired.

Of course, the disclosed innovations are not applicable solely to 8- and 16-bit microprocessors, but can also be applied to 32-bit microprocessors, or to programmable logic chips of other types.

The adjunct chip can react to software corruption by 1) initiating a reload 2) calling for help, or 3) doing nothing. Other alternatives can also be implemented if desired; for example, where extreme robustness is needed, the adjunct chip may power-down one microprocessor and power-up another.

It should also be noted that the control software can be used to reload the program memory from shadow RAM (such as E²PROM) or from ROM.

The disclosed innovations can also be adapted, beyond the presently preferred embodiment, for use with a microprocessor which includes a large amount of on-chip program RAM. The first off-chip program memory access can still be captured by the adjunct chip. Moreover, it is also alternatively possible to (e.g.) use an interrupt to read out the micro's on-chip RAM, generate a CRC check value, and store the program and check value in NVSRAM or secure memory. Also, even with a large number of address lines, the softener would presumably not have to intercept all of them-just enough to hit the starting address.

Other control functions can optionally be included in the control software, if desired. For example, various testing routines may be used. (The microprocessor's on-chip ROM will normally contain a power-on self-test (POST) routine, but additional testing may be desirable.)

It should be noted that adjunct chips as described may be particularly useful in a multiprocessor system. One example of this is in highly parallel architectures. A number of attempts have been made to exploit the low unit cost of microprocessors to build a very large multiprocessor (e.g. with 1024 or more CPUs). However, microprocessors do not normally include the control interface features that would be desirable for such applications. The use of adjunct chips as desribed herein can facilitate this or other unusual uses of microprocessors, by providing additional flexibility.

The additional flexibility provided by adjunct chips as desribed herein can also facilitate other adaptations. For example, extremely powerful number-crunching ("DSP") chips[7] are readily available, but a significant amount of system redesign (and sometimes glue logic) may be required to integrate such chips into an existing system. Similarly, integration of multiple DSP chips into a system containing only one DSP chip can be facilitated. For another example, extremely powerful graphics chips[8] are also readily available, but a significant amount of system redesign (and sometimes glue logic) may be required to integrate such chips into an existing system. Similarly, integration of multiple DSP chips into a system containing only one DSP chip can be facilitated. In general, the disclosed architecture facilitates innovative or unusual uses of microprocessors (or of other complex programmable logic), by providing additional flexibility.

[7]For example, the TMS320 series from Texas Instruments.
[8]For example, the TMS340 series from Texas Instruments.

Note that the adjunct chip architecture described may also be applicable to chips having a high-speed data interface (such as graphics chips, floating-point units, or crosspoint switches), since the high-speed path can be led directly off-chip.

Most microprocessors preferably operate from one end or the other of their memory space. Therefore, in a system where on-chip memory has preempted many of these favored addresses with memory which cannot be revectored by the software, application of the software is less favorable. However, such adaptations could be made.

Some of the disclosed innovative ideas can also be adapted to a situation where the adjunct chip is replaced by an on-chip monitoring subsystem, which is integrated with a microprocessor (but has a narrowly defined logical interrelation with the microprocessor). Such embodiments, although currently less preferable than those described, may still confer some advantage.

To increase security, an optional alternative uses multiple register bits in place of the ROM bit. These bits can be defined to provide additional security against an ESD hit or a single-event upset.

As will be recognized by those skilled in the art, the innovative concepts described in the present application can be modified and varied over a tremendous range of applications, and accordingly their scope is not limited except by the allowed claims.

What is claimed is:

1. A microboard package for an electronic subsystem, comprising:

a microboard having first and second long edges, and one or more shorter edges, around the perimeter thereof;

said first long edge having a first row of edge connector contacts along substantially all of said first long edge, and said second long edge having a second row of edge connector contacts along substantially all of said second edge;

said shorter edges without connector contacts;

said first and second rows of edge connector contacts being configured so that either can be inserted into a female connector in a motherboard;

said first and second rows of edge connector contacts having substantially the same physical layout, but not having substantially the same electrical contact placements;

whereby a user can choose a first functional connection to a motherboard female connector of a given form factor by inserting said first row of contacts into said motherboard female connector, or alternatively can choose a second functional connection, different from said first functional connection, by inserting said second row of contacts into said motherboard female connector.

* * * * *